(12) United States Patent
Thomas

(10) Patent No.: US 7,468,572 B2
(45) Date of Patent: Dec. 23, 2008

(54) VERSATILE DIGITALLY CONTROLLED MICRO-MECHANICAL ACTUATOR

(76) Inventor: Maurice Thomas, 1255 Whispering Oaks Dr., Danville, CA (US) 94506

( * ) Notice: Subject to any disclaimer, the term of this patent is extended or adjusted under 35 U.S.C. 154(b) by 164 days.

(21) Appl. No.: 11/092,826

(22) Filed: Mar. 28, 2005

(65) Prior Publication Data

US 2006/0214534 A1    Sep. 28, 2006

(51) Int. Cl.
H02N 1/00    (2006.01)
G02B 26/08    (2006.01)

(52) U.S. Cl. ............... 310/309; 359/225; 359/226; 359/291; 385/18

(58) Field of Classification Search ............ 310/309; 385/18; 359/291, 198, 223, 224, 225, 226
See application file for complete search history.

(56) References Cited

U.S. PATENT DOCUMENTS

| | | | |
|---|---|---|---|
| 5,055,731 A * | 10/1991 | Nihei et al. ............ 310/309 |
| 5,212,582 A | 5/1993 | Nelson ................ 359/224 |
| 5,392,151 A | 2/1995 | Nelson ................ 359/223 |
| 5,541,465 A * | 7/1996 | Higuchi et al. ........ 310/309 |
| 5,986,381 A * | 11/1999 | Hoen et al. ........... 310/309 |
| 6,007,208 A * | 12/1999 | Dickensheets et al. ... 359/872 |
| 6,025,951 A | 2/2000 | Swart et al. .......... 359/245 |
| 6,128,122 A | 10/2000 | Drake et al. .......... 359/224 |
| 6,154,302 A | 11/2000 | Yagi et al. ........... 359/198 |
| 6,198,565 B1 | 3/2001 | Iseki et al. .......... 359/224 |
| 6,201,644 B1 * | 3/2001 | Sakata et al. ......... 359/618 |
| 6,487,001 B2 | 11/2002 | Greywall ............. 359/292 |
| 6,504,641 B2 | 1/2003 | Chan et al. ........... 359/254 |
| 6,529,310 B1 | 3/2003 | Huibers et al. ........ 359/291 |
| 6,535,319 B2 | 3/2003 | Buzzetta et al. ....... 359/225 |
| 6,541,892 B2 * | 4/2003 | Hoen ................. 310/309 |
| 6,552,840 B2 | 4/2003 | Knipe ................ 359/291 |
| 6,583,921 B2 | 6/2003 | Nelson ............... 359/291 |
| 6,600,591 B2 | 7/2003 | Anderson et al. ...... 359/291 |
| 6,600,851 B2 | 7/2003 | Aksyuk et al. ........ 385/18 |
| 6,614,581 B2 | 9/2003 | Anderson ............. 359/295 |
| 6,657,359 B1 * | 12/2003 | Hoen et al. .......... 310/309 |
| 6,657,759 B2 | 12/2003 | Muller ............... 359/198 |

(Continued)

FOREIGN PATENT DOCUMENTS

JP    09-318888    * 12/1997

OTHER PUBLICATIONS

Translation of JP 09-318,888, "Microactuator", Jun Sakurai, Dec. 12, 1997.*

*Primary Examiner*—Karl I Tamai

(57) ABSTRACT

A micro-mechanical actuator includes a partially cylindrical rotatable rotor assembly, a stationary stator structure, rotatable connectors, connecting the rotor assembly and the stator structure, and a switch controller, controlling the actuator. The rotor assembly includes a rotor cylindrical surface, rotor-electrode strips on the rotor cylindrical surface, and a rigid platform. The stator structure includes stator-electrode strips on a stator cylindrical surface. The micro-mechanical actuator may be part of an optical system, which includes a light source and a light receiving element. The actuator in an active position reflects the emitted light towards the light receiving element and n a passive position leaves the emitted light unreflected. A method of operating the micro-mechanical actuator includes activating the stator-electrodes and the rotor-electrodes in a timing sequence and exerting a force on the activated rotor-electrodes by the activated stator-electrodes, thereby rotating the activated rotor-electrodes and the rotor in rotation-intervals corresponding to the timing sequence.

63 Claims, 41 Drawing Sheets

U.S. PATENT DOCUMENTS

| | | | |
|---|---|---|---|
| 6,668,109 B2 | 12/2003 | Nahum et al. | 385/18 |
| 6,677,695 B2 | 1/2004 | Dhuler et al. | 310/309 |
| 6,687,112 B2 | 2/2004 | Chiou et al. | 361/160 |
| 6,700,688 B2 | 3/2004 | Vaganov | 359/223 |
| 6,701,037 B2 | 3/2004 | Staple et al. | 385/18 |
| 6,701,039 B2 | 3/2004 | Bourgeois et al. | 385/22 |
| 6,825,967 B1 | 11/2004 | Chong et al. | 359/290 |
| 7,129,601 B2 * | 10/2006 | Brown et al. | 310/12 |
| 7,136,547 B2 * | 11/2006 | Brown et al. | 385/16 |
| 2006/0214534 A1 * | 9/2006 | Thomas | 310/309 |

* cited by examiner

Prior Art

Prior Art

Prior Art

Prior Art

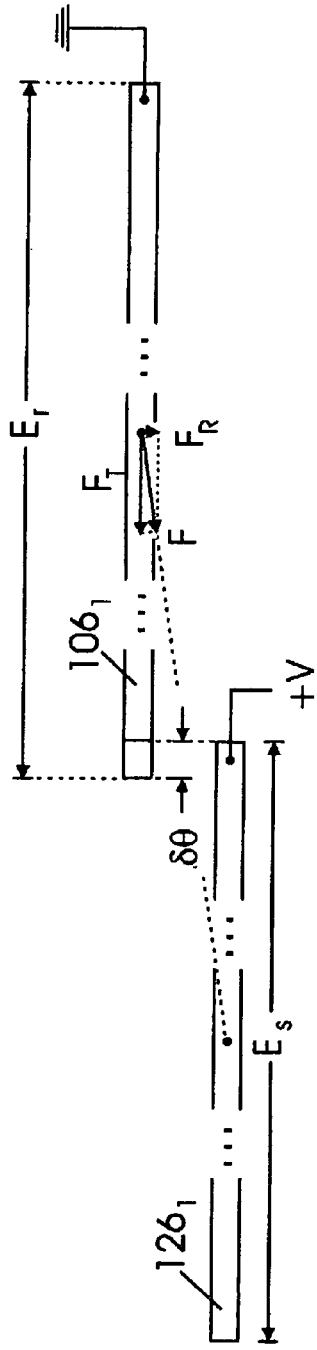
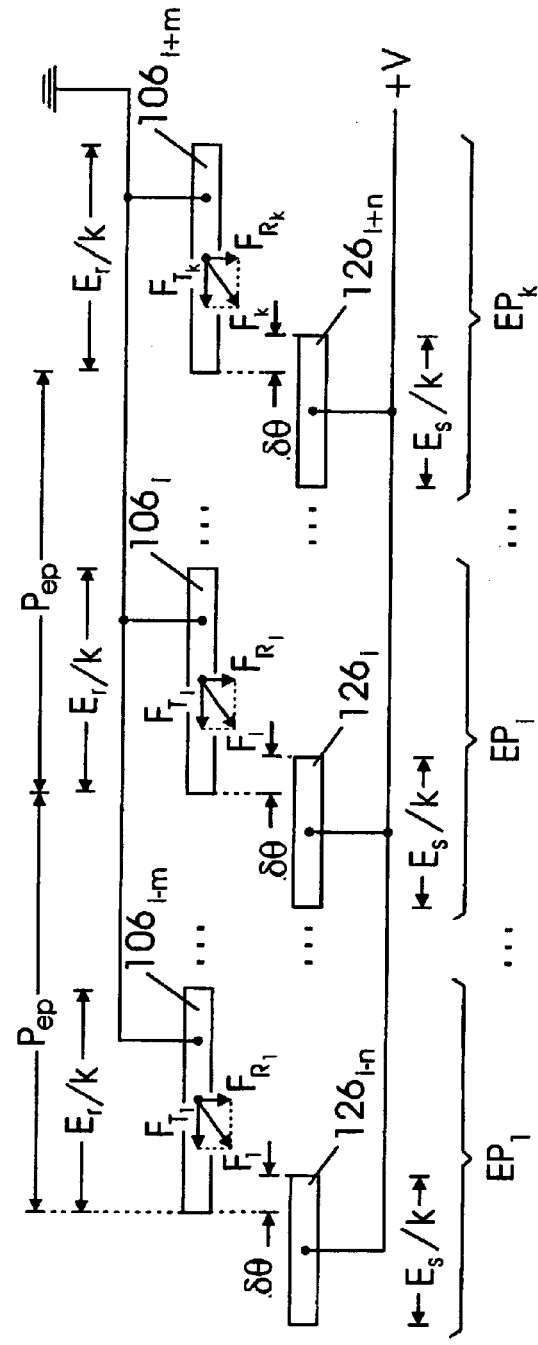
FIG. 15A
FIG. 15B

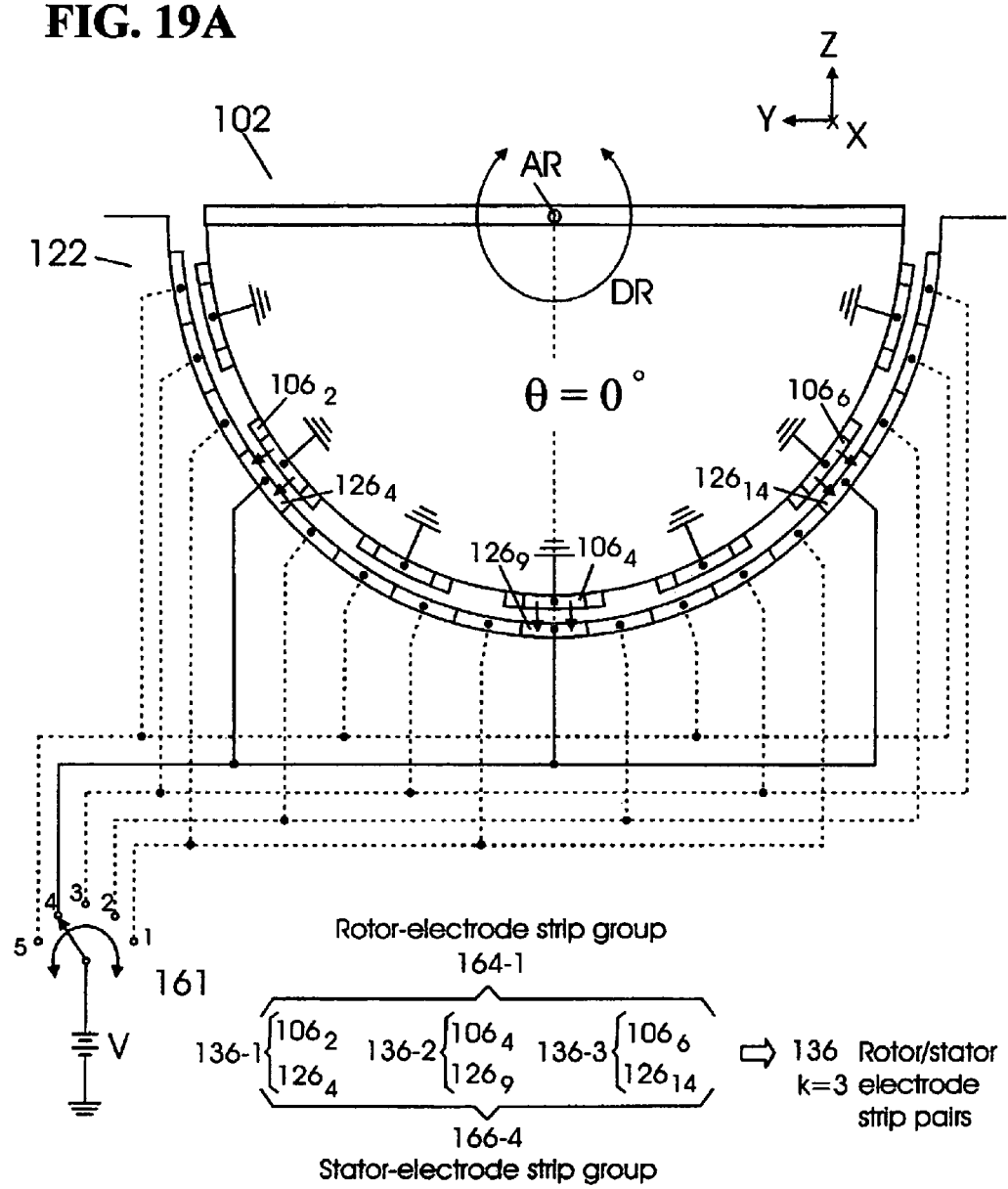

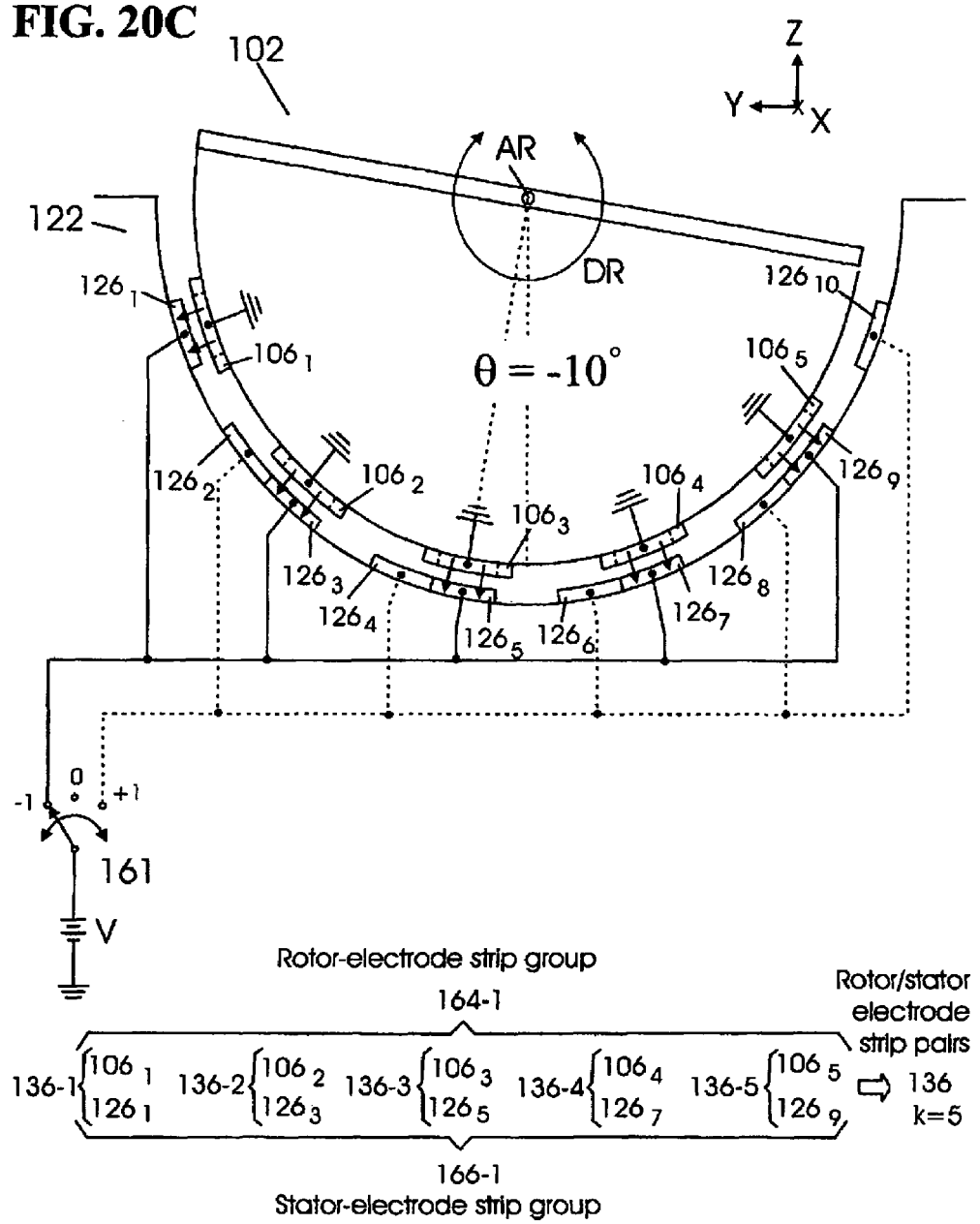

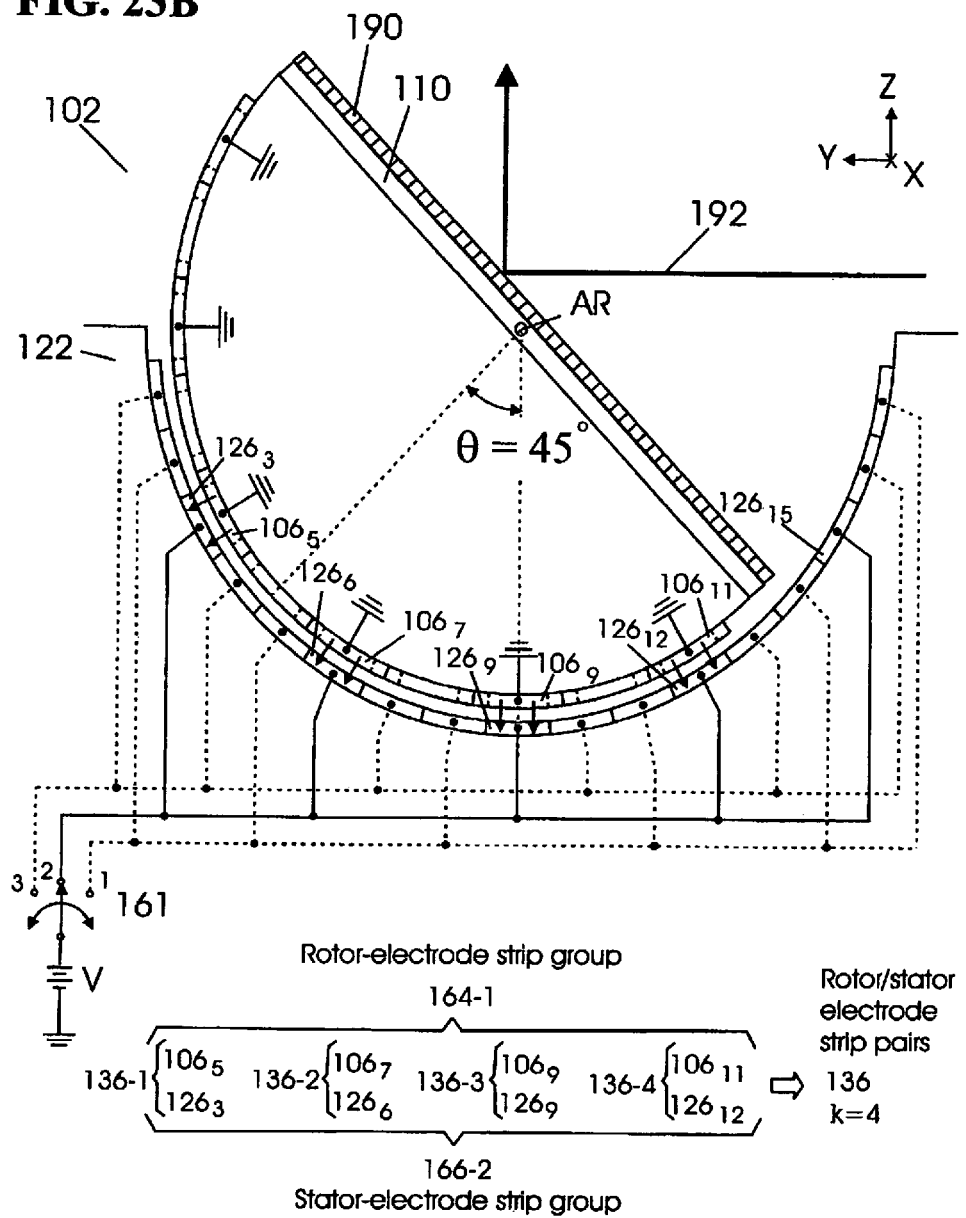

VERSATILE DIGITALLY CONTROLLED MICRO-MECHANICAL ACTUATOR

BACKGROUND

1. Field of Invention

The present invention relates to micro-mechanical optical systems and more particularly to micro-mechanical actuators.

2. Description of Related Art

Micro-actuators have a wide variety of uses, from optical switching systems to modern displays. FIGS. 1A and 1B show a side view and top view respectively of a conventional electrostatic micro-actuator 10 using torsion beam hinges $16_1$ and $16_2$. Micro-actuator 10 includes a rigid platform 12, upon which is attached a reflective surface. Stationary electrodes $14_1$ and $14_2$ are attached to a substrate 18. In a neutral non-activated position, platform 12 is oriented horizontally above stationary electrodes $14_1$ and $14_1$ with a gap spacing $d_x$. A voltage is applied between stationary electrodes $14_1$ or $14_2$ and platform 12, causing platform 12 to rotate about an axis of rotation AR towards the activated stationary electrode. Platform 12 continues to rotate until it makes contact with the activated stationary electrode, defining a maximum tilt angle $\theta_x$.

There are a number of problems associated with the micro-actuator of FIGS. 1A-B.

Firstly, the micro-actuator has only 3 stable tilt angles: tilt angle=0 degree with no activated stationary electrodes, and tilt angle=$\pm\theta_x$ for stationary electrode $14_1$ or $14_2$ being activated. The tilt angle varies in proportion to the applied voltage up to a third of the maximum tilt angle $\theta_x$. Beyond this angle, platform 12 snaps down to the activated stationary electrode. Contact between platform 12 and stationary electrode $14_1$ or $14_2$ causes the two surfaces to stick disadvantageously.

Secondly, the maximum tilt angle $\theta_x$ is dependent on the gap spacing $d_x$. There is a tradeoff between electrostatic efficiency and the maximum tilt angle $\theta_x$. The larger the gap spacing $d_x$, the larger the maximum tilt angle $\theta_x$, but the lower the electrostatic efficiency, which implies a higher operating voltage. In fact, the electrostatic force is the least efficient during its initial third of the maximum tilt angle $\theta_x$. Beyond this angle the electrostatic force becomes more efficient but the tilt angle becomes uncontrollable.

Thirdly, the generated electrostatic force is more concentrated at the extreme edge of platform 12, thereby concentrating the stress load in this area. This can adversely affect the reflective surface attached to platform 12.

U.S. Pat. No. 6,657,759 describes a cantilever type micro-actuator using non-contact electrodes, as shown in FIG. 2A. A platform 32 is connected to an underlying substrate 24 via support 28. A snap-in electrode 44 may be provided such that the application of a voltage between it and platform 32 may be used to tilt it, perhaps in contact with substrate 24. A hold electrode 40 is configured as a comb structure with multiple teeth 41, 42, and 43. Teeth 41-43 are configured at different heights above the substrate and may be used to achieve different tilt orientations of platform 32. Hold electrode 40 is disposed on substrate 24 so as to avoid direct contact with platform 32. Thus, the application of a voltage $V_1$ between hold electrode 40 and platform 32 results in an electric field 52 that holds platform 32 in a tilted position at maximum tilt angle $\theta_x$ without contact with substrate 24 or a hard stop.

This configuration provides additional stable tilt angles and eliminates contact between electrodes. However, its maximum tilt angle is limited by the substrate. In addition, the small surface area of hold electrode 40 has a relatively small electrostatic force.

U.S. Pat. No. 6,154,302 describes an actuator with a floating hemisphere, as shown in FIGS. 3A-C. Hemispherical body 61 with flat face portion 64 and reflection layer 71 is encapsulated in an enclosure defined by supporting member 66 with hemispherical cavity 68, spacer 69 and base plate 78. The enclosure is filled with dielectric liquid 75. On the spherical face of hemispherical body 61, charging regions 83a and 83b are arranged, having different electric charging characteristics. Driving electrodes 86 are provided at the bottom portion of support member 66. The arrangement of driving electrodes 86a-e is shown as a bottom view in FIG. 3C. By proper activation of driving electrodes 86a-e, interacting with charging regions 83a and 83b, hemispherical body 61 can be rotated, as shown in FIG. 3B.

There are a number of problems associated with this floating hemispherical type microactuator.

Firstly, the axis-of-rotation AR is not fixed, causing charging regions 83a and 83b of hemispherical body 61 to come in contact with hemispherical cavity 68.

Secondly, the maximum tilt angle $\theta_x$ is seriously limited by base plate 78 at point 90 as shown in FIG. 3B.

Thirdly, this is a complex design, requiring the microactuator to be encapsulated in a fluid, as well as having an optical window.

Therefore, there is a need for new types of micro-actuators with a larger number of distinct tilt angles with a larger maximum tilt angle, which also avoid mechanical contact of the electrodes, generate higher electrostatic forces, and reduce platform stress loads.

SUMMARY OF THE INVENTION

Briefly and generally, according to embodiments of the invention a micro-mechanical actuator includes a partially cylindrical rotatable rotor assembly, a stationary stator structure, rotatable connectors, connecting the rotor assembly and the stator structure, and a switch controller, controlling the actuator. In some embodiments the rotor assembly includes a rotor cylindrical surface, a rotor-electrode strip array on the rotor cylindrical surface, a rigid platform, and rotor side walls attached to the rotor cylindrical surface and the rigid platform. In some embodiments the rotor-electrode strip array includes rotor-electrode strips on the rotor cylindrical surface length-wise parallel to each other and to a fixed axis of rotation. In some embodiments the stator-electrode strip array includes stator-electrode strips on the stator cylindrical surface length-wise parallel to each other and to the axis-of-rotation.

In some embodiments of the invention the micro-mechanical actuator is part of an optical system, where the optical system includes a light source, operable to emit light, and a light receiving element, wherein the micro-mechanical actuator is operable to assume an active position to reflect the light, emitted by the light source, towards the light receiving element, and a passive position to leave the emitted light unreflected.

In some embodiments of the invention a method of operating the micro-mechanical actuator includes activating the stator-electrodes and the rotor-electrodes of the micro-mechanical actuator in a timing sequence, and exerting a force on the activated rotor-electrodes by the activated stator-electrodes, thereby rotating the activated rotor-electrodes and the rotor in rotation-intervals corresponding to the timing sequence.

BRIEF DESCRIPTION OF THE DRAWINGS

FIG. 15A shows a side view of a single activated rotor/stator electrode strip pair.

FIG. 15B shows a side view of multiple simultaneously activated rotor/stator electrode strip pairs.

FIGS. 19A-C show a full side view of FIGS. 18A-C with the rotor assembly latched at various tilt angles.

FIGS. 20A-C show a side view of a small rotation angle configuration optimized for three rotational states.

DETAILED DESCRIPTION

Figure 1A:
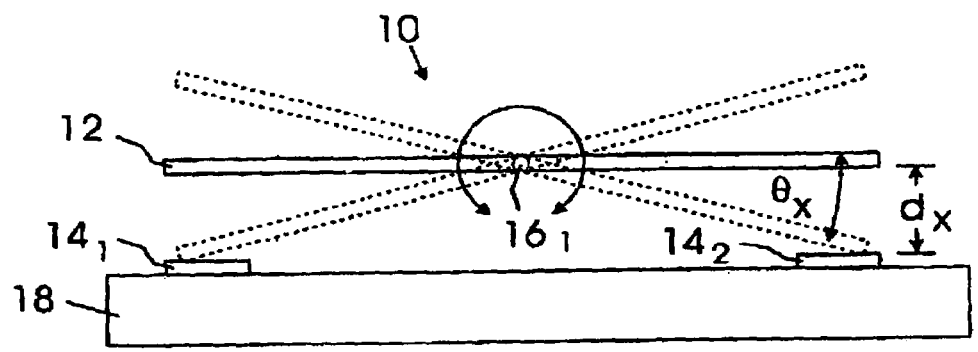
FIG. 1A shows a side view of a conventional micro-actuator using torsion beam hinges.
Figure 1B:
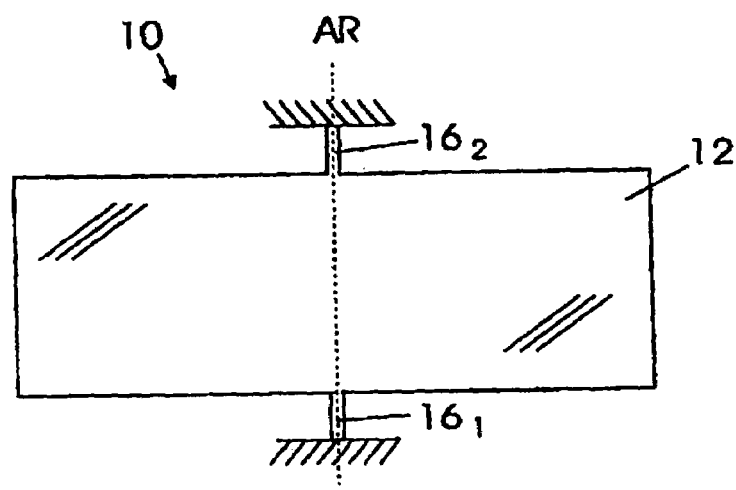
FIG. 1B shows a top view of FIG. 1A
Figure 2A:
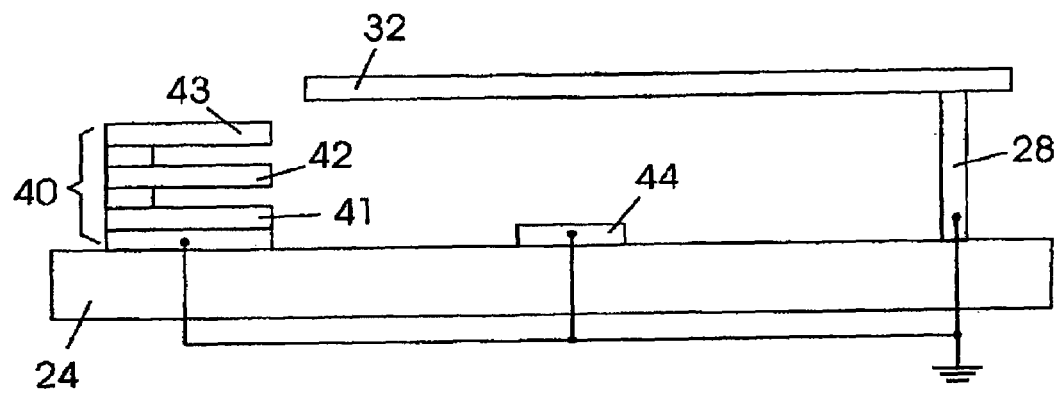
FIG. 2A shows a side view of a cantilever type micro-actuator using non-contact electrodes.
Figure 2B:
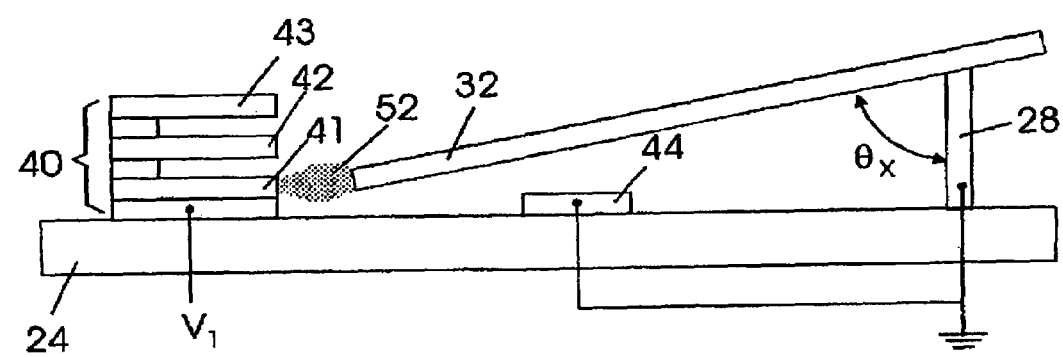
FIG. 2B shows the actuator of FIG. 2A deflected at a tilt angle.
Figure 3A:
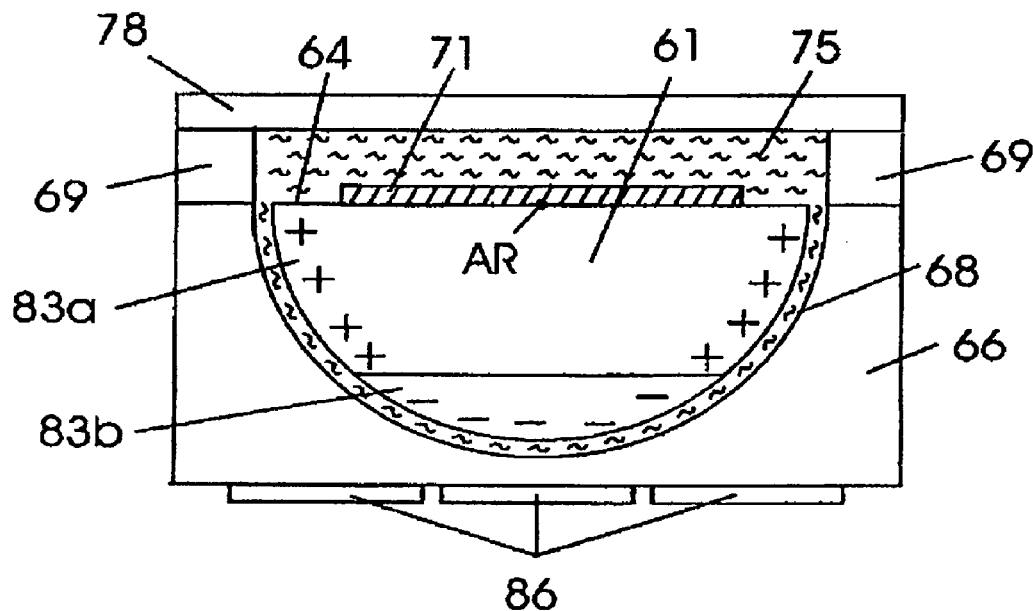
FIG. 3A shows a side view of a floating sphere type micro-actuator encapsulated in a dielectric liquid.
Figure 3B:
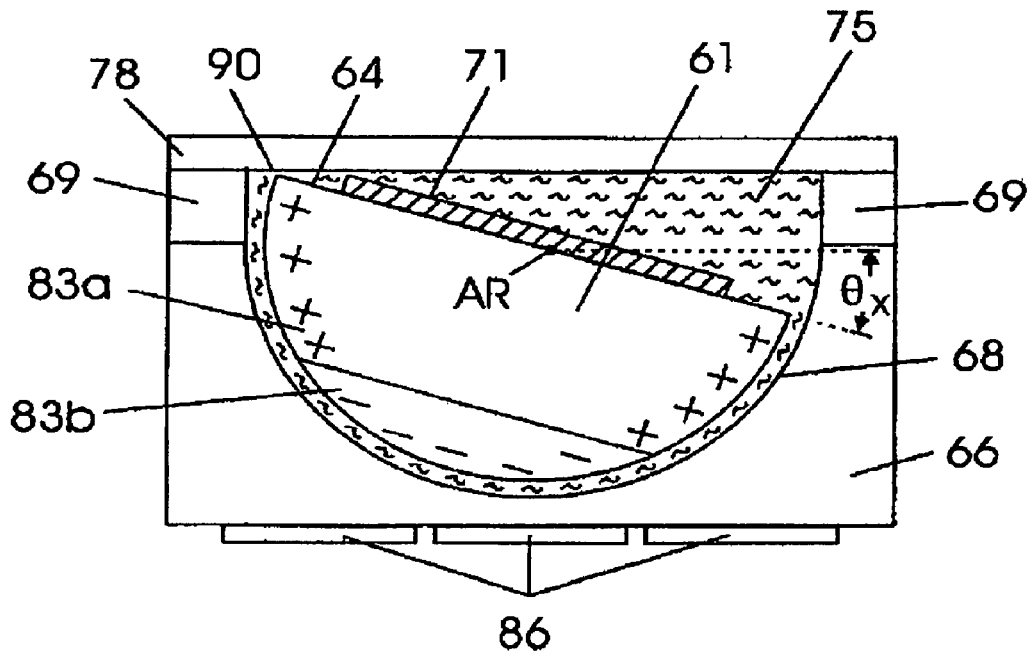
FIG. 3B shows FIG. 3A deflected at a tilt angle.
Figure 3C:
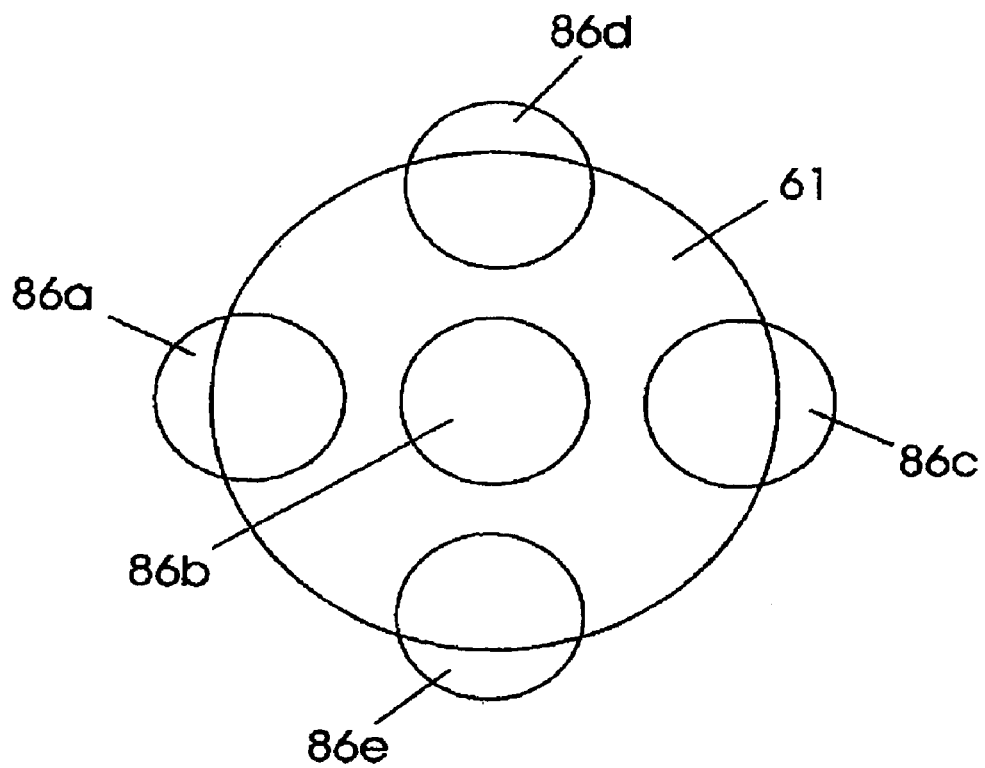
FIG. 3C shows a bottom view of the electrode arrangement.

In the following description, reference is made to the accompanying drawings that show, by way of illustration, specific embodiments in which the invention may be practiced. These embodiments are described in sufficient detail to enable those skilled in the art to practice the embodiments of the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 4:
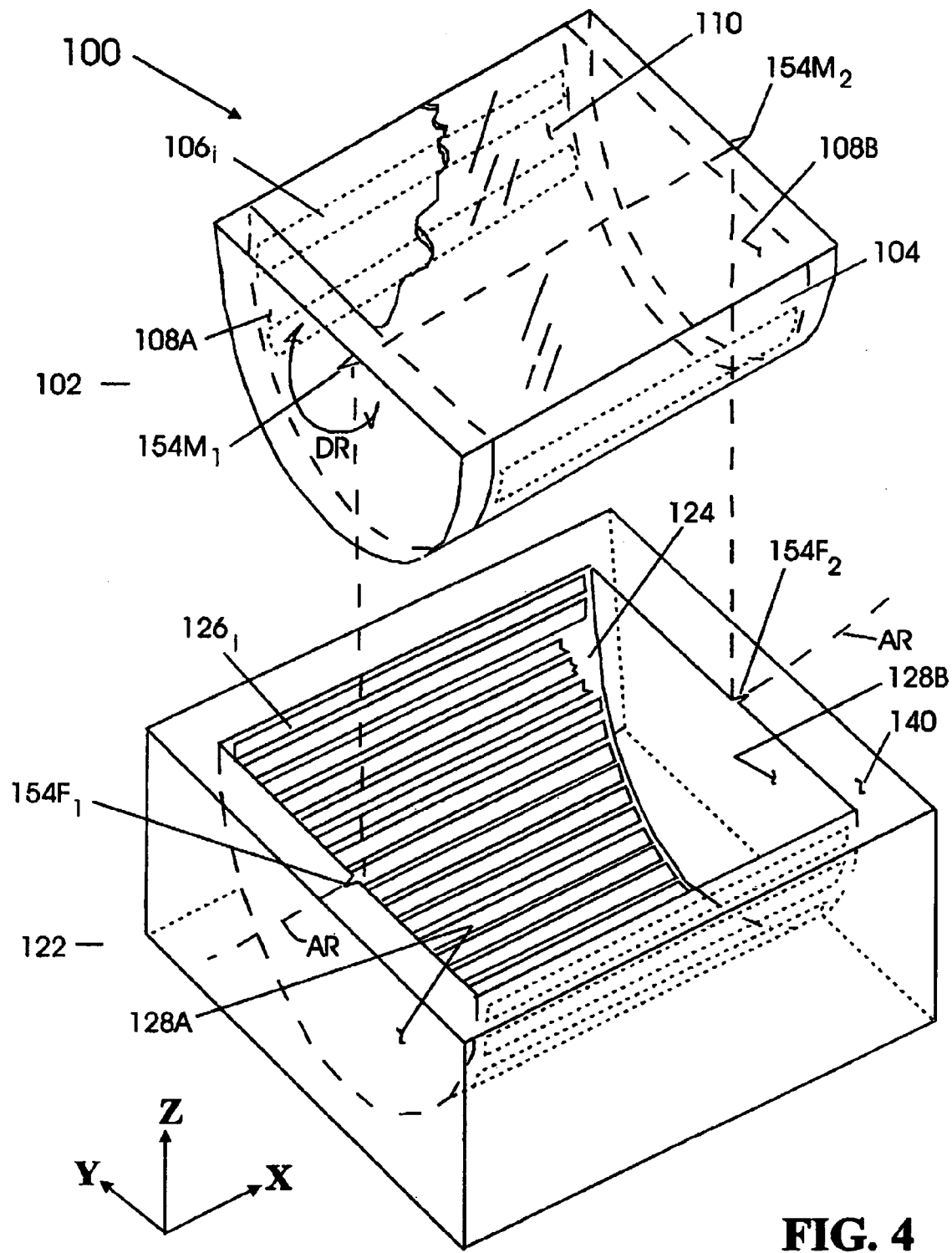
FIG. 4 shows an isometric view of a first embodiment of the invention.
Figure 5:
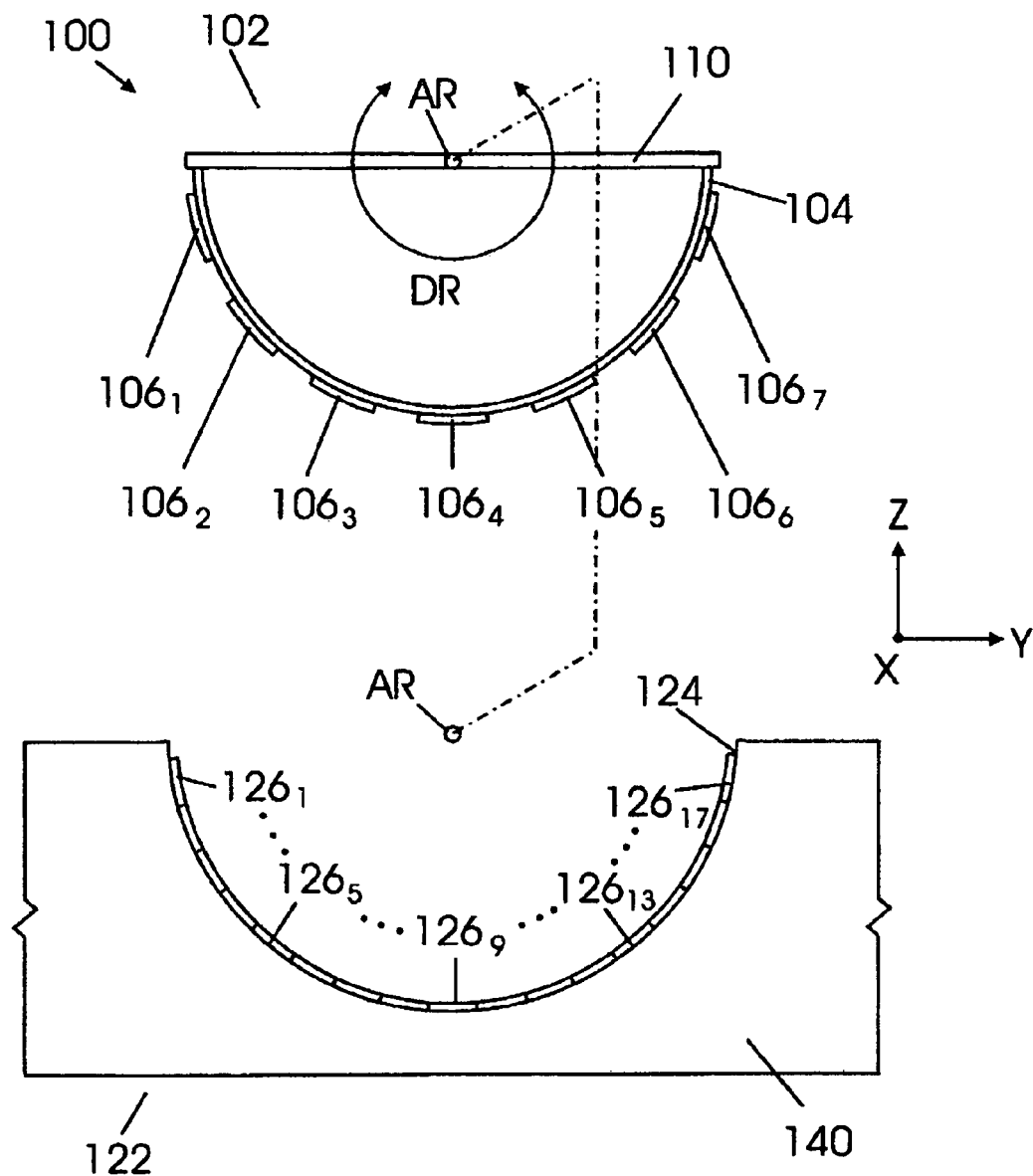
FIG. 5 shows an exploded cut-away side view of FIG. 4.

FIGS. 4 and 5 show an isometric view of a first embodiment of a micro-mechanical actuator 100 and an exploded cut-away side view. Actuator 100 includes a rotatable rotor assembly 102 and a stationary stator structure 122.

Rotor assembly 102 includes a rotor cylindrical surface 104, rotor-electrode strips $106_i$, forming a rotor-electrode strip array 106, and a rigid platform 110. Attached on the sides of rotor cylindrical surface 104 are rotor side walls 108A and 108B. Rotor side walls 108A and 108B can be arc segments of a circle. Rotor assembly 102 is rotatable around a fixed axis of rotation AR, defined by the center of the circle segment. In various embodiments the angle of the arc segment of rotor side walls 108A and 108B is about 90 degrees, in other embodiments it is about 180 degrees.

Arranged over the exterior of rotor cylindrical surface 104 is rotor-electrode strip array 106, including a group of rotor-electrode strips $106_i$. The number of rotor-electrode strips $106_i$ can vary widely in embodiments from a few to a hundred or more strips. For example in the embodiment of FIG. 5 there are seven rotor-electrode strips. Rotor-electrode strips $106_i$ are arranged length-wise parallel to each other and to the axis-of-rotation AR on rotor cylindrical surface 104. The angular pitch $P_r$, i.e. the angular separation of rotor-electrode strips $106_i$ can be constant along rotor cylindrical surface 104. Also, the angular extent $E_r$, i.e. the angular width of rotor-electrodes $106_i$ can be constant. The precision of the angular pitch $P_r$ and the angular extent $E_r$ can vary between 0.1 and 10 micro-radians. Rotor-electrode strips $106_i$ are made of conducting material such as metal alloys or semiconductors.

Rigid platform 110, attached to a flat top portion of rotor cylindrical surface 104 and rotor side walls 108A and 108B, thereby forming an enclosed rotor structure. Contact areas of rigid platform 110 are along top edges of rotor cylindrical surface 104 and rotor side walls 108A and 108B. This extensive contact enhances the rigidness of rigid platform 110. Rigid platform 110 provides a structurally rigid and stable optical bench upon which an optical element can be attached. Rigid platform 110 is formed to be sufficiently rigid to minimize distortions due to structural stresses generated by the various forces acting on it. Rigid platform 110 is not in direct contact with rotor-electrode strip array 106, thereby making it possible to isolate it from electrostatic forces created by rotor-electrode strip array 106.

FIG. 5 shows an embodiment where rotor-electrode strips $106_1 \ldots 106_7$ are uniformly distributed over the entire rotor cylindrical surface 104. This arrangement provides a uniformly distributed stress load over rotor cylindrical surface 104. This stress load is transmitted more evenly to attached rigid platform 110 via the edges of rotor cylindrical surface 104 and rotor side walls 108A and 108B. The stress loads can be further distributed by at least partially filling the interior of rotor assembly 102 with an energy absorbing material. The backside of the rigid platform 110 can be attached to the energy absorbing material.

Various optical elements can be attached to rigid platform 110. Optical elements include a reflective surface, an optical lens, a prism, a sensor, and dispersion elements such as diffraction gratings. A reflective surface can be attached directly onto the surface of rigid platform 110. Doing so requires the formation of a sufficiently smooth surface on rigid platform 110. In addition, in some embodiments certain thermal characteristics of rigid platform 110 closely match those of the reflective surface itself to avoid problems related to surface curvature. Such curvature can result e.g. from heat generated by light hitting the reflective surface, causing the reflective surface to expand at a rate different from that of rigid platform 110.

Stationary stator structure 122 comprises stator cylindrical surface 124, stator-electrode strip array 126 and stator side walls 128A and 128B. Stator-electrode strip array 126 includes stator-electrode strips $126_i$. Stator cylindrical surface 124 can be a cavity structure embedded into a substrate 140. Stator side walls 128A and 128B attach to stator cylindrical surface 124 on each side. Stator side walls 128A and 128B can be arc segments of a circle. The center of the circle aligns with axis-of-rotation AR. In various embodiments the angle of the arc segment is small, is about 90 degrees, in others it is about 180 degrees. In embodiments the radius of stator side walls 128A-B is large enough to enclose rotor assembly 102. The angle of the arc segment in the embodiment in FIG. 5 is about 180 degrees, making stator structure 122 a half cylinder with a rotor assembly 102 that is also a half cylinder. The combined structure will be referred to as a half cylinder rotor/stator configuration. A quarter cylinder configuration will be discussed below.

FIG. 5 shows an embodiment where stator-electrode strips $126_i$ are uniformly distributed over the entire stator cylindrical surface 124, thus forming a stator-electrode strip array 126. Stator-electrode strips $126_i$ are arranged length-wise parallel to each other and to the axis-of-rotation AR along the width of stator cylindrical surface 124. Embodiments of stator-electrode strip array 126 have constant angular pitch $P_x$ and constant angular extent $E_s$ in the sense defined above. The precision of the angular pitch and extent can be between 0.1 and 10 micro-radians, depending on the manufacturing method. Stator-electrode spacing between electrode strips can be made as small as 1 micron limited only by the manufacturing tolerances. Stator-electrode strip array 126 can be made of conducting materials such as metal alloys or semiconductors.

Rotor assembly 102 is connected to stator structure 122 via rotatable connectors 152-1 and 152-2. Rotatable connectors 152 are attached to the sides of rotor assembly 102 and aligned along axis-of-rotation AR. In the embodiment of FIG. 4, rotatable connectors 152-1 and 152-2 are needle point hinges, including male(M) and female(F) parts 154M-1/154F-1 and 154M-2/154F-2, respectively. In other embodiments rotatable connectors 152 are torsion hinges or other twistable connectors.

Rotor assembly 102 is suspended above but embedded within the cavity of stator structure 122 such that stator-electrode strip array 126 faces rotor-electrode strip array 106 and is separated from it by a gap spacing d. The gap spacing d is selected to be as small as possible, but large enough that rotor-electrode strip array 106 and stator-electrode strip array 126 do not get into physical contact at anytime over the complete rotational range of rotor assembly 102. The gap spacing d can be as small as 1 micrometer depending on the manufacturing tolerances, the tensile strength of rotatable connectors 152-1/152-2, and the radial components of electrostatic forces. Avoiding physical contact means that a minimal gap spacing d is maintained over the complete rotation range of rotor assembly 102.

Features of embodiments include that, unlike existing designs, the rotation range is independent of gap spacing d. Further, the rotation range is not obstructed or limited by other structural elements, such as substrate surfaces. Also, actuator 100 maintains an essentially fixed axis-of-rotation during the rotation. Finally, actuator 100 achieves these features without the use of a dielectric fluid or dielectric layer in the gap. This makes actuator 100 a simple construction and allows the formation of a gap with a suitably small gap spacing d. Embodiments with small gap spacing are operable with lower voltages or higher electrostatic forces or the combination of the two. Also, the lack of dielectrics in the gap makes actuator 100 a simple design.

Rotatable connectors 152-1 and 152-2 are electrically conductive and thus provide an electrical connection of rotor-electrodes $106_i$ to a switch controller (not shown). Rotatable connectors 152-1 and 152-2 are capable of maintaining the electrical connection over the complete range of rotation.

Figure 6A:
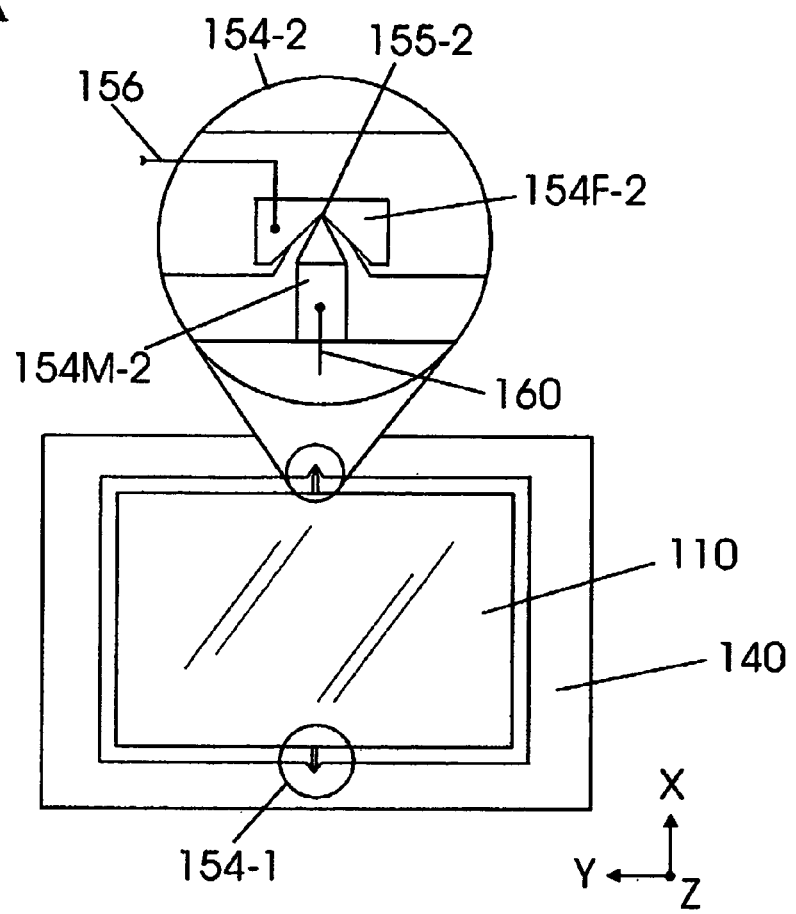
FIG. 6A shows a top view of micro-actuator with an exploded view of a needle point hinge type rotatable connector.

FIG. 6A shows a top view of actuator 100 with an exploded view of a needle point hinge type rotatable connector 154-2, which comprises a male end section 154M-2 and a female end section 154F-2. Male end section 154M-2 has a protruding cone segment with a small needle point tip 155-2. Female end section 154F-2 has a corresponding concave receiving element or pivot. Rotor assembly 102 can have male end sections 154M-1 and 154M-2 on both sides and the stator structure 122 can have female end sections 154F-1 and 154F-2 on both sides as shown in FIG. 4. Conversely, rotor assembly 102 can have female end sections 154F-1 and 154F-2 on both sides and stator structure 122 can have male end sections 154M-1 and 154M-2. In some embodiments needle point hinges 154-1 and 154-2 are made from a hardened metal such as steel. External electrical connections to rotor assembly 102 are made via electrical connections 156 and 159.

In comparison to torsion hinges, needle point hinges 154 have virtually no rotational bias and friction between male end section 154M-1 and female end section 154F-1 due to the small contact surface area. This means virtually no rotational friction, and therefore a lower activation voltage is required to rotate rotor assembly 102. Also, needle point hinges 154 have a big unrestricted rotational range. Finally, needle point hinges 154 exhibit no metal fatigue making corresponding embodiments highly reliable.

Figure 6B:
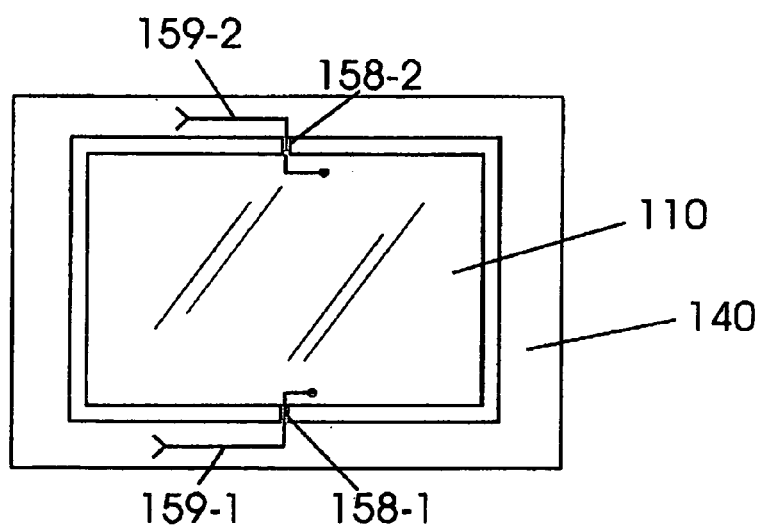
FIG. 6B shows a top view of micro-actuator using a torsion hinge type rotatable connectors.

FIG. 6B shows a top view of actuator 100 using torsion hinge type rotatable connectors 158-1 and 158-2. Torsion hinges provide a restoring force, which opposes the electrostatic forces twisting rotor 102 away from the neutral center position and contributes to the electrostatic forces twisting rotor 102 back to its neutral position. The restoring force therefore accelerates the operation of actuator 100, increasing its activation speed. Torsion hinges 158-1 and 158-2 are electrically conductive. Rotor assembly 102 is electrically coupled to an external switch controller via electrical connections 159-1 and 159-2.

Figure 7A:
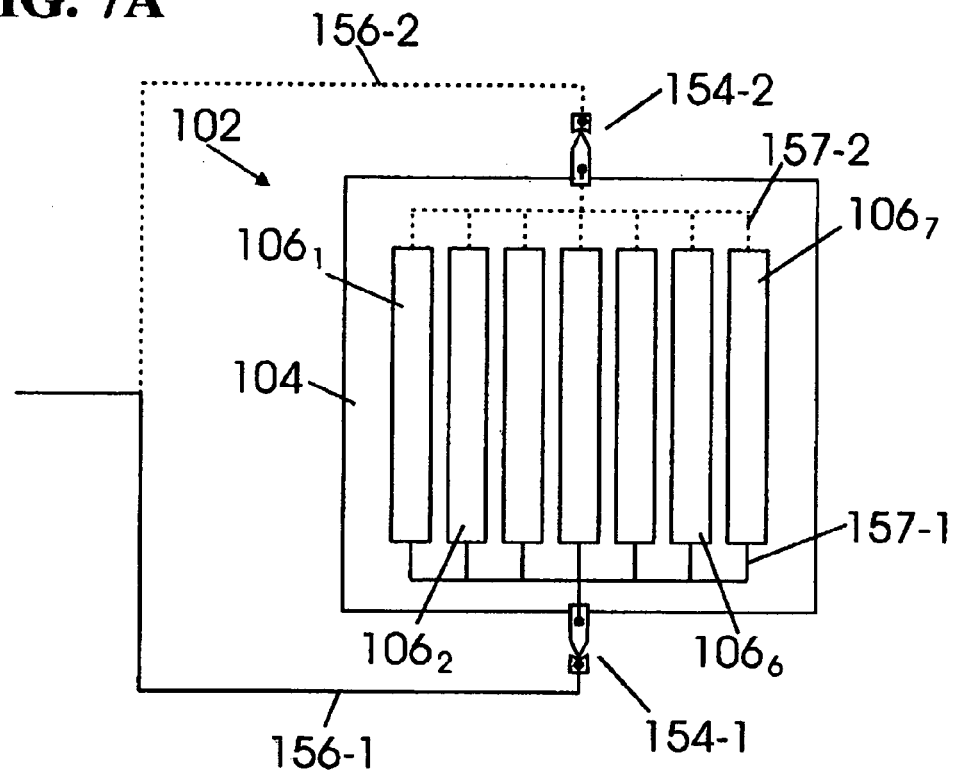
FIG. 7A shows a flattened top view of rotor assembly with external electrical connections to rotor-electrode strips via rotatable connectors.

FIG. 7A shows a flattened top view of rotor cylindrical surface 104 with external electrical connections 156-1 and 156-2, coupled to rotor-electrode strips $106_1 \ldots 106_7$ via needle point rotatable connectors 154-1 and 154-2, and internal electrical connections 157-1 and 157-2, respectively. Here rotor-electrode strips $106_i$ are electrically coupled together thus can be controlled as a single group. External electrical connector 156-2 is shown with dashed lines to indicate that in some embodiments the electrical coupling is provided by external electrical connector 156-1 alone. In the present embodiment needle point hinges 154-1 and 154-2 are not necessarily electrically isolated from each other.

Figure 7B:
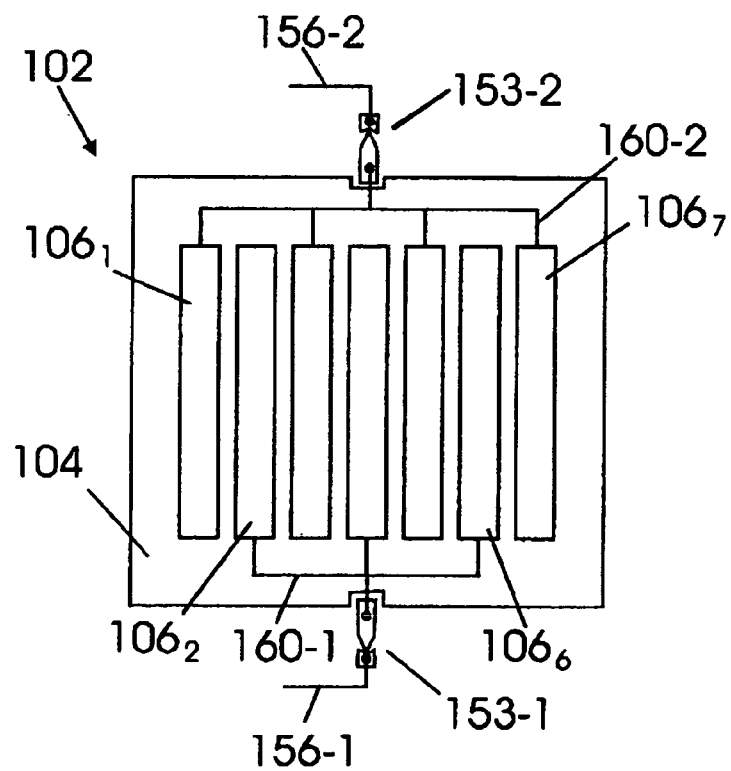
FIG. 7B shows a flattened top view of rotor assembly with external electrically isolated connections to rotor-electrode strips via rotatable connectors.

FIG. 7B shows a top flattened view of rotor cylindrical surface 104 with isolated external electrical connections coupled to two electrically isolated groups of rotor-electrode strips via rotatable connectors 153-1 and 153-2. Rotor-electrode strip array 106 is divided into two groups of alternating even and odd rotor-electrode strips. External electrical connections 156-1/156-2 to the even/odd rotor-electrode strips are made via rotatable connector 153-1/153-2 and internal electrical connection 160-1/160-2. This configuration allows independent control of the rotor-electrode groups via external electrical connection 156-1 and 156-2.

The operation of actuator 100 will now be described.

Figure 8:
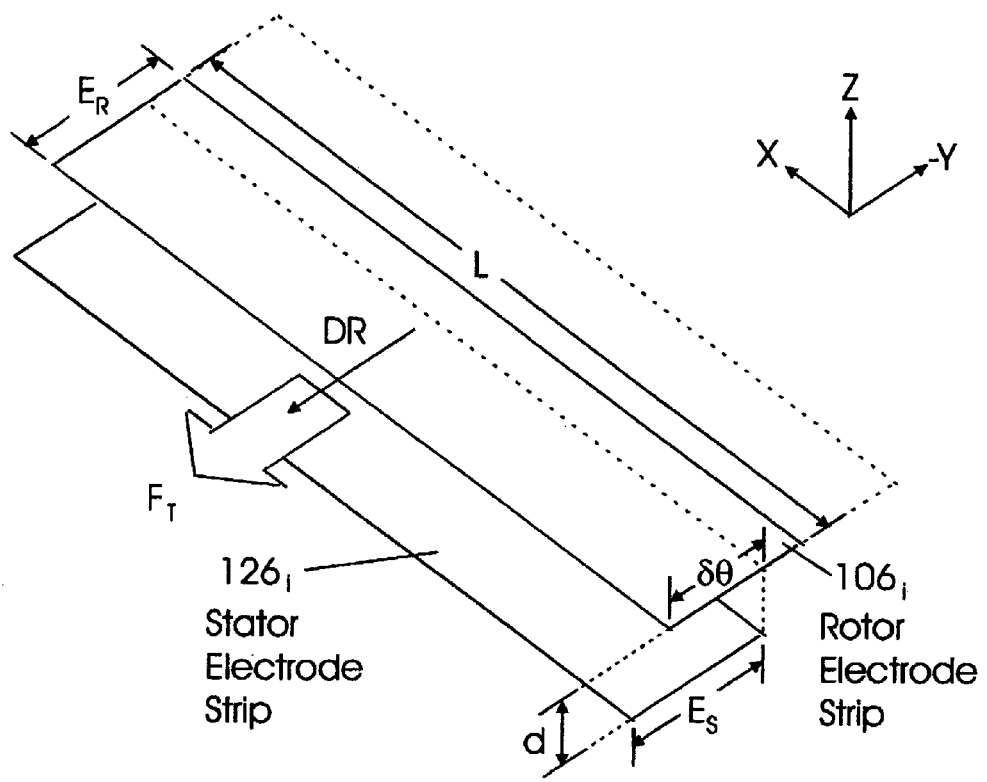
FIG. 8 shows an isometric view of laterally translated parallel plates.

FIG. 8 starts the illustration of basic aspects of the operation. A rotor/stator electrode pair includes rotor-electrode strip $106_i$, laterally translated relative to stator-electrode strip $126_i$, with gap spacing d. Rotor-electrode strip $106_i$ has width, or extent, $E_R$ and length L, and stator-electrode strip $126_i$ has width, or extent, $E_S$ and length L. In embodiments the extent and length of rotor-electrode strip $106_i$ and stator-electrode strip $126_i$ can be different. Rotor-electrode strip $106_i$ is translated from stator-electrode $126_i$ by an angular electrode overlap $\delta\theta$ in the direction of rotation DR.

Figure 9:
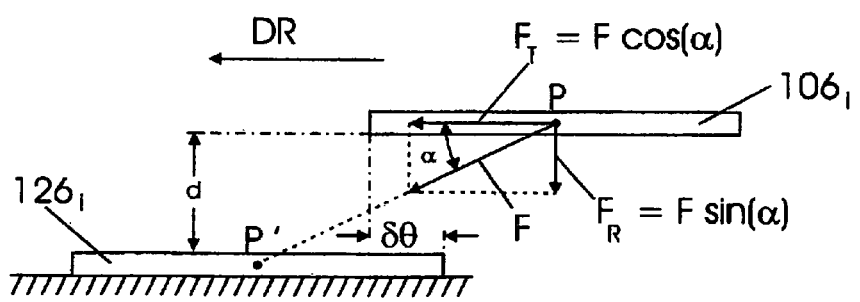
FIG. 9 shows exploded side view of FIG. 8.

FIG. 9 shows an activated rotor/stator electrode pair. The rotor/stator electrode pair is activated by the application of a voltage between stator-electrode strip $126_i$ and rotor-electrode strip $106_i$, generating an electrostatic force F. In some embodiments, a voltage is applied to stator-electrode strip $126_i$ and rotor-electrode strip $106_i$ is grounded. In this case charges will flow from the ground onto rotor-electrode strip $106_i$ from the ground, the charges having opposite polarity than the charges flowing onto stator-electrode strip $126_i$. In other embodiments, rotor-electrode strip $106_i$ and stator-electrode strip $126_i$ are coupled to the two terminals of a voltage source. The attraction between the rotor and stator charges induces electrostatic force F. In effect, F can be thought of acting between central point P of rotor-electrode strip $106_i$ and central point P' of stator-electrode strip $126_i$. Electrostatic force F can be decomposed into two orthogonal components: a translational force component $F_T$ and a radial force component $F_R$. Translational force component $F_T$ is the translational force that is tangential to the rotation trajectory and radial force component $F_R$ is the radial force passing through the central point P. Force F makes an angle $\alpha$ with the direction of translation. Using angle $\alpha$ the force components can be written as $$F_T = F \cos(\alpha) \tag{1A}$$

$$F_R = F \sin(\alpha) \tag{1B}$$

These force components are transmitted to rotor 102 directly. Rotor 102 may experience additional forces, such as the force from rotatable connectors 152-1 and 152-2. Rotor electrode strip $106_i$ is not moving in the radial direction because radial force component $F_R$ is counter-balanced by an equal but opposite force from rotatable connectors 152-1 and 152-2. However, translational force component $F_T$ is not counter-acted (or at most to some small degree) and thus pulls rotor-electrode strip $106_i$ in the direction DR essentially parallel to stator-electrode strip $126_i$. As the angle $\alpha$ varies, the components of electrostatic force F vary because of the trigonometric factors.

In embodiments, where the stator-electrode strip width $E_s$ and rotor-electrode width $E_r$ is larger than the gap spacing d, translational force component $F_T$ is given as:

$$F_T = F'_T + F''_T(\delta\theta) \tag{2}$$

where $F''_T(\delta\theta)$ is the electrostatic fringe force of translational force component $F_T$ and $F'_T$ is the leading order term of translational force component $F_T$.

The radial force component $F_R$ is given by:

$$F_R = F'_R + F''_R(\delta\theta) \tag{3}$$

where $F'_r$ is a first order calculation of radial force component $F_R$ and $F''_R(\delta\theta)$ is the electrostatic fringe force of radial force component $F_R$. In general, both the translational and radial components of the electrostatic fringe force, $F''_T(\delta\theta)$ and $F''_R(\delta\theta)$, respectively, can be calculated for example by numerical simulations using a finite element modeler.

Figure 10A:
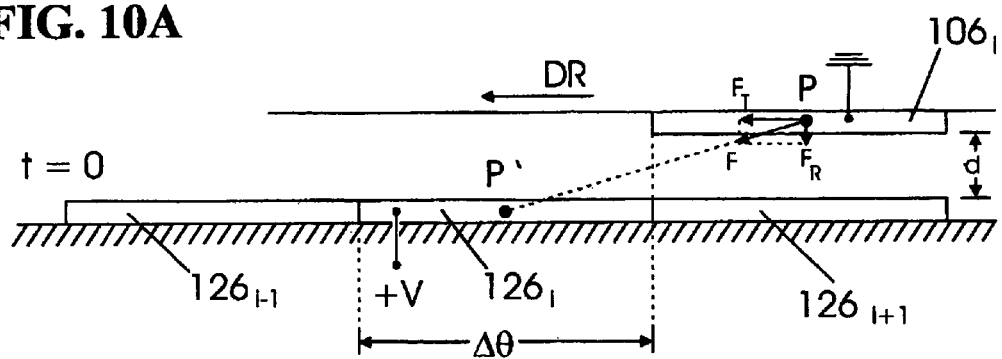
FIGS. 10A-C show an expanded view of FIG. 9 with an activated rotor/stator electrode strip pair at various time instances.
Figure 10B:
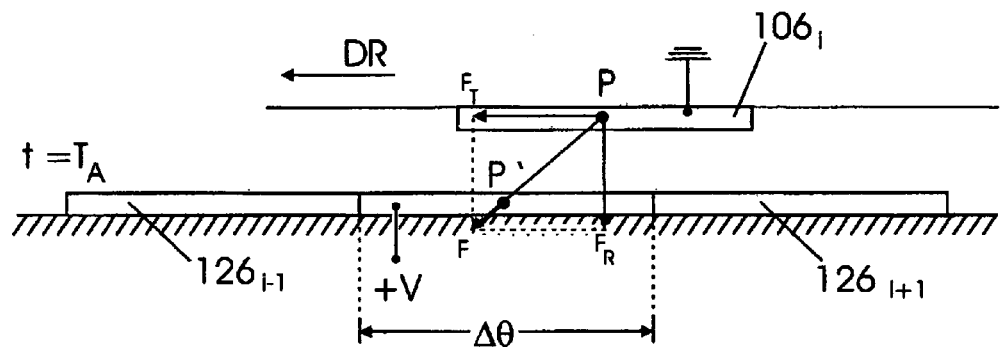
Figure 10C:
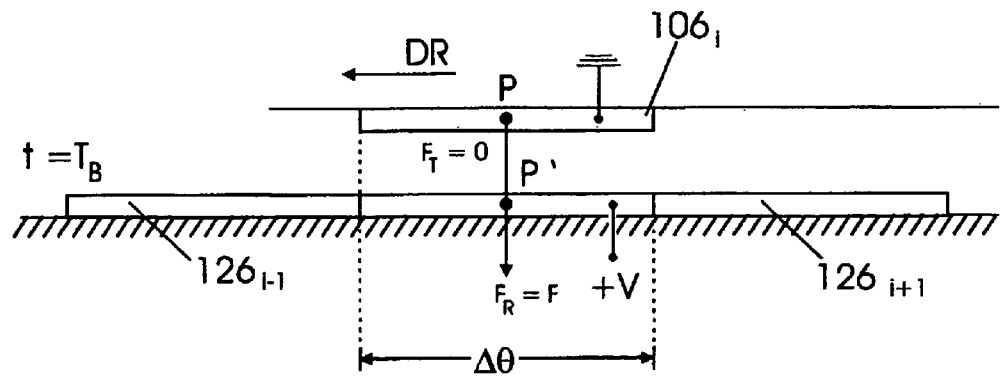

FIGS. 10A-C show the locations of rotor-electrode strip $106_i$ relative to stator-electrode strip $126_i$, and the corresponding forces in subsequent time instances within a rotational interval $\Delta\theta$. In operation, actuator 100 goes through several such rotational intervals.

Figure 11A:
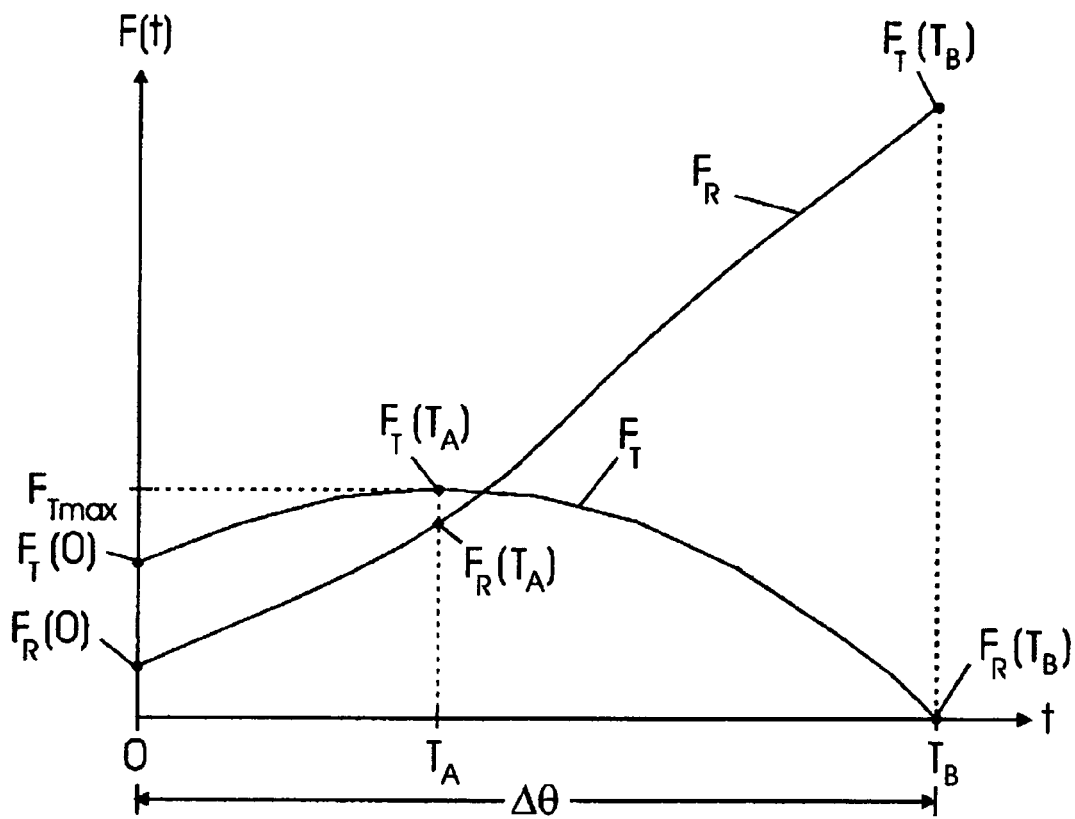
FIG. 11A shows a graph of the electrostatic force components at corresponding time instances in FIGS. 10A-C.

FIG. 11A shows the corresponding graph of electrostatic force components $F_T$ and $F_R$ as a function of time.

Figure 11B:
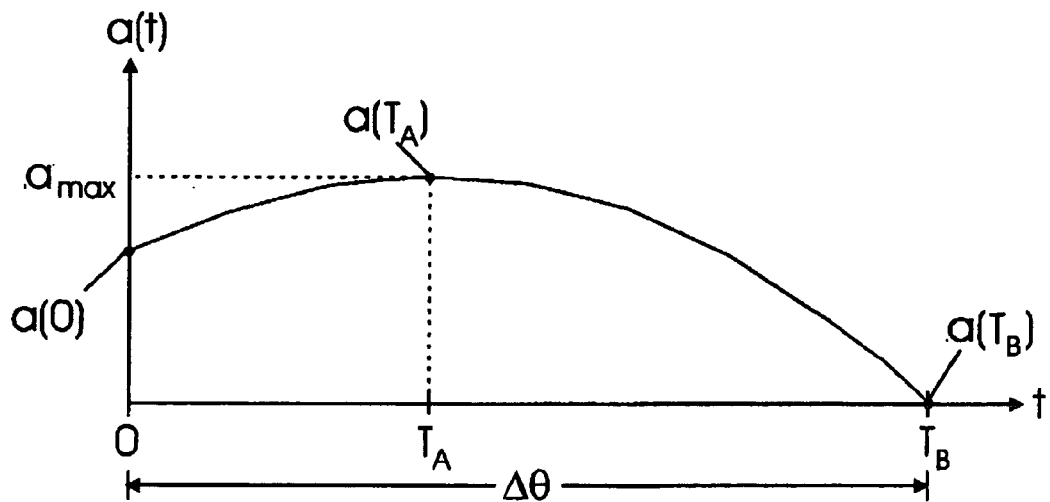
FIG. 11B shows a graph of the rotational acceleration/deceleration at corresponding time instances in FIGS. 10A-C.

FIG. 11B shows a graph of the corresponding rotational acceleration a of rotor assembly 102 as a function of time. The relationship between translational force component $F_T$ of FIG. 11A and rotational acceleration a of FIG. 11B is given by:

$$F_T = ma \qquad (4)$$

where m is the mass of rotor-electrode strip $106_i$ (corrected with the corresponding mass and inertia of rotor 102 per electrode strip). This means that $F_T$ and a have the same time dependence. Consequently, the maximum translational force component $F_{Tmax}$ occurs at the same time as maximum rotational acceleration $\alpha_{max}$. A more precise formulation can be derived using notions of torque instead of force, but with essentially the same results.

A rotational interval can be reviewed starting at time t=0, when rotor-electrode strip $106_i$ is aligned with stator-electrode strip $126_{i+1}$. At about time instance t=0 a voltage V is applied between diagonally positioned rotor-electrode strip $106_i$ and stator-electrode strip $126_i$, forming an activated rotor/stator electrode pair. Since there is no overlap between this rotor/stator electrode strip pair, the initial electrostatic force attraction is due to the fringe force $F''_T(\delta\theta)$ and $F''_R(\delta\theta)$ of equations 2 and 3, respectively. Under the influence of the fringe force rotor assembly 102 begins to rotate in the direction of rotation DR.

FIG. 10A shows that in the beginning of the rotational interval translational component $F_T$ is bigger than radial component $F_R$. This is also indicated in FIG. 11A with translational component $F_T$ at time t=0 shown by point $F_T(0)$ having a larger value compared to the corresponding radial component at time t=0 shown by point $F_R(0)$. However, it can be seen in FIG. 11A, that radial component $F_R$ has a higher slope compared to translational component $F_T$. This results in radial component $F_R$ increasing in value faster than translational component $F_T$. The corresponding rotational acceleration at time t=0 is shown in FIG. 11B as point a(0).

During the rotational interval radial component $F_R$ monotonously increases, whereas translational component $F_T$ reaches a maximum value at time $t=T_A$ and decays from there on to essentially zero when rotor-electrode strip $106_i$ completely overlaps with the corresponding stator-electrode strip $126_i$. FIG. 11B shows that the rotational acceleration shows a corresponding maximum $\alpha(T_A)$ at the same time. At time $t=T_B$, rotor-electrode strip $106_i$ is directly aligned with stator-electrode strip $126_i$. FIG. 10C shows that translational component $F_T$ goes to zero while radial component $F_R$ reaches it maximum value equal to F. This can be also seen in FIG. 11A at points $F_T(T_B)$ and $F_R(T_B)$ respectively. In FIG. 11B, the corresponding point on the rotational acceleration curve $\alpha(T_B)$ equals zero.

Until the point of complete overlap at time instance $t=T_B$ rotor electrode strip $106_i$ is accelerating. At time instance $t=T_B$ translational force component $F_T$ goes through zero and changes sign. If the voltage remains unchanged, from this time instance on rotor electrode strip $106_i$ would decelerate. The acceleration of rotor electrode strip $106_i$ can be maintained by changing the applied voltages in a suitable manner.

There are two different stages of the operation of actuator 100.

In the first stage, rotor/stator electrode pairs are activated with a timing sequence, which is designed to cause rotor 102 to rotationally accelerate optimally over one or more stator-electrode strips $126_i$. In this stage, the application of voltage to stator-electrode strip $126_i$ follows a timing sequence, where the application of the voltage is switched from stator-electrode strip $126_i$ to stator-electrode strip $126_{i-1}$ latest at $t=T_B$, the time instance of the complete overlap of FIG. 10C, or in some embodiments earlier. Both these embodiments avoid the deceleration of rotor 102, starting after the instance of complete overlap. The switching includes essentially simultaneously deactivating stator-electrode strip $126_i$ and activating stator-electrode strip $126_{i-1}$. Rotor 102 is rotated by repeating this timing sequence over several rotational intervals. The individual rotational intervals $\Delta\theta$ add up into a tilt angle $\theta$ over the entire rotation, equaling an integer number of rotational intervals $\Delta\theta$. Thus the present embodiment can rotate rotor 102 to tilt angles in small discrete increments.

As described, rotor 102 accelerates from interval to interval, continuously increasing the velocity of rotor 102. Therefore, rotor 102 covers individual rotational intervals $\Delta\theta$ in shorter and shorter time intervals.

In the second stage of the operation, rotor 102 is stopped at the desired tilt angle $\theta$. To achieve this, the voltage V remains applied to stator-electrode strip $126_i$ past the instance of complete overlap, because in this deceleration regime translational force component $F_T$ points opposite to the direction of rotation DR and is thus capable of decelerating rotor 102. The deceleration and stopping of rotor-electrode strip $106_i$ in a position overlapping stator-electrode strip $126_i$ will be referred to as the latching of the rotor/stator electrode pair. There may be some ringing associated with the stopping of rotor 102.

It can be seen in FIG. 10C that rotor-electrode strip $106_i$ can be rotated in the opposite direction by simultaneously deactivating stator-electrode strip $126_i$ and activating stator-electrode strip $126_{i+1}$ and repeating the timing sequence in a reverse manner. Therefore this embodiment offers bi-directional rotation. This way rotor assembly 102 can be rotated to any rotation angle.

Figure 12A:
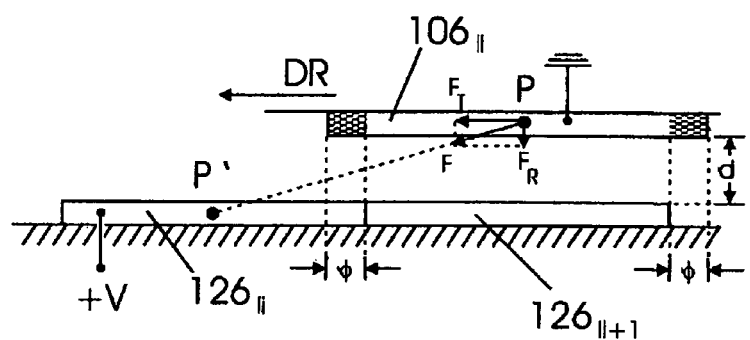
FIG. 12A shows the rotor-electrode strip of FIG. 10 with electrode overlap extent.
Figure 12B:
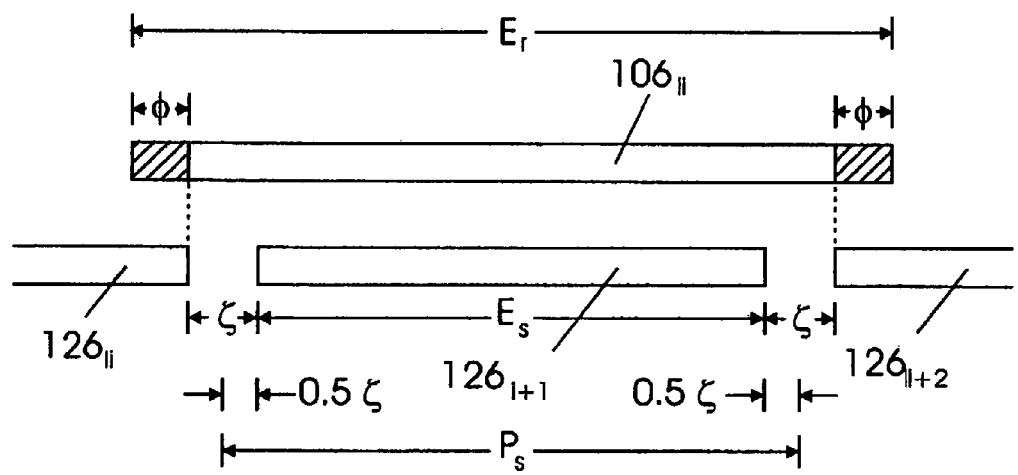
FIG. 12B shows an exploded view of FIG. 12A.

FIG. 12A shows an embodiment with a rotor-electrode strip $106_i$ of FIG. 10 having an electrode overlap $\phi$ on both sides and FIG. 12B shows an exploded view of FIG. 12A. As shown in FIG. 12A, $\phi$ is defined as the overlap in degrees of rotor-electrode strip $106_i$ beyond that of stator-electrode strip $126_i$. According to FIG. 12B:

$$\phi = \frac{E_r - (P_s + \zeta)}{2} \cong \frac{E_r - P_s}{2} \qquad (5)$$

where $E_r$ is the rotor angular extent, $P_S$ is the stator angular pitch and $\zeta$ is the stator-electrode spacing. Stator angular pitch $P_s$ is given by:

$$P_s = E_s + \zeta. \qquad (6)$$

Figure 13A:
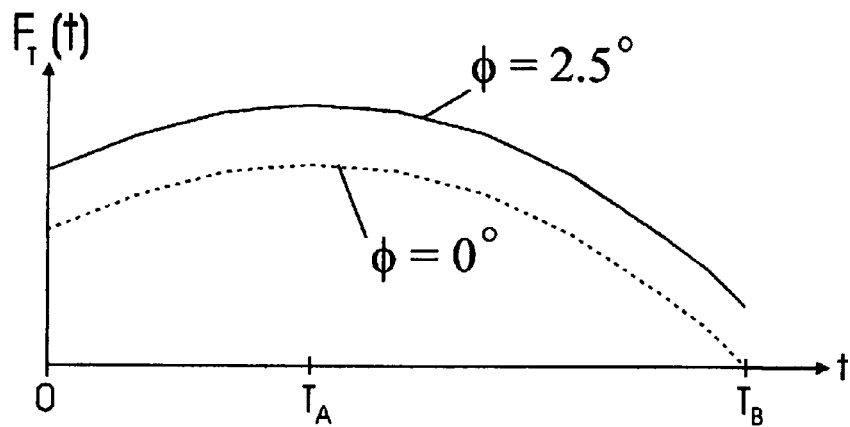
FIG. 13A shows the relative increase in the translational force component with overlap extent compared to that in FIG. 11A.
Figure 13B:
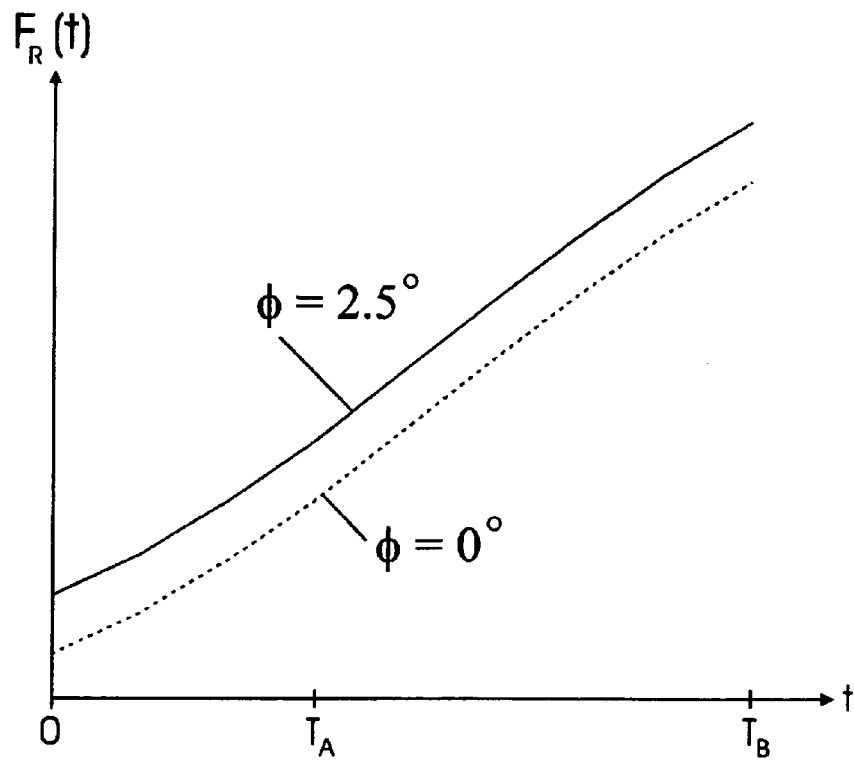
FIG. 13B shows the relative increase in the radial force component with overlap extent compared to that in FIG. 11A.
Figure 13C:
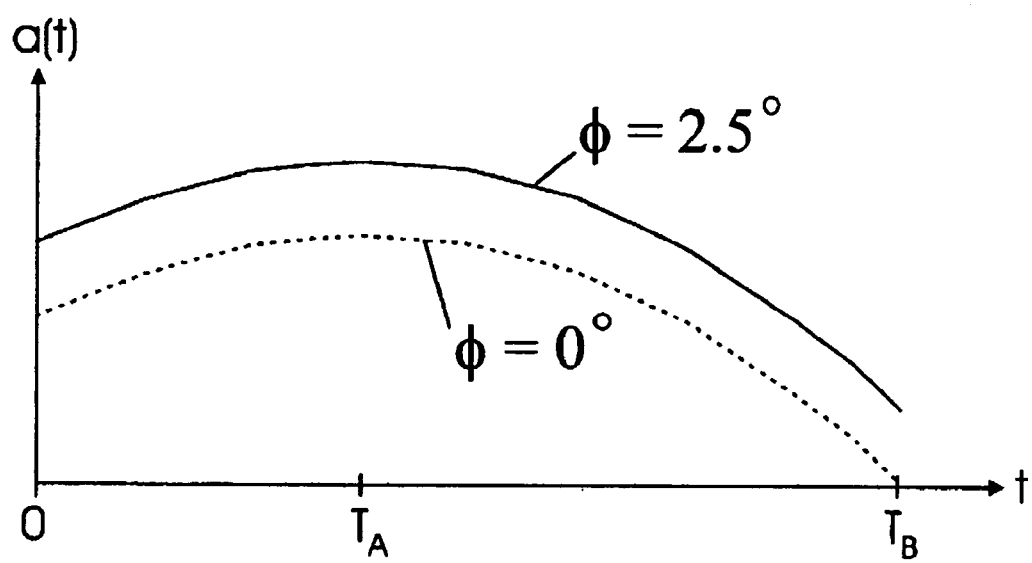
FIG. 13C shows the relative increase in rotational acceleration with overlap extent compared to that in FIG. 11B.

In these embodiments the electrostatic force F is bigger due to the bigger overlap between the rotor and stator electrode strips. This in turn proportionately increases both translational force component $F_T$ and radial force component $F_R$. FIG. 13A shows the relative increase of translational force component $F_T$ with a electrode overlap $\phi$ of 2.5 degrees compared to translational force component $F_T$ in FIG. 11A where the electrode overlap $\phi$ is equal to zero. Similarly, FIG. 13B shows the relative increase of radial force component $F_R$ compared to that in FIG. 11A. Likewise, FIG. 13C shows the relative increase in the rotational acceleration compared to that in FIG. 11B.

FIGS. 14A-D shows various embodiments, which minimize the magnitude of radial force component $F_R$, since $F_R$ does not contribute to the rotation of rotor assembly 102 and it puts added stress on rotor assembly 102, especially to rotatable connectors 152-1 and 152-2. Cross-sectional profiles of rotor/stator electrode strip pairs are shown, where the geometric factors decrease radial force component $F_R$ and increase translational force component $F_T$.

Figure 14A:
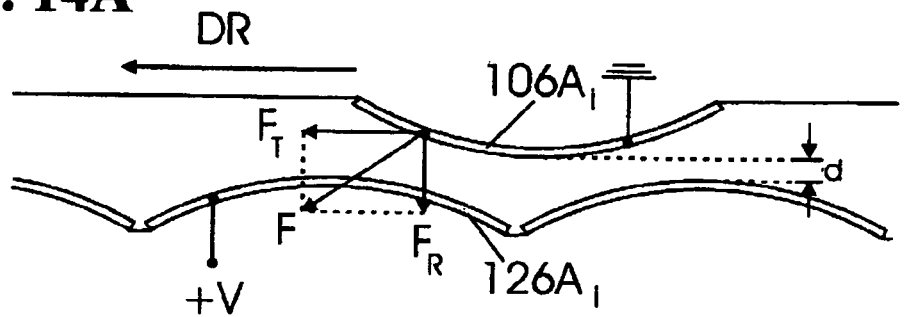
FIGS. 14A-D show various cross-sectional views of various rotor/stator electrode strip profiles which converts radial force component to translational force component.

FIG. 14A shows rotor/stator electrode pairs with partially cylindrical cross-sections.

Figure 14B:
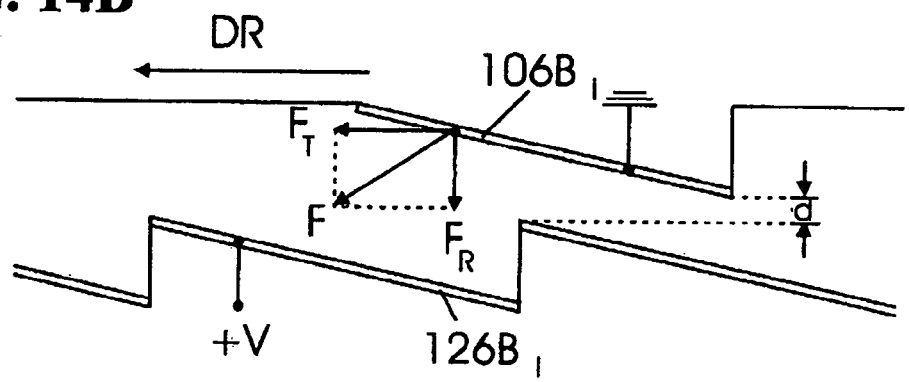

FIG. 14B shows rotor/stator electrode pairs forming a ratchet with beveled cross-sections.

Figure 14C:
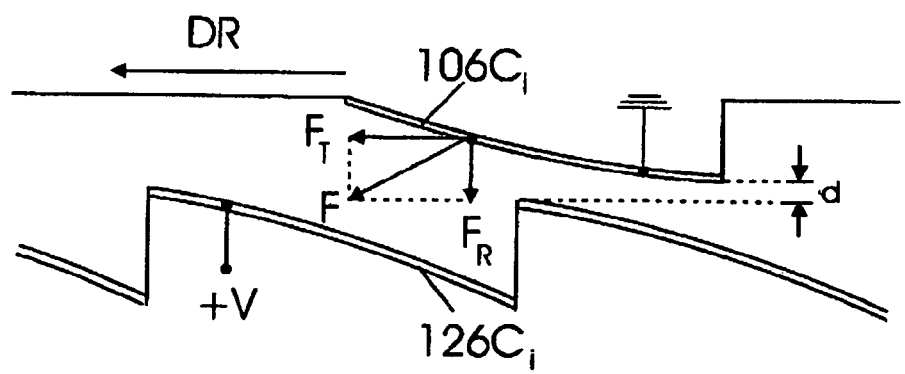

FIG. 14C shows rotor/stator electrode pairs forming a ratchet with partially cylindrical cross-sections.

Figure 14D:
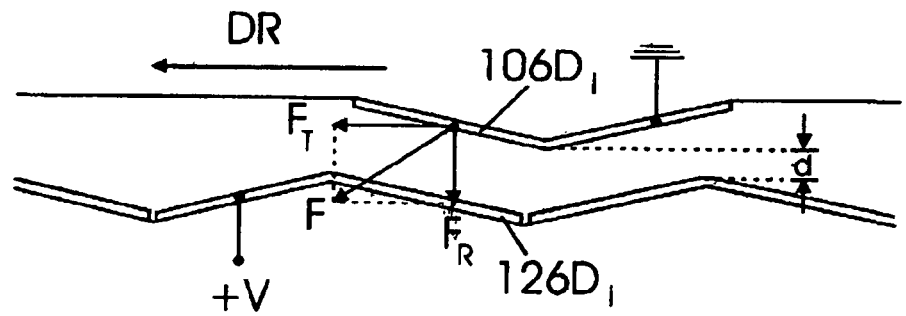

FIG. 14D shows rotor/stator electrode pairs forming a ratchet, within each strip two sub-strips at an angle.

The above embodiments have a higher exposed surface area between rotor/stator electrode strip pairs thereby generating a higher translational force component $F_T$. FIGS. 14B and C are optimized for rotation in one direction with a torsion hinge restoring force providing the force needed in the opposite direction.

There are a number of other factors related to rotational acceleration that reduce the negative impact of the radial force component $F_R$. Some embodiments maximize translational acceleration by switching the voltage from one rotor/stator electrode strip pair to the next when translational force component $F_T$ is maximum (i.e. at $t=T_A$ in FIGS. 11A and 11B). These embodiments avoid the time interval, when the radial force component $F_R$ is the biggest.

In operation, the magnitude of radial force component $F_R$ has a periodic high frequency component, generated by the periodicity of the acceleration. This high frequency component increases with increasing acceleration. Since rotatable connectors 152 have a high tensile strength against the radial component, their mechanical response is inherently slow to the high frequency components. Therefore, rotatable connectors 152 act as low pass filters, suppressing the high frequency component of $F_R$. This in effect reduces the magnitude of radial component $F_R$.

The effect on translational component $F_T$ depends on the type of rotatable connector used. If rotatable connectors 152 are needle point hinges with virtually no friction in the translational direction, their response time is very quick, thereby having little effect on translational force component $F_T$. If rotatable connectors 152 are torsion hinges, the response to translational component $F_T$ depends on the rotation direction and angle of rotor assembly 102. The further the rotation angle of rotor assembly 102 is from the torsion hinge neutral position while rotating away from this neutral position, the less responsive rotor assembly 102 is to translational force component $F_T$ because the torsional restoring force opposes $F_T$. However, the further the rotation angle of rotor assembly 102 is from the torsion hinge neutral position while rotating towards the neutral position, the more responsive rotor assembly 102 will be to translation force component $F_T$, because the torsional restoring force helps $F_T$.

During latching, when radial force component $F_R$ is greatest, the impact of the radial force component can be reduced by reducing the number of activated rotor/stator electrode strip pairs. In general a single rotor/stator electrode strip pair is sufficient to lock rotor assembly 102 at a predetermined tilt angle θ. Compared to existing designs, radial force component $F_R$ has significantly less impact on system performance.

FIG. 15A shows a side view of a single activated rotor/stator electrode strip pair, which is translated with electrode interval rotation δθ. Rotor-electrode strips 106 have a rotor angular extent $E_r$ and stator-electrode strips 126 have a stator angular extent $E_s$.

FIG. 15B shows a side view of multiple simultaneously activated rotor/stator electrode strip pairs. In the embodiment there are k rotor/stator electrode pairs labeled $EP_1$ to $EP_k$ with constant electrode pair pitch $P_{ep}$. Here k represents the number of simultaneously activated rotor/stator electrode strip pairs. Embodiments, which have the electrode strips divided into k parts are efficient because the electrostatic force is increased.

The rotor/stator electrode strip pair consist of stator-electrode strip $126_i$ and rotor-electrode strip $106_i$, translated with electrode interval rotation φ. Stator-electrode strips 126 are connected to the +V voltage line and have an angular extent $E_s/k$. Rotor-electrode strips 106 are connected to ground and have an angular extent $E_r/k$. When a +V voltage is applied to the +V voltage line, all rotor/stator electrode strip pairs $EP_1 \ldots EP_k$ are simultaneously activated, thereby generating an accumulated electrostatic force $F_A$ which is given by:

$$F_A = F_1 + F_2 + \ldots + F_{k-1} + F_k = kF \quad (7A)$$

where k is an integer that is equal to or greater than 2 and $$F_1 = F_2 = \ldots = F_{k-1} = F_k = F. \quad (7B)$$

The accumulated electrostatic force $F_A$ is the sum of electrostatic forces $F_i$ from each activated rotor/stator electrode strip pair. Depending on the value of k, this can significantly increase the overall electrostatic force compared to the electrostatic force F of FIG. 15A. Likewise, the accumulated translational force component $F_{AT}$ is given by:

$$F_{AT} = F_{T_1} + F_{T_2} + \ldots + F_{T_{k-1}} + F_{T_k} = kF_T \quad (8A)$$

where $$F_{T_1} = F_{T_2} = \ldots = F_{T_{k-1}} = F_{T_k} = F_T \quad (8B)$$

Accumulated translational force component $F_{AT}$ is the sum of translational force components $F_{T_i}$ from each electrostatic force $F_i$. Accumulated translational force component $F_{AT}$ and thereby the associated rotational acceleration can be significantly increased compared to that of FIG. 15A. In the same way the accumulated radial force component $F_{AR}$ is given by:

$$F_{AR} = F_{R_1} + F_{R_2} + \ldots + F_{R_{k-1}} + F_{R_k} = kF_R \quad (9A)$$

where $$F_{R_1} = F_{R_2} = \ldots = F_{R_{k-1}} = F_{R_k} = F_R. \quad (9B)$$

Accumulated radial force components $F_{AR}$ is the linear contribution of radial force components $F_{R_i}$ from each electrostatic force $F_i$, increasing the stress on rotor assembly 102 and rotatable connectors 152. In some embodiments the impact of the added stress is lowered by the designs outlined above.

In embodiments this accumulated electrostatic force results in bigger acceleration, or a lower operating voltage V, or a combination of the two. These embodiments also have higher complexity (i.e. bigger number of rotor/stator electrode strips and the control thereof) and higher switching rate with smaller switch rotational intervals $\Delta\theta_i$.

Figure 16A:
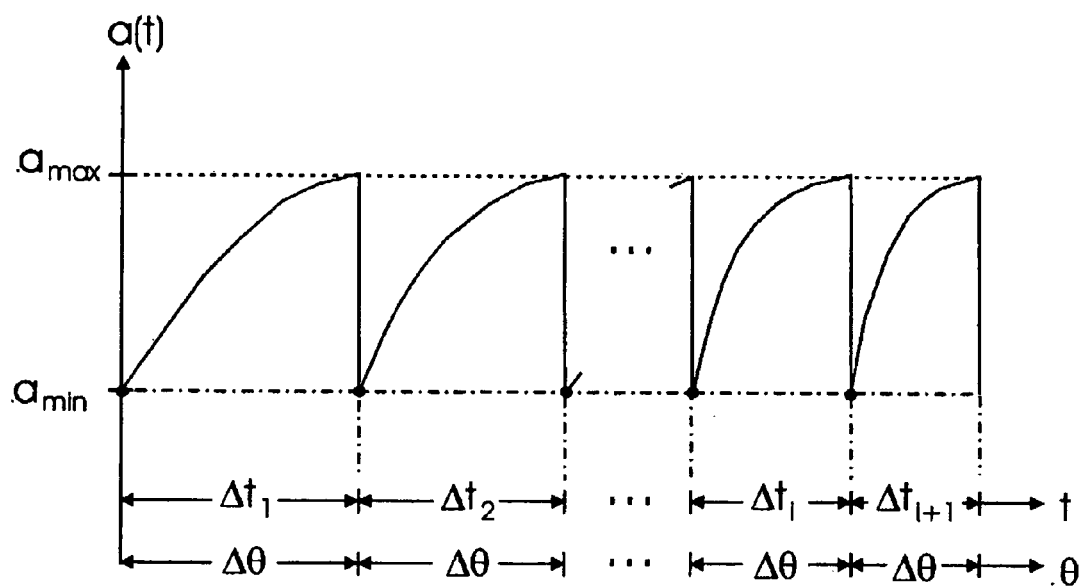
FIG. 16A shows a graph of the rotor assembly rotational acceleration over each switching interval for optimal acceleration.

FIG. 16A shows the time dependence of rotational acceleration a(t) of rotor assembly 102 over multiple switching intervals Δθ. The rotational acceleration a(t) is increased by switching activated rotor/stator electrode pairs, when rotational acceleration a(t) reaches its maximum $\alpha_{max}$. The rotational acceleration a(t) starts at $\alpha_{min_1}$ and increases until it reaches a maximum acceleration $\alpha_{max}$. During this interval rotor assembly 102 rotated by switching interval Δθ during a switching time $\Delta t_1$. By switching rotor/stator electrode pairs, the cycle of operation starts again. In the shown embodiment, the activation of rotor/stator electrodes is switched in the time instance, when the acceleration is maximal, corresponding to $T_A$ in FIG. 11B. In other embodiments, the switching is performed, when the acceleration is zero, i.e. $T_B$ in FIG. 11B. In yet other embodiments, the switching is performed when the acceleration from the i-th stator electrode equals the acceleration from the adjacent stator electrode.

Figure 16B:
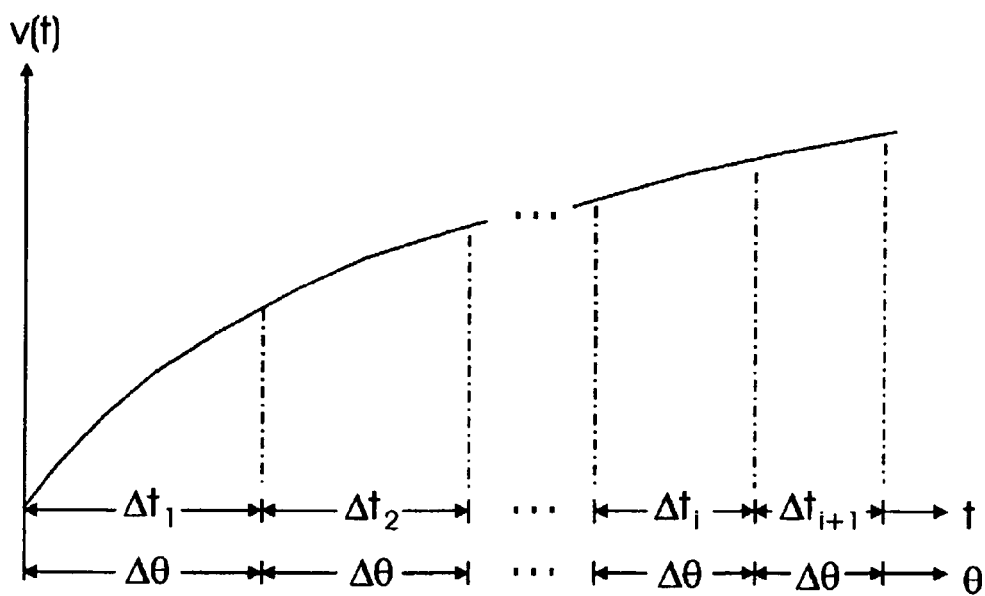
FIG. 16B shows the corresponding velocity graph of FIG. 16A.

FIG. 16B shows the time dependence of the velocity, corresponding to the acceleration curve of FIG. 16A. It can be seen that the velocity of rotor 102 increases with each subsequent interval. This is the reason, why the subsequent switching times are shorter and shorter.

Selecting a rotation resolution involves a design trade-off between rotor assembly 102 acceleration and system complexity. A high rotation resolution provides a relatively larger initial rotational acceleration, lower final rotational acceleration and a larger number of rotor/stator electrode strip pairs and connections thereto. This implies a smaller rotor pitch $P_r$, a smaller stator pitch $P_s$ and a higher resolution of control over the actuator's performance parameters such as actuation time. A low rotation resolution provides a slower initial rotational acceleration, a higher final rotational acceleration and a smaller number of rotor/stator electrode strips.

Electrostatic force F exerted on rotor assembly 102 has a strong influence over its dynamic and mechanical properties such as its resonance frequency f and quality factor Q. This influence is exerted at all times overriding the rotor assembly's natural mechanical characteristics. Therefore, embodiments are very robust, resilient to external mechanical influences, such as vibrations etc. For example, a knock on the device will not cause rotor assembly 102 to vibrate excessively. A hollow light-weight rotor assembly 102 can enhance its responsiveness to the influence of electrostatic forces.

At high rotational acceleration, a significant drag is generated between rotor cylindrical surface 104 and stator cylindrical surface 124. This drag can be reduced by embedding rotor-electrode strip array 106 into rotor cylindrical surface 104, and stator-electrode strip array 126 into stator cylindrical surface 124. Drag can also be reduced by operate actuator 100 in a vacuum. Reducing drag reduces wear and increases operating speed.

Next, various configurations and timing sequences are characterized.

Table 1 lists some of the relevant design parameters. Their relationships are defined by Equations 10-12.

TABLE 1

| Parameter | Units | Parameter Name |
|---|---|---|
| N | | # rotor-electrode strips |
| $P_r$ | deg. | rotor angular pitch |
| $E_r$ | deg. | rotor angular extent |
| M | | # stator-electrode strips |
| $P_s$ | deg. | stator angular pitch |
| $E_s$ | deg. | stator angular extent |
| $\zeta$ | deg. | stator-electrode spacing |
| $P_{rs}$ | | pitch ratio |
| $P_{ep}$ | deg. | electrode pair pitch |
| $EP_{rs}$ | | extent pitch ratio |
| $\Delta\theta$ | deg. | switching rotational interval |

In the above table the pitch ratio $P_{rs}$ is given by:

$$P_{rs}=P_r/P_s \qquad (10a)$$

and the extent pitch ratio $EP_{rs}$ is defined as $$EP_{rs}=E_r/P_s. \qquad (10b)$$

Rotational interval $\Delta\theta$ is given by:

$$\Delta\theta=SI\,P_s \qquad (11)$$

Here SI is the predetermined ratio of the switching rotational interval and the stator pitch. For example, for SI=1.0, implies that the switching between rotor/stator strip pairs occurs at the instance deceleration begins, precisely when the rotor and stator electrodes completely overlaps. Switch phase PH is defined as the number of stator-electrode strip groups $166\text{-}i$ where $i=1\ldots$ PH and is given by:

$$PH=P_{ep}/P_s \qquad (12)$$

In some embodiments the electrodes of the activated rotor/stator electrode pair are separated from each other such that the electrostatic fringe force between rotor/stator electrode strip pairs are negligible.

The rotation resolution, or rotation angle $\Delta\theta$, defines the discrete rotational intervals/angles of rotor assembly 102. The smaller the rotational resolution $\Delta\theta$, the higher the number of discrete rotation angles. The maximum number of discrete rotation angles is dependent on the number of rotor/stator electrode pairs contained within the overlap between rotor-electrode strip array 106 and stator-electrode strip array 126. The precision of the rotation resolution depends on the precision of the rotor/stator electrode strip manufacturing process. For example, a photolithography manufacturing process is highly precise with micro-scale precision, thereby capable of providing rotational resolution precision in the range of 0.1 to 10 micro-radians. Another factor that influences the rotational resolution is the radius of rotor assembly 102. The bigger the radius, the higher the resolution. Unlike some other micro-actuators, in embodiments both the rotation resolution and rotation angle are independent of activation voltage V. This independence from voltage fluctuation in the voltage source increases the rotation angle repeatability of actuator 100. This is important for applications such as optical switching, where the slightest misalignment between an input and output fiber can cause unacceptable signal loss.

FIGS. 17A-D show an exploded side view of a three-phase configuration using a stepper timing sequence, or electrode activation sequence method. Stator-electrode strips $126_i\ldots 126_{i+6}$ are shown with stator angular pitch $P_s$. Rotor-electrode strips $106_i\ldots 106_{i+2}$ are shown with rotor angular pitch $P_r=3P_s$. Therefore, in this embodiment $P_{rs}=3$. Rotor-electrode strip array 106 is hardwired to a ground. Stator-electrode strip array 126 is divided into three groups of stator-electrode strips. Every third stator-electrode strip belongs to the same group, making the three groups interleaved.

At some time instance t, members of the first stator-electrode strip group $126_i$, $126_{i+3}$, $126_{i+6}$ are connected to the +V voltage potential, to which a voltage $V_1$ is applied. This activates rotor/stator electrode pairs $106_i/126_i$, $106_{i+1}/126_{i+3}$ and $106_{i+2}/126_{i+6}$ as indicated by the connecting arrows. The applied voltage generates an electrostatic force, attracting rotor-electrode strips $106_i$ to move towards the activated stator-electrode strips, making rotor assembly 102 to rotate in the direction of rotation DR. Rotor assembly 102 will continue to rotate uninhibited until the selected rotor/stator electrode pairs align themselves centered with each other as indicated by double vertical arrows pointing down in FIG. 17B.

Figure 17A:
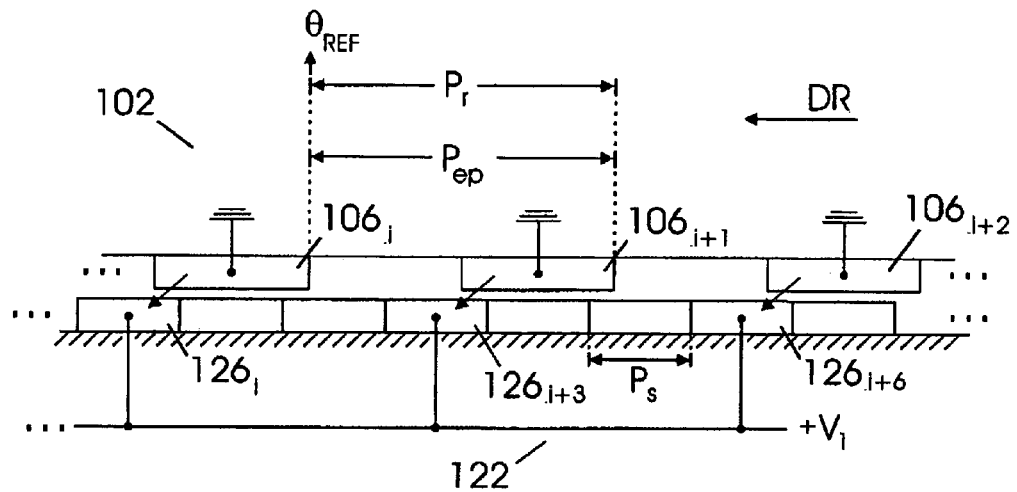
FIGS. 17A-D show an exploded side view of a three-phase configuration using a stepper electrode activation sequence method.
Figure 17B:
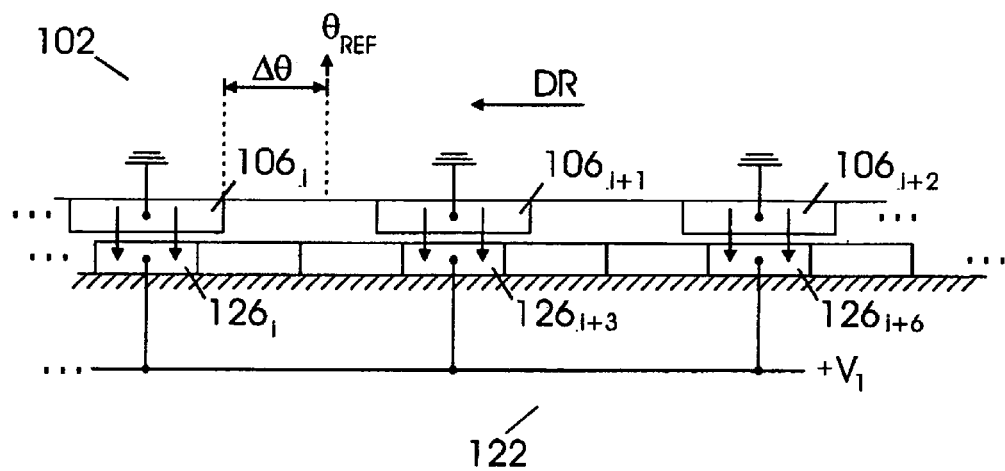
Figure 17C:
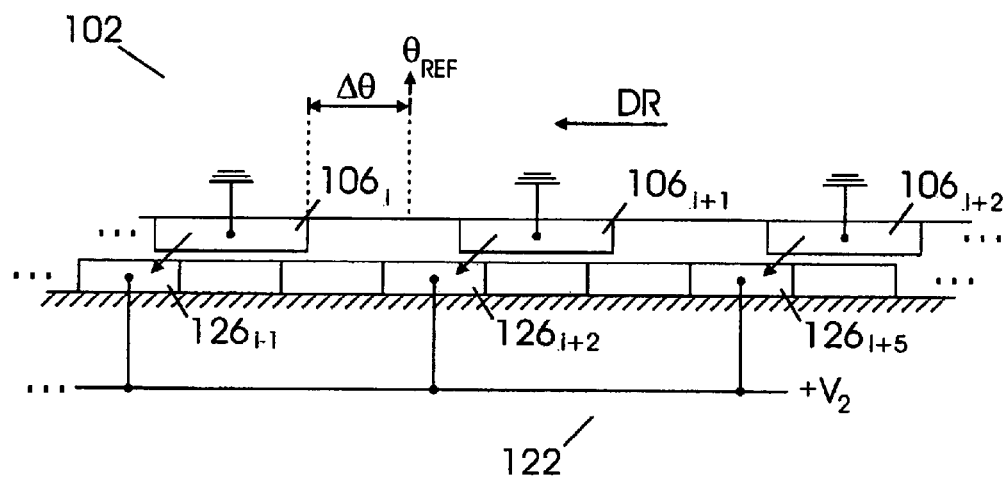
Figure 17D:
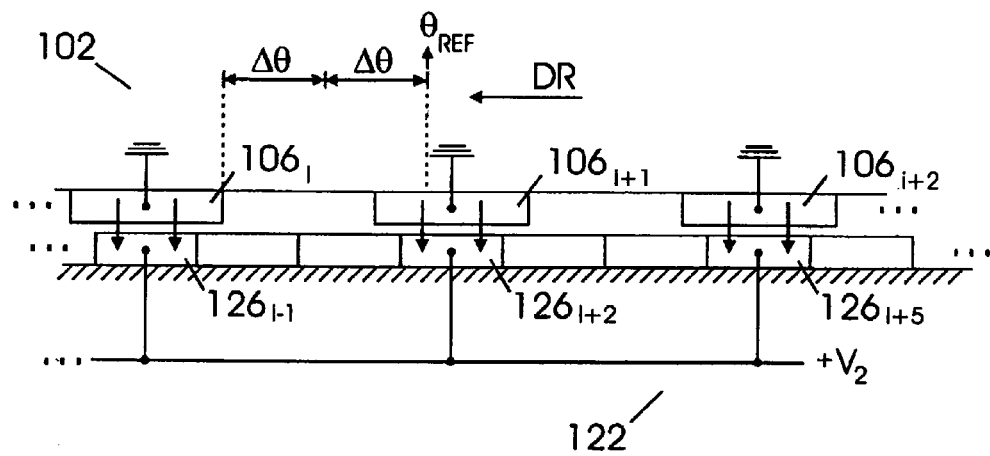

The electrostatic forces were discussed in detail in relation to FIGS. 10A-10C and FIGS. 11A and 11B. As discussed in relation to FIG. 11B, rotor assembly 102 accelerates until it reaches maximum rotational acceleration at time $T_{max}$. In some embodiments, voltage $V_1$ is disconnected from the first group of stator-electrode strips and a voltage $V_2$ is applied to a second group of rotor/stator electrode pairs $106_i/126_{i-1}$, $106_{i+1}/126_{i+2}$ and $106_{i+2}/126_{i+5}$ as shown in FIG. 17C. In some embodiments $V_1$ is equal to $V_2$, in others it is different. FIGS. 17C and D show that in this subsequent rotational interval $\Delta\theta$ the same acceleration and switching occurs as in the previous rotational interval. This process is repeated a third time for voltage $V_3$ (not shown), completing the cycle. When rotor 102 is rotated over a large angle, then the cycle is repeated several times by applying the voltages $V_1$, $V_2$, $V_3$, achieving a fast acceleration and high operating speed. When the preselected angle is achieved, rotor 102 is stopped as described above. The described method can also rotate rotor 102 to rotate incrementally in a step-wise fashion, if rotor 102 is stopped repeatedly when overlapping stator-electrode strips. One feature of this three step embodiment is that the stator-electrode strip $126_{i-1}$ is close to the rotor-electrode strip $106_i$ it exerts an electrostatic force on, but well separated from the other rotor-electrode strips, e.g. $106_{i+1}$, thus minimizing interference. The design parameter relationships are listed in Table 2 below:

TABLE 2

| Parameter | Value | Parameter Name |
|---|---|---|
| $P_{rs}$ | 3.0 | pitch ratio |
| $\Delta\theta$ | $=P_s$ | rotational interval |
| PH | 3 | switch phase |

Figure 18A:
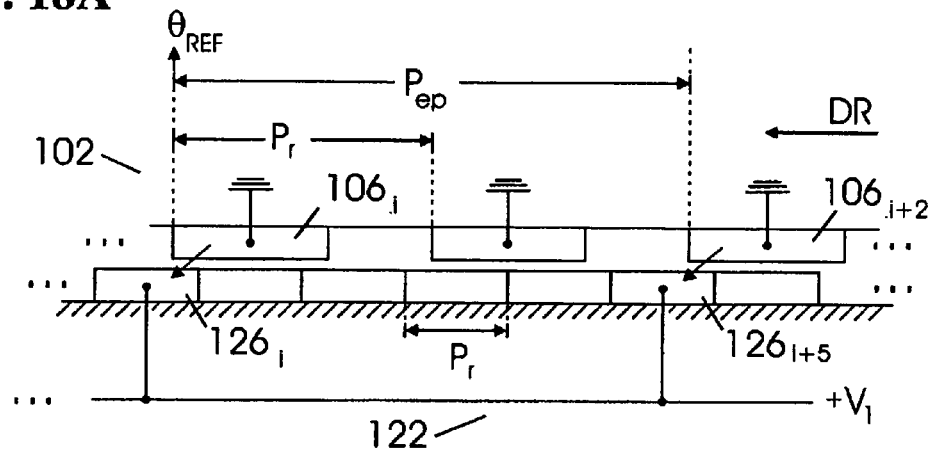
FIGS. 18A-C show an exploded side view of a five-phase configuration using an optimized acceleration electrode activation sequence method.
Figure 18B:
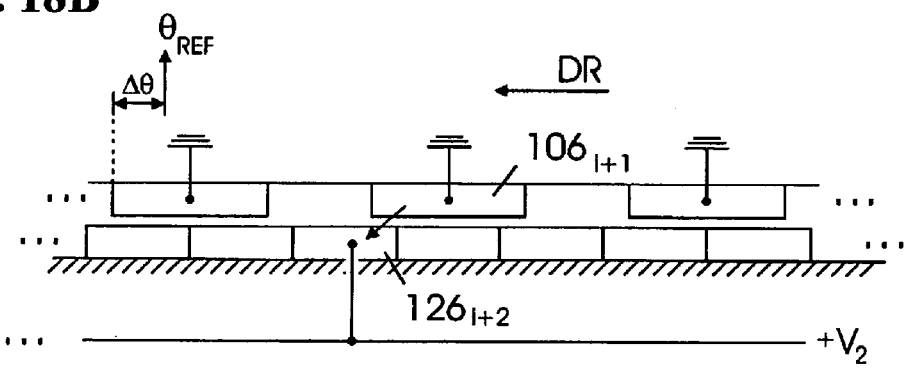
Figure 18C:
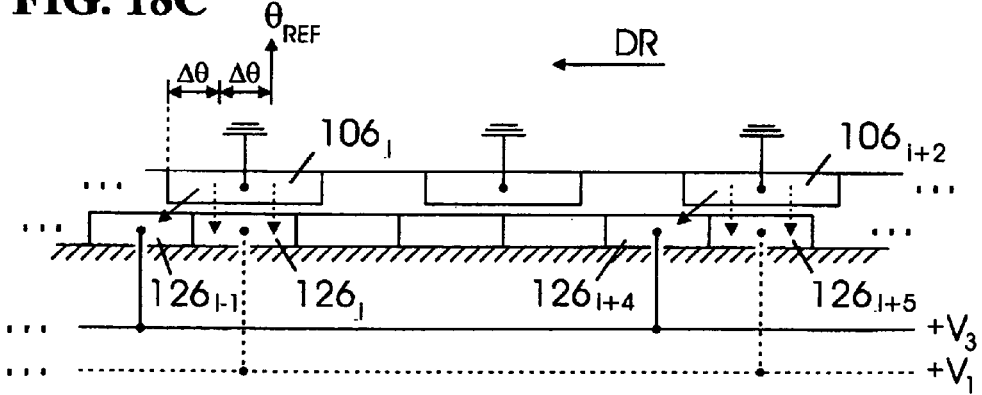

FIGS. 18A-C show an exploded side view of a five-phase configuration using an electrode activation sequence method with improved acceleration. Again, rotor 102 reaches maximum rotational acceleration at time $T_{max}$ (see FIG. 11B) from the electrostatic force of the rotor/stator electrode pair $106_i/126_i$, then switch to a new rotor/stator electrode strip pair $106_{i+1}/126_{i+2}$. This timing sequence enables rotor assembly 102 to increase its rotational acceleration with each rotational interval $\Delta\theta$.

FIG. 18A shows that stator-electrode array 126 includes five sub-stator-electrode groups. Each fifth electrode belongs to the same group and these five groups are arranged in an interleaved manner. Rotor-electrode array 106 includes two sub-rotor-electrode groups. The even and the odd numbered electrodes belong to the same group and these two groups are arranged in an interleaved manner. Thus, in this embodiment the rotor angular pitch $P_r=2.5\ P_s$ and thus $P_{rs}=2.5$. As shown in FIG. 18A, at some time t even number rotor-electrode strips ($106_i$, $106_{i+2}$, etc.) are aligned with every 5$^{th}$ stator-electrode strip and all odd number rotor-electrode strips ($106_{i+1}$, $106_{i+3}$, etc.) split two stator-electrode strips. Rotor-electrode strips $106_i$ are hardwired to a ground. Selected stator-electrode strips are connected to the $+V_1$ voltage potential such that activated rotor/stator electrode pairs are formed alternately with odd number rotor-electrode strips in one timing interval and then with even numbered rotor-electrode strips in a subsequent interval. The electrode pair pitch $P_{ep}$ equals 2 $P_r$. In FIG. 18A, $+V_1$ activates rotor/stator electrode strip pairs: $106_i/126_i$ and $106_{i+3}/126_{i+5}$ as indicated by the connecting arrows. This causes rotor-electrode strips to move towards their corresponding activated stator-electrode strips thereby causing rotor assembly 102 to rotate in the direction of rotation DR.

FIG. 18B shows that rotor assembly 102 rotates until the maximum rotational acceleration $T_{max}$ (see FIG. 11B) is reached, at which time $V_1$ is disconnected and the next set of rotor/stator electrode strip pairs are activated. The next activated rotor/stator electrode strip pairs $106_{i+1}/126_{i+2}$ are indicated by solid connecting arrows. A voltage $V_2$ is applied to +V voltage line 122. By this time, rotor assembly 102 rotated over switching rotational interval $\Delta\theta$ from reference angle $\theta_{REF}$. $\Delta\theta$ equals half the stator angular pitch $P_s$.

FIG. 18C shows the time instance, when the current rotor/stator electrode strip pairs are deactivated via disconnection of voltage potential $+V_2$ and the next set of rotor/stator electrode strip pairs $106_i/126_{i-1}$ and $106_{i+2}/126_{i+4}$ are activated by the application of voltage $V_3$. At this time rotor assembly has rotated an additional rotational interval $\Delta\theta$.

Rotor assembly 102 can be latched at this position by applying a voltage $V_1$, selected to latch rotor/stator electrode strip pairs $106_i/126_i$ and $106_{i+2}/126_{i+5}$ as indicated by the dashed double vertical arrows. The design parameters and their relationships are listed in Table 3 below:

TABLE 3

| Parameter | Value | Parameter Name |
|---|---|---|
| $P_{rs}$ | 2.5 | pitch ratio |
| $P_{ep}$ | $=2\ P_r$ | electrode pair pitch |
| $\Delta\theta$ | $=0.5\ P_s$ | rotational interval |
| PH | $=5$ | switch phase |

Figure 19B:
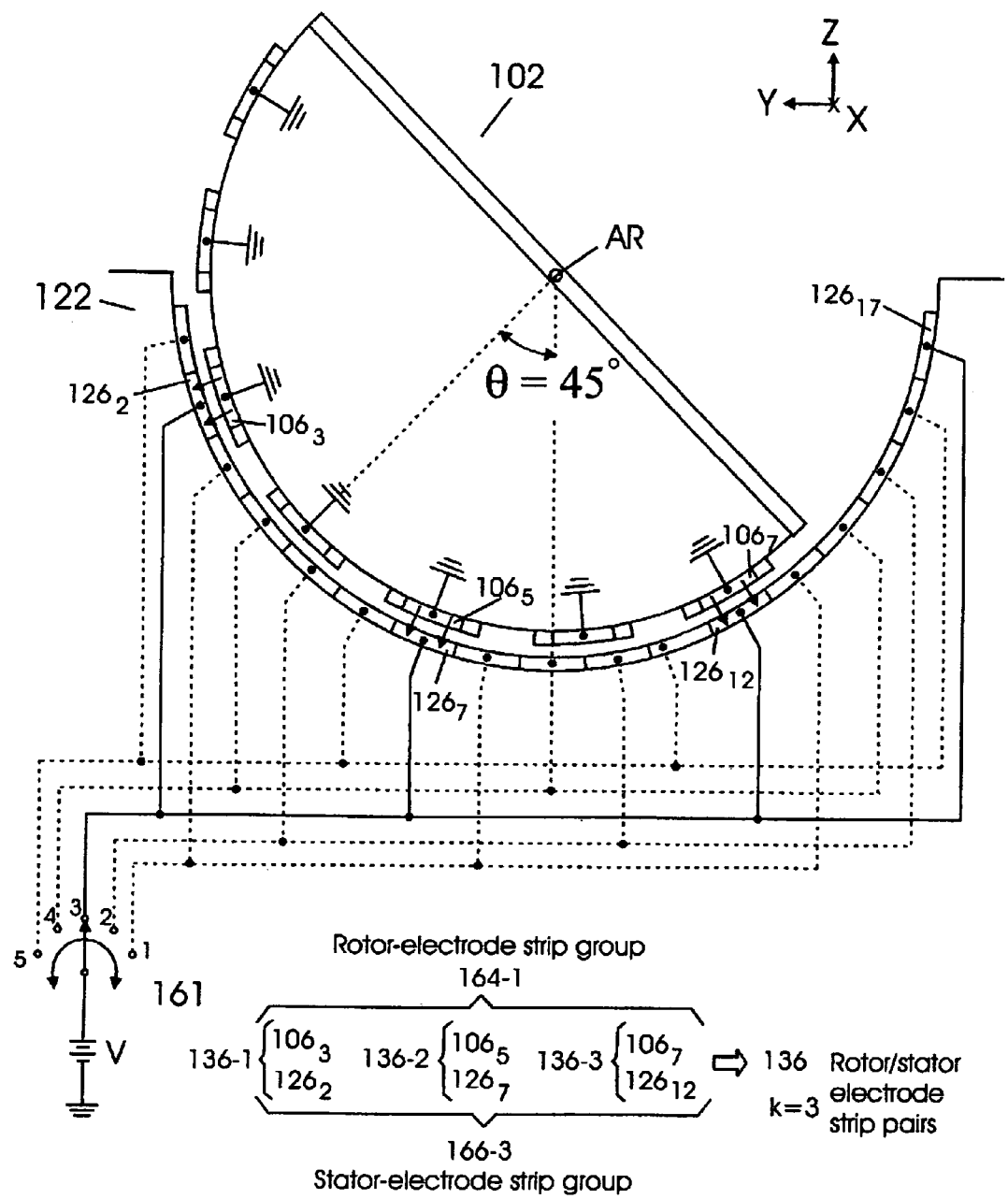
Figure 19C:
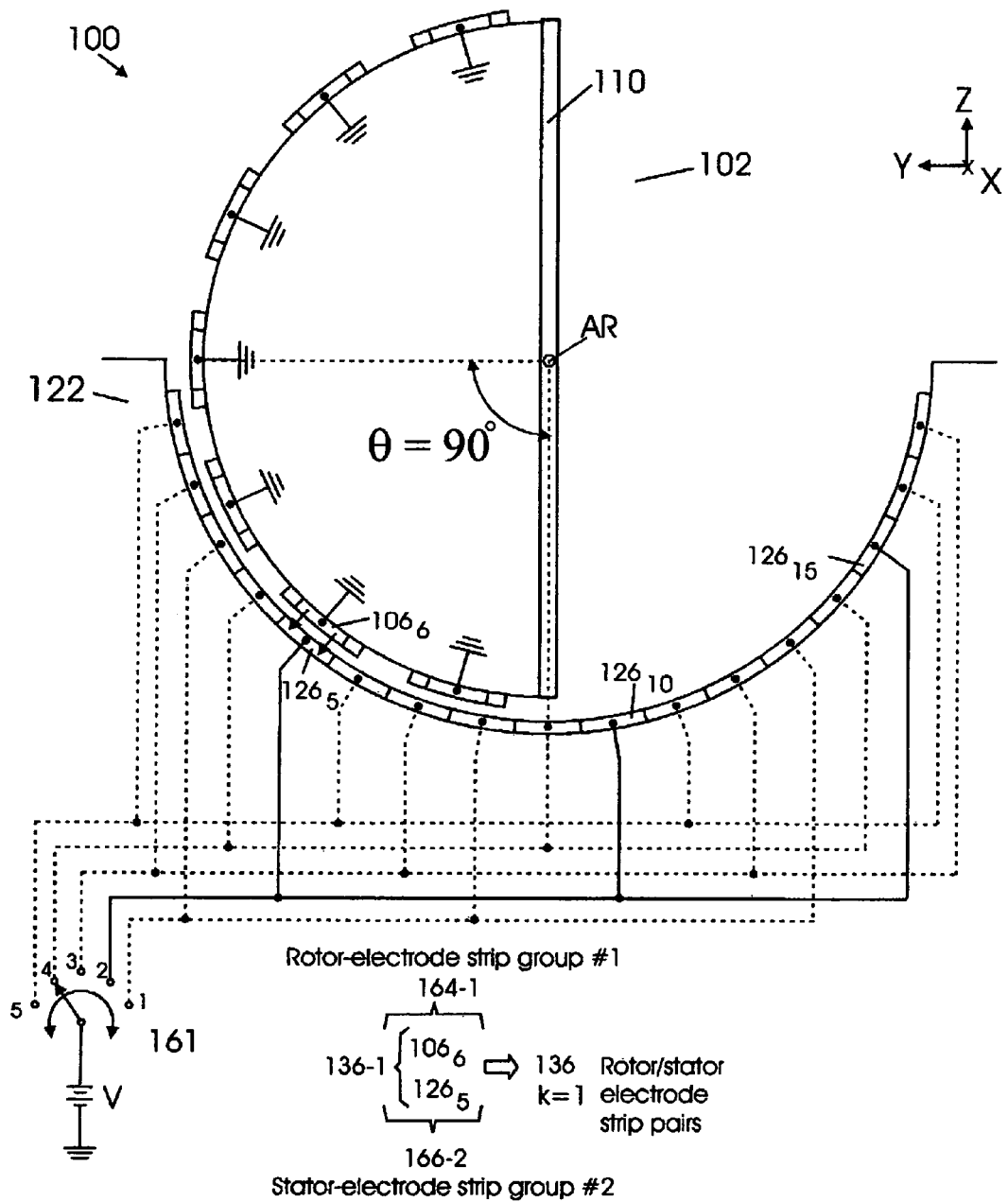

FIGS. 19A-C shows a full side view of the five step embodiment of FIGS. 18A-C with rotor assembly 102 latched at various tilt angles $\theta$. +V voltage lines 122 of FIGS. 18A-C have been replaced by a 5-phase stator switch controller 161 and corresponding 5 voltage lines, which serve as the voltage lines of the 5 groups of stator-electrode strips. In this embodiment there are 7 rotor-electrode strips labeled $106_1 \ldots 106_7$ with rotor angular pitch $P_r=25$ degrees and rotor angular extent $E_r=15$ degrees. There are 17 stator-electrode strips with stator angular pitch $P_s=10$ degrees and stator angular extent $E_s=10$ degrees. The design parameter values of the embodiment of FIGS. 19A-C are listed in Table 4 below:

TABLE 4

| Parameter | Value | Parameter Name |
|---|---|---|
| n | 7 | number of rotor-electrode strips |
| m | 17 | number of stator-electrode strips |
| $P_r$ | 25 deg. | rotor angular pitch |
| $P_s$ | 10 deg. | stator angular pitch |
| $P_{rs}$ | 2.5 | pitch ratio |
| $P_{ep}$ | 50 deg. | electrode pair pitch |
| $E_r$ | 15 deg. | rotor angular extent |
| $E_s$ | <10 deg. | stator angular extent |
| $EP_{rs}$ | 1.5 | extent pitch ratio |
| $\phi$ | 2.5 deg. | electrode overlap extent |
| $\Delta\theta$ | 5 deg. | switching rotational interval |

FIG. 19A shows rotor assembly 102 latched at tilt angle $\theta=0$ degrees. Stator switch 160 is switched to voltage line 4 which corresponds to stator-electrode strip group 166-4 consisting of stator-electrode strips $126_4$, $126_9$, and $126_{14}$. Rotor-electrode strips $106_1 \ldots 106_7$ are hardwired to ground via rotatable connectors 152-1 and 152-2 (not shown). Activated rotor/stator electrode strip pairs 136-1 . . . 136-3 are listed in a table below in FIG. 19A. k, the number of activated rotor/stator electrode strip pairs equals 3.

FIG. 19B shows rotor assembly 102 latched at tilt angle $\theta=+45$ degrees. Stator switch 160 is switched to voltage line 3, which corresponds to stator-electrode strip group 166-3, consisting of stator-electrode strips $126_2$, $126_7$, $126_{12}$ and $126_{17}$. Stator-electrode strip $126_{17}$ does not have an associated rotor-electrode strip to match-up with, thereby it does not contribute to the latching of rotor assembly 102. Activated rotor/stator electrode strip pairs 136-1 . . . 136-3 are listed in a table below in FIG. 19B. With $\Delta\theta=5$ degrees, it takes 9 switching intervals to rotate rotor assembly 102 to a tilt angle $\theta=+45$ degrees.

FIG. 19C shows rotor assembly 102 latched at tilt angle $\theta=+90$ degrees. Stator switch 160 is switched to voltage line 2 which corresponds to stator-electrode strip group 166-2, consisting of stator-electrode strips $126_5$, $126_{10}$ and $126_{15}$.

Stator-electrode strips $126_{10}$ and $126_{15}$ do not have a matching rotor-electrode pair and thereby do not contribute to the latching of rotor assembly 102. This leaves only a single activated rotor/stator electrode pair 136-1 which is listed in a table below in FIG. 19C where k=1, compared to k=3 in FIG. 19A with a tilt angle θ=0 degrees. It takes 18 switching intervals from θ=0 degrees to rotate rotor assembly 102 to a tilt angle θ=+90 degrees. The rotation range of rotor assembly 102 is limited by the overlap of rotor-electrode strip array 106 and stator-electrode strip array 126 in both directions (i.e. ±90 degrees). This embodiment has a total effective rotation range of ±90 degrees for a total aggregate rotation range of 180 degrees. Unlike some existing micro-actuators, the rotation range is independent of activation voltage V. In addition, the control of the rotation is stable over the complete rotational range regardless of the size of the rotational range.

Figure 20A:
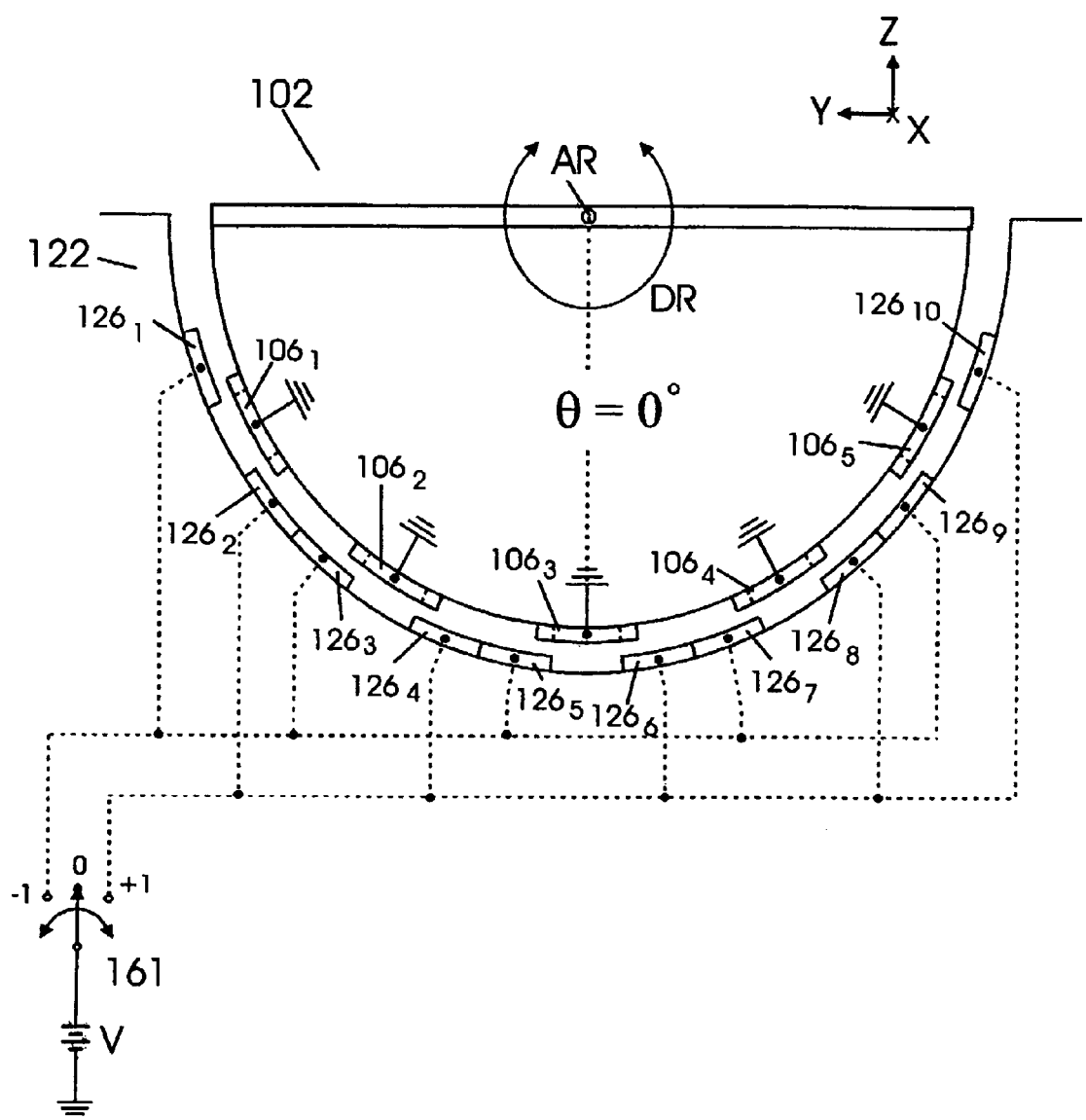
Figure 20B:
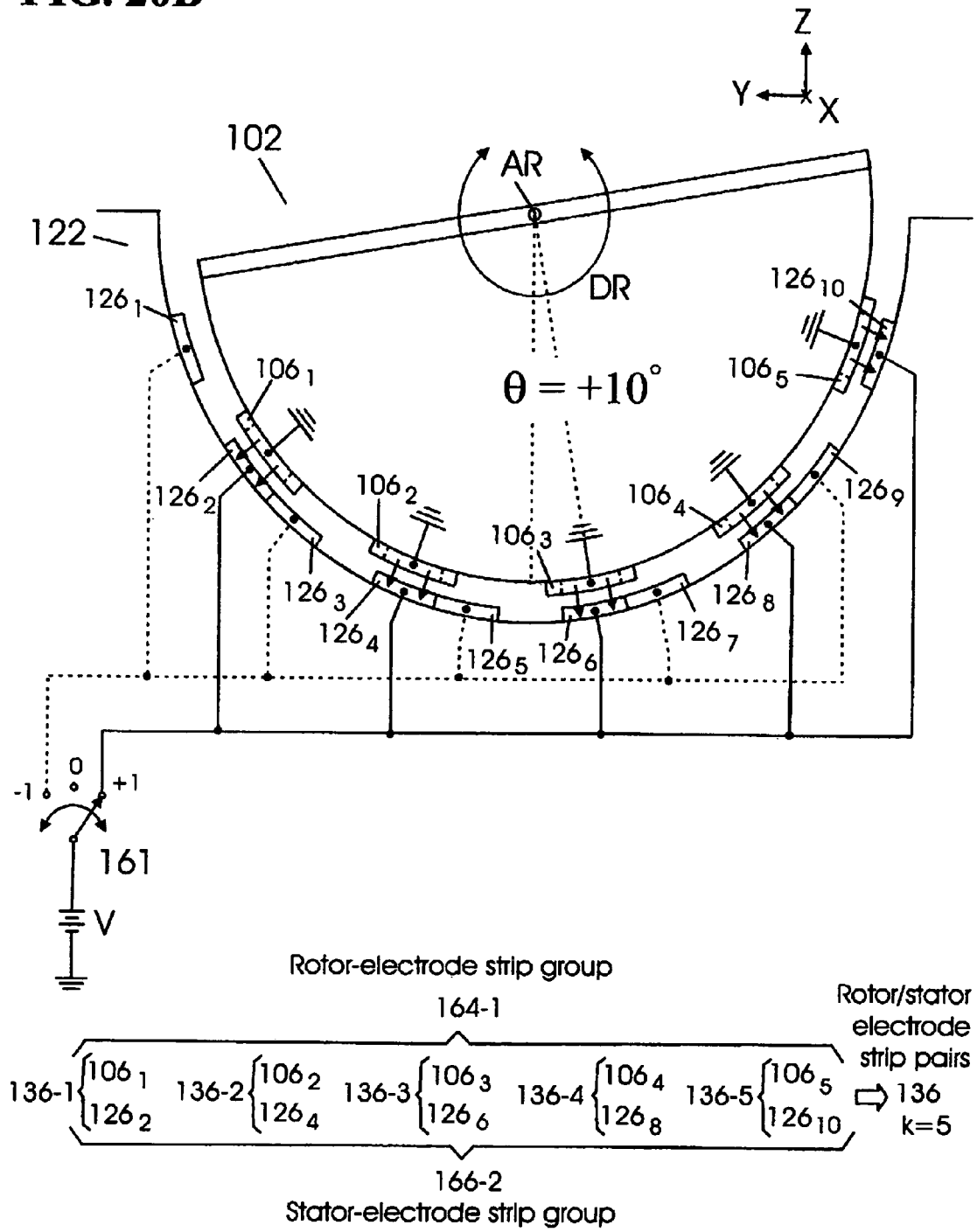

FIGS. 20A-C shows a side view of a small rotation angle configuration optimized for three rotational states: 0 and ±Δθ degrees. In some embodiments rotatable connectors 152 are torsion hinges. When switching from one extreme position ±Δθ through 0 degrees to the other extreme position ∓Δθ, the restoring force of the torsion hinges assist the electrostatic force up to the 0 degree position and oppose when moving away from the 0 degree position. In the present embodiment Δθ equals 10 degrees. FIG. 20A shows rotor assembly 102 in the neutral unbiased state with 0 degree tilt angle corresponding to the neutral unbiased state of torsion hinge rotable connectors 154. Rotor-electrode strips $106_1 \ldots 106_5$ are hardwired to ground via rotatable connectors 154. A two position stator switch 160 is connected to two stator-electrode strip groups 166-1 and 166-2. When no voltage is applied, the restoring force of the torsion hinges returns or keeps rotor assembly 102 to the neutral 0 degree position.

FIG. 20B and FIG. 20C show rotor 102 rotated +10 and −10 degrees respectively. In FIG. 20B, stator switch 160 is switched to +10 degrees, which selects stator-electrode strip group 166-2. Applying a voltage to the selected stator-electrode strip group 166-2 causes rotor assembly 102 to rotate in the counter clockwise direction +10 degrees, where the activated stator-electrode strips latch with their associated rotor-electrode strips $106_i$. The table in FIG. 20B lists the five rotor/stator electrode strip pairs that are activated and latched.

FIG. 20C shows rotor assembly 102 latched at −10 degrees, when stator switch 160 is switched to the −10 degree position selecting stator-electrode strip group 166-2. The table in FIG. 20C lists the rotor/stator electrode strip pairs that are activated and latched. During the switching of rotor assembly 102 from the −10 degree position to the +10 degree position the restoring force of the torsion hinges initially works with the electrostatic force, then opposes it. The same is true for rotations in the opposite direction from +10 degrees to −10 degrees. This is part of the reason that this embodiment has a very fast actuation time, which can be in the 0.1 to 10 microseconds range. Further reasons include the small rotation angle and high torque because of the high k value. The design parameter relationships are listed in Table 5 below and the design parameter values of FIG. 20 are listed in Table 6 below.

TABLE 5

| Parameter | Value | Parameter Name |
|---|---|---|
| $P_{rs}$ | 3.0 | pitch ratio |
| Δθ | =2 $P_s$ | rotational interval (+− rotation angle) |
| PH | 3 | switch phase |

TABLE 6

| Parameter | Value | Parameter Name |
|---|---|---|
| N | 5 | number of rotor-electrode strips |
| M | 10 | number of stator-electrode strips |
| $P_r$ | 30 deg. | rotor angular pitch |
| $P_s$ | 10 deg. | stator angular pitch |
| $P_{ep}$ | 30 deg. | electrode pair pitch |
| $E_r$ | 15 deg. | rotor angular extent |
| $E_s$ | <10 deg. | stator angular extent |
| $EP_{rs}$ | 1.5 | extent pitch ratio |
| φ | 2.5 deg. | electrode overlap extent |
| Δθ | 10 deg. | switching rotational interval |
| PH | 3 | switch phase |

Figure 21:
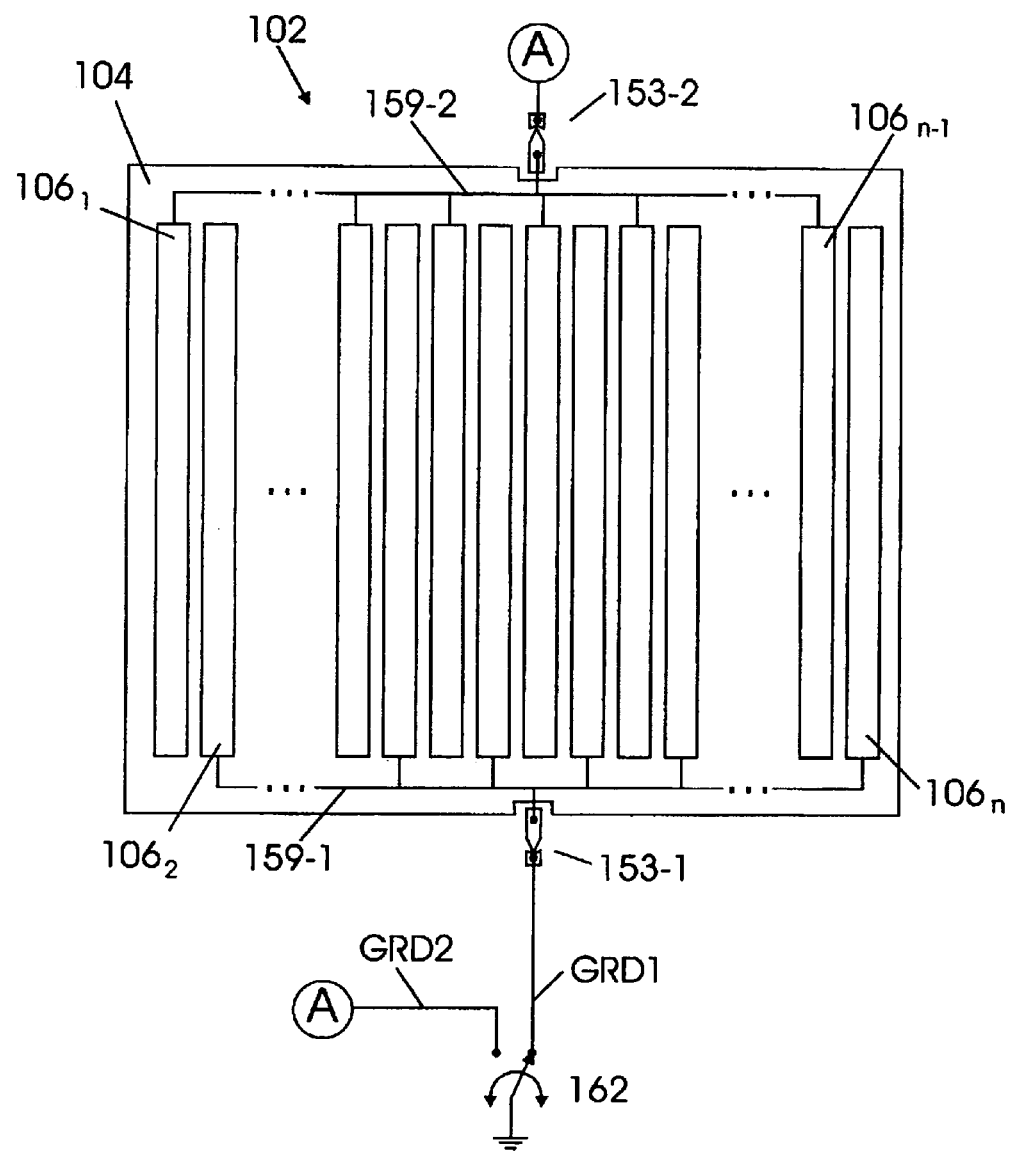
FIG. 21 shows a top view of a switched rotor-electrode array configuration.

FIG. 21 shows a flattened planar view of an initially cylindrical switched rotor-electrode array configuration. In this embodiment rotor-electrode strip array 106 is divided into two separate groups of alternating even and odd rotor-electrode strips. Rotor-electrode strips $106_i$ in their respective group are electrically connected together and the two groups are electrically isolated from each other. Rotor-electrode strip array 106 has constant angular pitch and constant angular extent. Rotor switch controller 162 switches the even and the odd rotor-electrode strip groups between a connected state and a disconnected state in an alternating manner. The connected state is ground and the disconnected state is an open circuit. Connections between rotor switch controller 162 and the even and odd rotor-electrode strip group 164-1 and 164-2 respectively are made via electrically isolated rotatable connectors 153-1 and 153-2, which can be switched. This embodiment is related to that of FIG. 7B, with external connections 156 connectable to ground via rotor switch controller 162. In the present embodiment external electrical connection 156-1 becomes GRD1 and external electrical connection 156-2 becomes GRD2.

FIGS. 22A-D show side views of an embodiment with switched rotor-electrodes and corresponding electrode activation sequence optimized for rotational acceleration. Stator-electrode strips $126_i \ldots 126_{i+6}$ are divided into sub-groups, with a stator angular pitch $P_s$. Rotor-electrode strips are divided into alternating even rotor-electrode strips $106_i$ and $106_{i+2}$ and odd rotor-electrode strips $106_{i+1}$ and $106_{i+3}$, with rotor angular pitch $P_r$=1.5 $P_s$. Therefore, the pitch ratio $P_{rs}$=1.5. At the shown time instance, the even rotor-electrode strips are connected to ground via rotor switch controller 162 (GRD1) and the odd rotor-electrode strips are disconnected. Stator-electrode strips $126_{i+1}$ and $126_{i+4}$ are connected to the voltage +$V_1$, such that the following electrode pairs are activated: $106_i/126_{i+1}$ and $106_{i+2}/126_{i+4}$ as indicated by the connecting arrows. The electrode pair pitch $P_{ep}$ equals 2 $P_r$. This causes rotor-electrode strips to move towards their activated stator-electrode strip pairs, thereby rotating rotor assembly 102 in the direction of rotation DR. Rotor assembly 102 rotates until the maximum rotational acceleration $T_{max}$ (see FIG. 11B) is reached at which time $V_1$ is disconnected. Rotor assembly 102 has rotated over an interval designated by switching rotational interval Δθ from reference point $θ_{REF}$. Δθ equals half the stator angular pitch $P_s$.

Figure 22A:
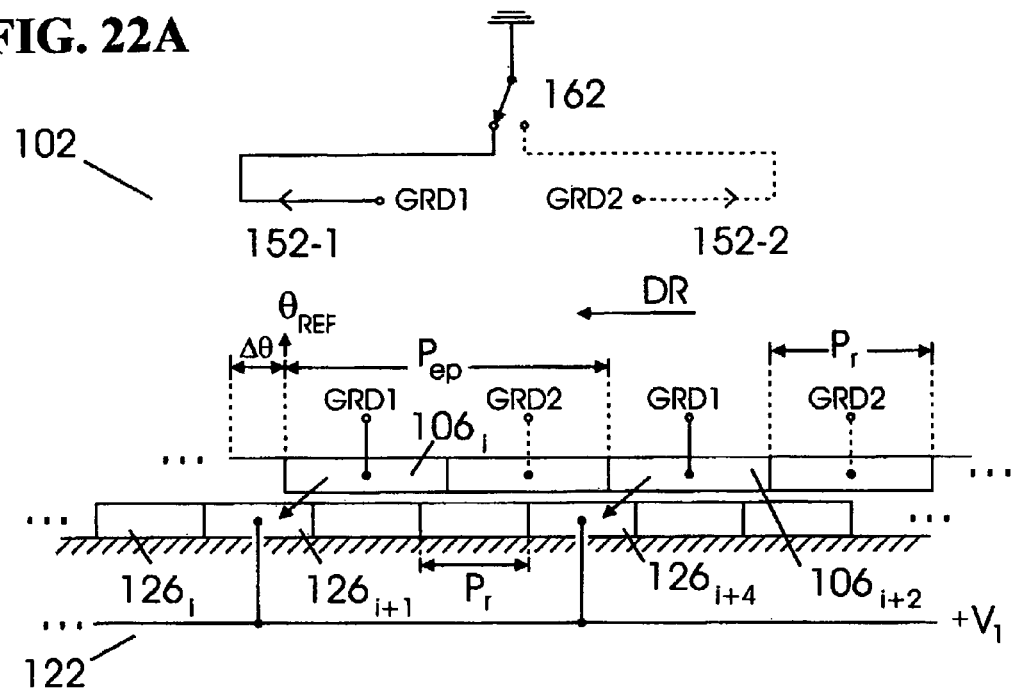
FIGS. 22A-C show side views of the switched rotor-electrode configuration for four rotation states optimized for rotational acceleration.
Figure 22B:
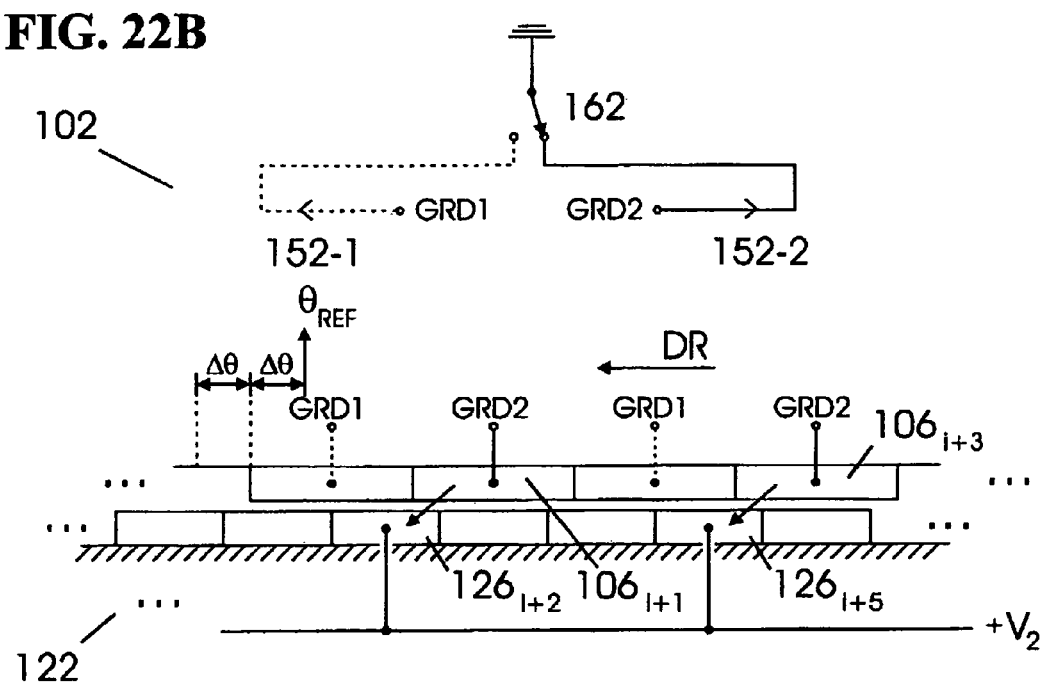

FIG. 22B shows that in the subsequent rotational interval the next set of rotor/stator electrode strip pairs are activated. The odd rotor-electrode strips are now connected to ground via rotor switch controller 162 (GRD2) and the even rotor-electrode strips are disconnected. Simultaneously, stator-electrode strips $126_{i+2}$ and $126_{i+5}$ are connected to voltage $V_2$, activating rotor/stator electrode pairs $106_{i+1}/126_{i+2}$ and $106_{i+3}/126_{i+5}$ as indicated by the connecting arrows. Rotor assembly 102 rotates an additional rotational interval $\Delta\theta$.

Figure 22C:
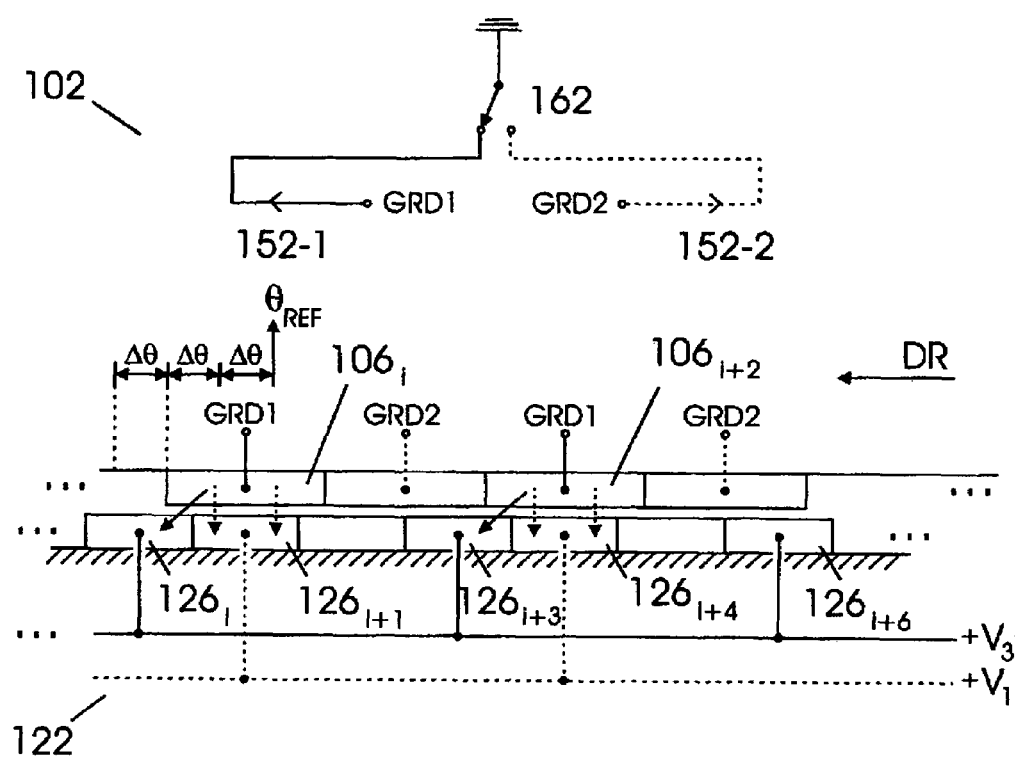

FIG. 22C shows that in the subsequent rotational interval the next set of rotor/stator electrode strip pairs are activated. The even rotor-electrode strips are now connected to ground via rotor switch controller 162 and the odd rotor-electrode strips are disconnected. Simultaneously, stator-electrode strips $126_i$ and $126_{i+3}$ are connected to voltage $V_3$, activating rotor/stator electrode strip pairs $106_i/126_1$ and $106_{i+2}/126_{i+3}$ as indicated by the connecting arrows. Likewise, rotor assembly 102 rotates an additional rotational interval $\Delta\theta$. In various embodiments, the voltages applied in the rotational intervals are different, in others the voltages are the same.

In FIG. 22C, instead of rotating, rotor assembly 102 can be latched by connecting stator-electrode strips $126_{i+1}$ and $126_{i+4}$ to voltage $V_1$, activating rotor/stator electrode strip pairs $106_i/126_{i+1}$ and $106_{i+2}/126_{i+1}$ as indicated by the dashed double vertical arrows. The design parameter relationships are listed in Table 7 below:

TABLE 7

| Parameter | Value | Parameter Name |
|---|---|---|
| $P_{rs}$ | 1.5 | pitch ratio |
| $P_{ep}$ | =2 $P_r$ | electrode pair pitch |
| $\Delta\theta$ | =0.5 $P_s$ | rotational interval |
| PH | 3 | switch phase |

Figure 23A:
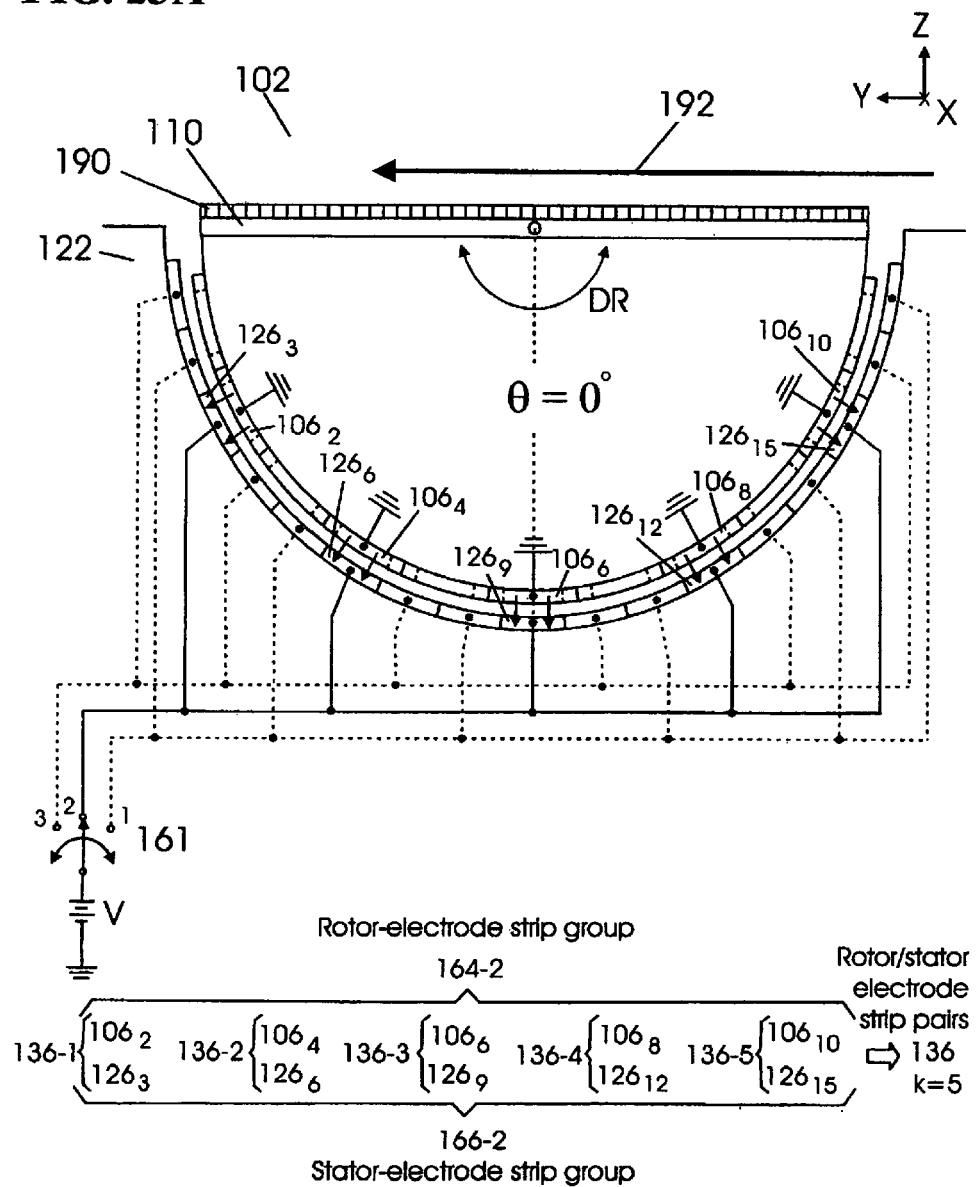
FIGS. 23A-B show a full side view of FIGS. 22A-C with the rotor assembly latched at various tilt angles.
Figure 23C:
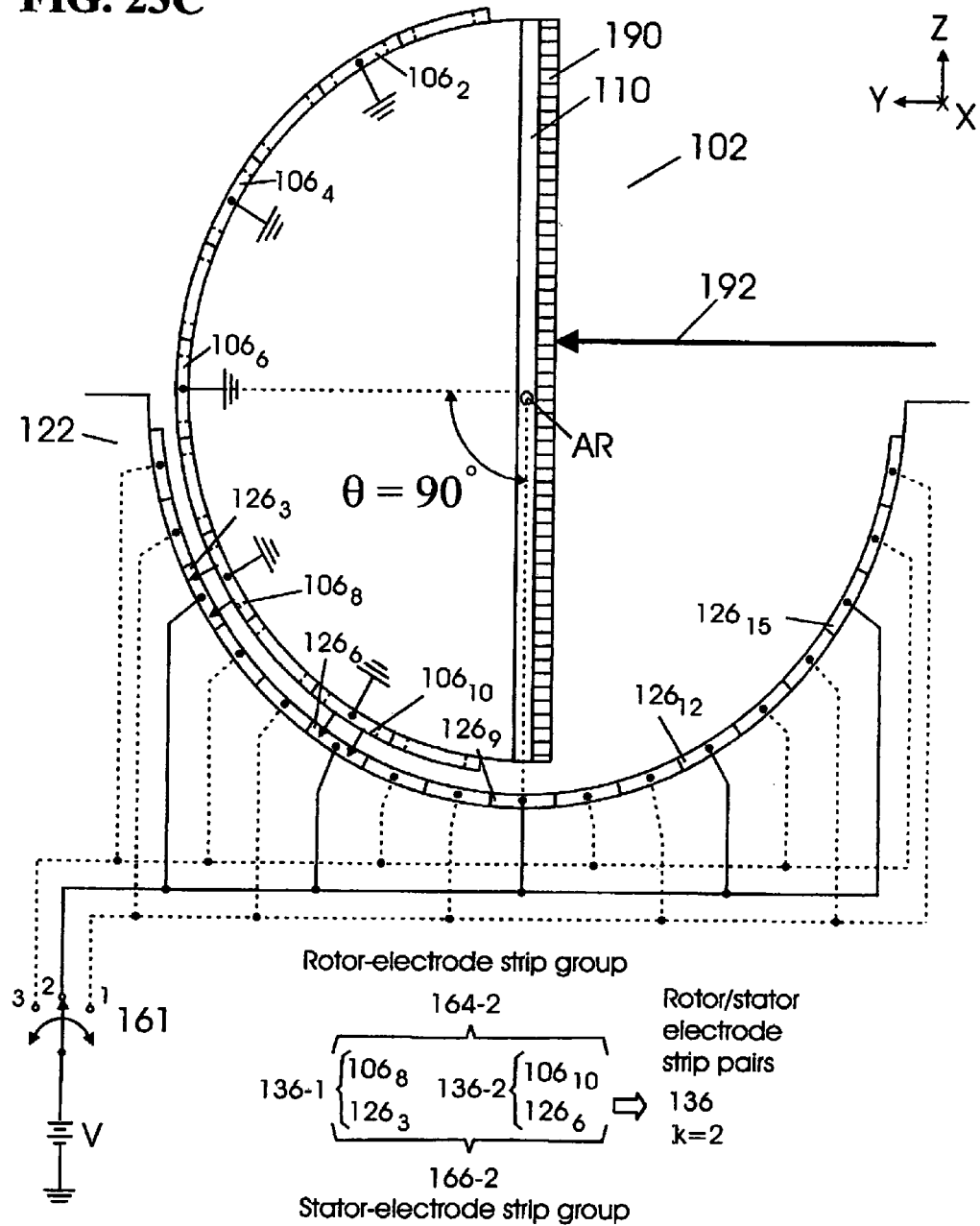

FIGS. 23A-C show a full side view of FIGS. 22A-C with rotor assembly 102 latched at various tilt angles $\theta$. The voltage lines of FIGS. 22A-C have been replaced by a 3-phase stator switch 160 and corresponding voltage lines directly connected to stationary stator-electrode strip groups 166-$i$ where i=1 . . . 3 in an interleaved arrangement. There are a total of 10 rotor-electrode strips $106_1$ . . . $106_{10}$ with rotor angular pitch $P_r$=15 degrees and rotor angular extent $E_r$=15 degrees. There are a total of 17 stator-electrode strips $126_1$ . . . $126_{17}$ with stator angular pitch $P_s$=10 degrees and stator angular extent $E_s$=10 degrees. The design parameter values of FIGS. 23A-C are listed in Table 8 below:

TABLE 8

| Parameter | Value | Parameter Name |
|---|---|---|
| N | 11 | number of rotor-electrode strips |
| M | 17 | number of stator-electrode strips |
| $P_r$ | 15 deg. | rotor angular pitch |
| $P_s$ | 10 deg. | stator angular pitch |
| $P_{rs}$ | 1.5 | pitch ratio |
| $P_{ep}$ | 30 deg. | electrode pair pitch |
| $E_r$ | 15 deg. | rotor angular extent |
| $E_s$ | <10 deg. | stator angular extent |
| $EP_{rs}$ | 1.5 | extent pitch ratio |
| $\phi$ | 2.5 deg. | electrode overlap extent |
| $\Delta\theta$ | 5 deg. | switching rotational interval |

FIG. 23A shows rotor assembly 102 latched at tilt angle $\theta$=0 degrees. Stator switch 160 is switched to voltage line 2, which corresponds to stator-electrode strip group 166-2 consisting of stator-electrode strips $126_3$, $126_6$, $126_9$, $126_{12}$ and $126_{13}$. Even numbered rotor-electrode strips $106_2$, $106_4$, $106_6$, $106_8$ and $106_{10}$ are connected to ground via rotatable connector 152-1 (not shown), while odd numbered rotor-electrode strips are disconnected. Activated rotor/stator electrode strip pairs 136-1 . . . 136-5 are listed in the table in FIG. 23A. The number of activated rotor/stator electrode strip pairs k equals 5.

FIG. 23B shows rotor assembly 102 latched at tilt angle $\theta$=+45 degrees. Stator switch controller 161 is again switched to voltage line 2, which corresponds to stator-electrode strip group 166-2 consisting of stator-electrode strips $126_3$, $126_6$, $126_9$, $126_{12}$ and $126_{15}$. Stator-electrode strip $126_{15}$ does not have an associated rotor-electrode strip to match-up with, thus it does not contribute to the latching of rotor assembly 102. Activated rotor/stator electrode strip pairs 136-1 . . . 136-4 are listed in a table in FIG. 23B. With $\Delta\theta$=5 degrees, it takes 9 switching intervals to rotate rotor assembly 102 from tilt angle $\theta$=0 in FIG. 23A to a tilt angle $\theta$=+45 degrees in FIG. 23B.

FIG. 23C shows rotor assembly 102 latched at tilt angle $\theta$=+90 degrees. Stator switch controller 161 is again switched to voltage line 2, which corresponds to stator-electrode strip group 166-2 consisting of stator-electrode strips $126_3$, $126_6$, $126_9$, $126_{12}$ and $126_{15}$. Stator-electrode strips $126_9$, $126_{12}$ and $126_{15}$ do not have a matching rotor-electrode pair and thus do not contribute to the latching of rotor assembly 102. This leaves only two activated rotor/stator electrode pairs 136-1 and 136-2, which are listed in a table in FIG. 23C compared to five pairs shown in FIG. 23A with a tilt angle $\theta$=0. It takes 18 switching intervals $\Delta\theta$ to rotate rotor assembly 102 from tilt angle $\theta$=0 in FIG. 23A to tilt angle $\theta$=+90 degrees FIG. 23C. The rotation range of rotor assembly 102 is limited only by the overlap of rotor-electrode strip array 106 and stator-electrode strip array 126 in both directions (i.e. ±90 degrees). This embodiment has a total effective rotation range of ±90 degrees for a total aggregate rotation range of 180 degrees. Unlike some existing micro-actuators, the rotation range is independent of activation voltage V. In addition, the control of the rotation is stable over the complete rotational range regardless of the size of the rotational range.

Table 9 shows a comparison between the five-phase switch configuration of FIGS. 19A-C and the switch rotor-electrode strip configuration of FIGS. 23A-C. The switch rotor-electrode strip configuration has a larger number of rotor-electrode strips n with a smaller angular pitch $P_r$, a smaller switch phase PH and higher torque (i.e. a larger k value). The 5 phase switch configuration is a simpler design.

TABLE 9

| Parameter | 5 Phase | Sw. Rotor | Comments |
|---|---|---|---|
| n | 7 | 11 | # rotor-electrode strips |
| $P_r$ | 25 | 15 | rotor angular pitch |
| $P_{rs}$ | 2.5 | 1.5 | pitch ratio |
| PH | 5 | 3 | stator switch phases |
| Rotor switch? | No | Yes | |
| k for $\theta$ = 0° | 3 | 5 | # of activated rotor/stator pairs |
| k for $\theta$ = 45° | 3 | 4 | # of activated rotor/stator pairs |
| k for $\theta$ = 90° | 1 | 2 | # of activated rotor/stator pairs |

FIG. 23A also shows that an optical element is attached to rigid platform 110. The optical element can be a reflective surface 190. Reflective surface 190 is a coating of highly reflective material such as gold, optimized for minimum energy absorption in a specific range of wavelengths. In other embodiments, one or more coatings of other suitable materials are placed on the mirror portion of rigid platform 110 for high reflectivity in a specific range of wavelengths.

Actuator 100 can be part of an optical system. In some optical systems a laser beam 192 is provided essentially parallel to substrate surface 140, unlike other existing systems. Therefore, uniquely, this embodiment permits manipulation of light beam directed parallel and close to substrate 140.

Embodiments of optical systems include a single actuator or an array of actuators. With rotor assembly 102 at tilt angle θ=0 degree, laser beam 192 passes over reflective surface 190 unobstructed. Rotor assembly 102 rotated clockwise between 0 and +90 degrees can manipulate laser beam 192 incident from the right side as indicated in FIG. 23C for a deflection angle of +90 degrees. Rotor assembly 102 rotated counter clockwise between 0 and −90 degrees can manipulate laser beam 192 incident from the left side for a deflection angle of −90 degrees. Manipulating laser beam 192 incident from the left or right side requires a reflective surface that covers that half surface of rigid platform 110 surface which rises above substrate plane 140. Manipulating laser beam 192 incident from either side requires a reflective surface that covers the complete rigid platform 110 surface.

Figure 24A:
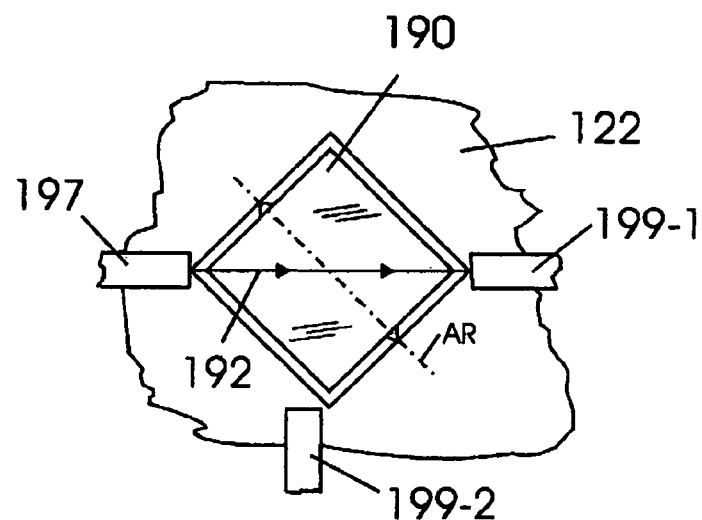
FIGS. 24A-B show a top view of a 1×2 optical switch corresponding to the embodiments of FIGS. 23A and 23C.

FIG. 24A shows a top view of a 1×2 optical switch, which includes the actuator of FIG. 23A. Reflective surface 190 is shown parallel to substrate 122. Output fiber optic 197 emits laser beam 192 above reflective surface 190 in the direction of input fiber optic 199-1, since actuator 100 is not activated and thus rotor assembly is not rotated in either direction.

Figure 24B:
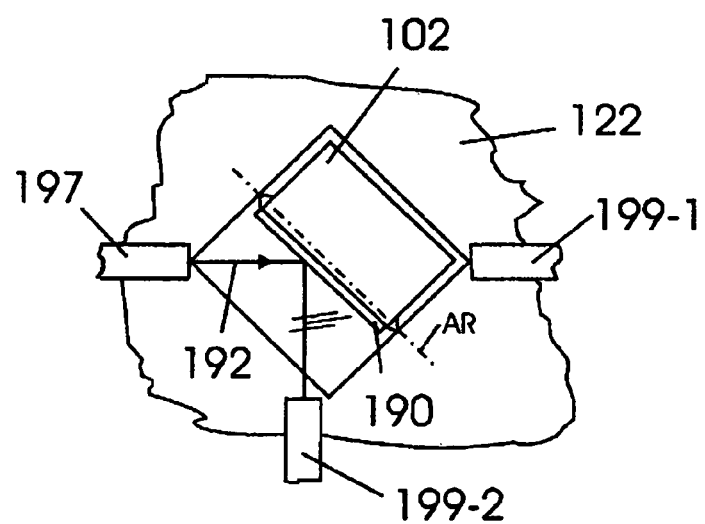

FIG. 24B shows the same optical switch, only rotor 102 being rotated by about 90 degrees, as in FIG. 23C. Reflective surface 190 is shown rotated perpendicular to substrate 122. Output fiber optic 197 again emits laser beam 192, but this time the laser beam is deflected towards input fiber optic 199-2. Actuators 100 can be used in many different optical systems, alone or in one or two dimensional arrays.

The large surface area of the rotor/stator electrode strips acts like a heat sink dissipating heat generated from the laser illumination onto the reflective surface 190. This heat is transferred to attached rigid platform 110 and from there to rotor 102. Through rotor cylindrical surface 104 this heat is effectively dissipated, especially when rotor assembly 102 is rotated out of plane. The interior of rotor assembly 102 can be filled with a heat absorbing material such that heat emanating from the attached rigid platform 110 is dissipated through the rotor-electrode strip array 106.

Figure 25A:
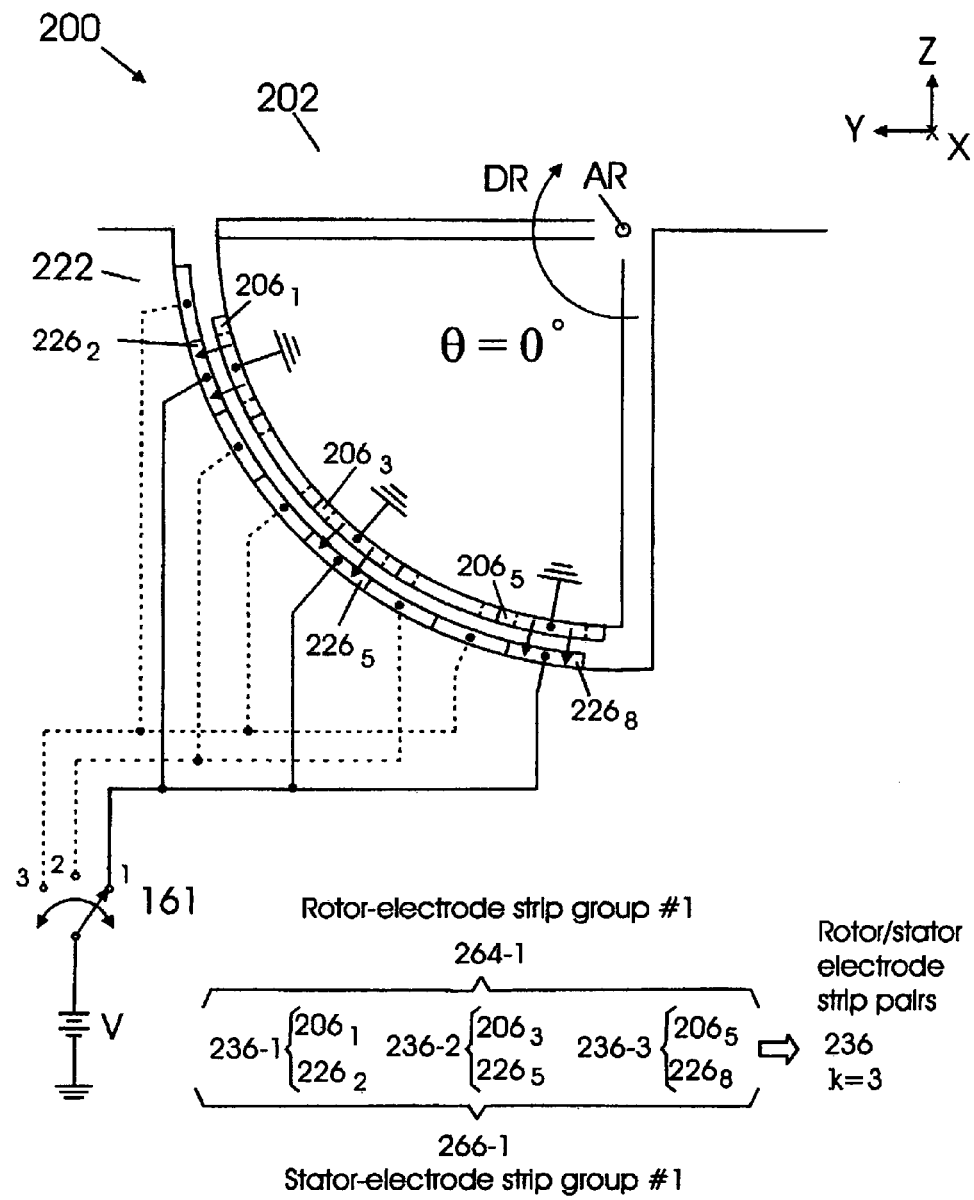
FIGS. 25A-B shows a side view of a quarter-cylinder with the rotor assembly latched at two different tilt angles.
Figure 25B:
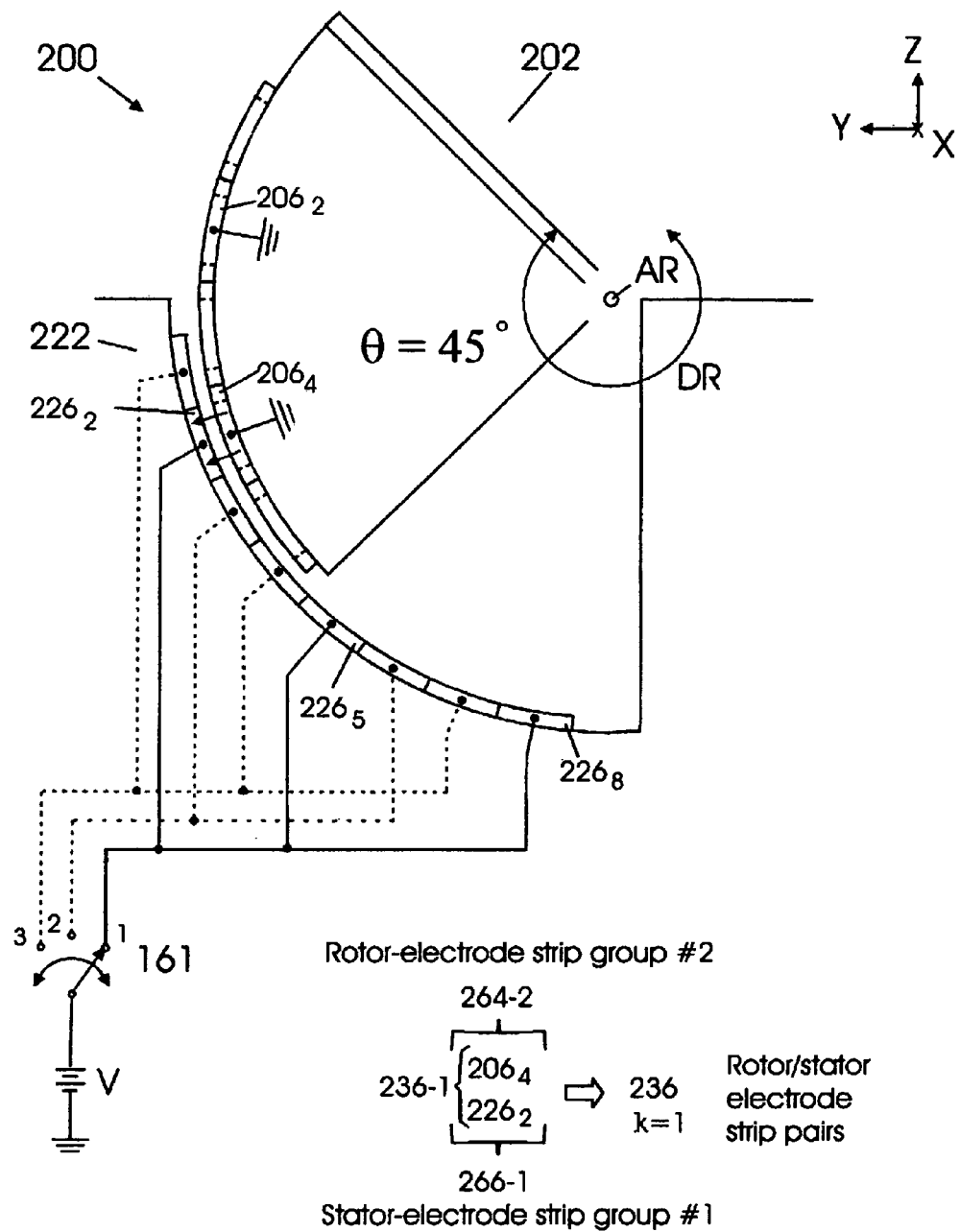

FIGS. 25A-B show a quarter-cylinder version of the embodiments of FIGS. 23A-B, with rotor assembly 102 latched at tilt angles θ=0 and θ=45 degrees, respectively. This embodiment has the same switch rotor electrode configuration and the same electrode activation sequencing as FIGS. 23A-B. The embodiments and methods used for the half-cylinder design can be modified for the quarter cylinder design. These include the three and five phase embodiments and the small angle embodiment. The design parameter values of the embodiment of FIG. 25 are listed in Table 10 below. The difference between Table 10 and Table 8 is the number of rotor and stator electrode strips, n and m respectively. In FIGS. 25A-B, there are a total of 5 rotor-electrode strips $206_1 \ldots 206_5$ and a total of 8 stator-electrode strips $226_1 \ldots 226_8$. This is about half the number of electrodes compared to half cylinder configuration of FIGS. 23A-C, thus reducing the complexity and required number of elements.

TABLE 10

| Parameter | Value | Parameter Name |
|---|---|---|
| N | 5 | number of rotor-electrode strips |
| M | 8 | number of stator-electrode strips |
| $P_r$ | 15 deg. | rotor angular pitch |
| $P_s$ | 10 deg. | stator angular pitch |
| $P_{rs}$ | 1.5 | pitch ratio |
| $P_{ep}$ | 30 deg. | electrode pair pitch |
| $E_r$ | 15 deg. | rotor angular extent |
| $E_s$ | <10 deg. | stator angular extent |

TABLE 10-continued

| Parameter | Value | Parameter Name |
|---|---|---|
| $EP_{rs}$ | 1.5 | extent pitch ratio |
| φ | 2.5 deg. | electrode overlap extent |
| Δθ | 5 deg. | switching rotational interval |

FIG. 25A shows rotor assembly 102 latched at tilt angle θ=0 degrees. At this time instance stator switch 160 is switched to voltage line 1 which corresponds to stator-electrode strip group 166-1 consisting of stator-electrode strips $226_2$, $226_5$ and $226_8$. Odd numbered rotor-electrode strips $206_1$, $206_3$ and $206_5$ are connected to ground via rotatable connector 152-1 (not shown), while even numbered rotor-electrode strips are disconnected. Activated rotor/stator electrode strip pairs 236-1 . . . 236-3 are listed in a table of FIG. 25A. The number of activated rotor/stator electrode strip pairs k equals 3. This is approximately half the number for the half cylinder configuration of FIG. 23A.

FIG. 25B shows rotor assembly 102 latched at tilt angle θ=+45 degrees. Stator switch 160 is again switched to voltage line 1, which corresponds to stator-electrode strip group 166-1 consisting of stator-electrode strips $226_2$, $226_5$ and $226_8$. Stator-electrode strips $226_5$ and $226_8$ do not have associated rotor-electrode strips to match-up with, thereby they do not contribute to the latching of rotor assembly 102. The number of activated rotor/stator electrode strip pairs k equals 1. Activated rotor/stator electrode strip pair 236-1 is shown in the table of FIG. 25B. With Δθ=5 degrees, it takes 9 switching intervals to rotate rotor assembly 102 from tilt angle θ=0 in FIG. 25A to a tilt angle θ=+45 degrees in FIG. 25B.

Quarter cylinder embodiments are more compact than the half cylinder configuration, as the footprint of rotor assembly 102 can be half that of the half cylinder embodiment. This feature is useful for high density applications where a large number of actuators are arranged in a dense array.

Figure 26A:
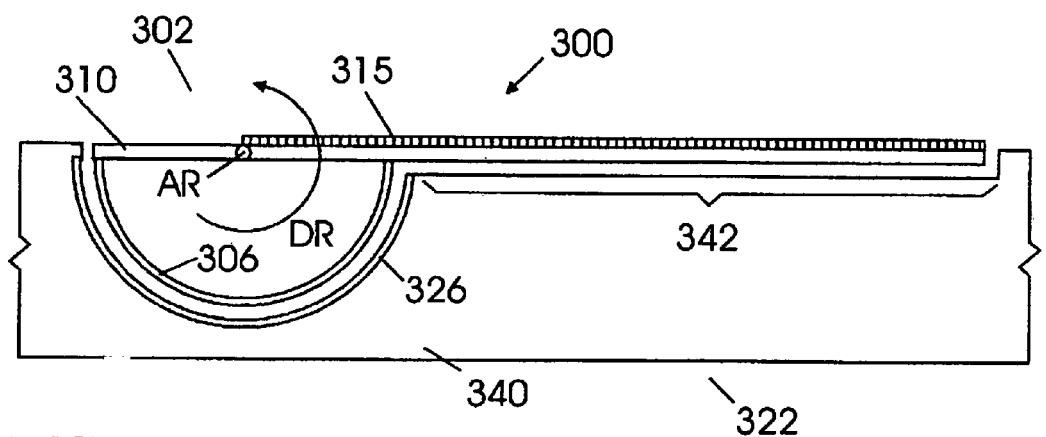
FIGS. 26A-B shows a side view of a cantilever half-cylindrical rotor assembly latched at two different tilt angles.
Figure 26B:
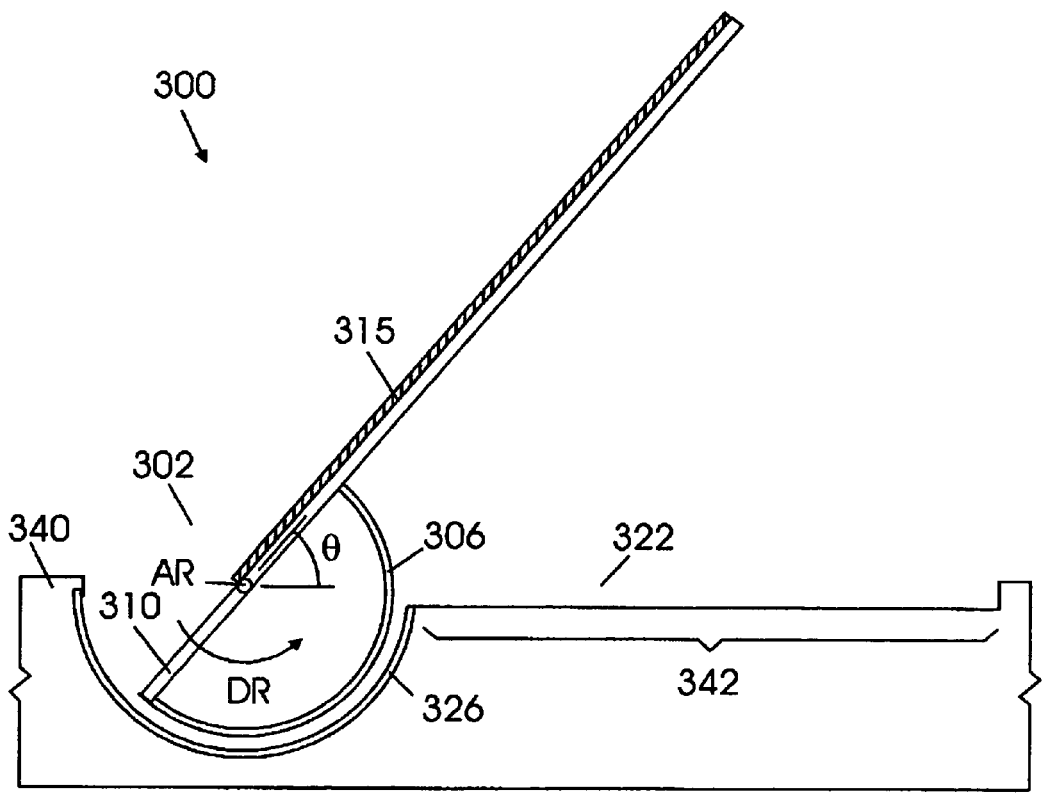

FIGS. 26A-B show a side view of a cantilever type actuator 300 using a half cylindrical configuration and latched at two different tilt angles. Rotor assembly 302 consists of rigid platform 310 and reflective surface 315, which on one side extends well beyond a boundary of rotor-electrode cylindrical surface 306. Stator structure 322 includes stator-electrode strip array 326, embedded within substrate 340. FIG. 26A shows rotor assembly 302 with a tilt angle θ=0. FIG. 26B shows rotor assembly 302 rotated out-of-plane in the direction of rotation DR at an arbitrary tilt angle θ. Any of the previously discussed configurations/electrode sequencing methods can be used (for example the five phase embodiment, or the rotor electrode switching embodiment).

The cantilever type actuator uses a relatively small rotor assembly 302 compared to the size of the overall rigid platform 310. Such a configuration can be used for lifting large 3D structures. Such structures require generally thicker rigid platforms. The use of a reflective surface with a thick metallization layer, such as gold is especially heavy. This requires a high torque configuration, such as a switched rotor electrode method. In addition, it may be necessary to use a higher operating voltage.

Further, compared to existing cantilever actuators, the present embodiments have the following features: high torque, large out-of-plane rotations of 90 degrees or more, compact footprint, and in some cases low operating voltage. Also, once the cantilever is lifted into position, it can be adjusted or used as a scanning mirror. No additional mechanisms are required to hold the cantilever in place, and the cantilever can be lifted out of the plane or lowered anytime.

Figure 27A:
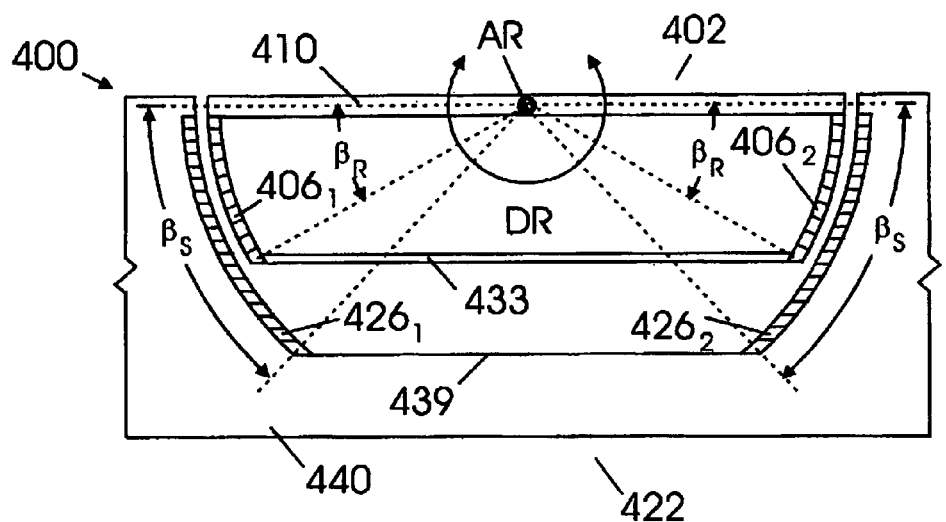
FIG. 27A shows a side view of a thin profile configuration.

FIG. 27A shows a side view of a thin profile configuration. Actuator 400 includes movable rotor assembly 402 and stationary stator structure 422. Rotor assembly 402 includes two arc segments of a circle with attached rotor-electrode strip arrays $406_1$ and $406_2$ respectively, separated by lower planar rotor surface 433 and upper rigid platform 410. Alternatively, the shape of the rotor assembly can be characterized as a truncated cylinder. Each arc segment has an arc angle $\beta_R$. Rotor-electrode strip arrays $406_1$ and $406_2$ contain one or more rotor-electrode strips. Likewise, stator structure 422 includes two arc segments of a circle with attached stator-electrode strip arrays $426_1$ and $426_2$ separated by planar substrate surface 439. These arrays can be embedded within substrate 440. Each arc segment has a rotor arc angle $\beta_S$. Stator-electrode strip arrays $426_1$ and $426_2$ contain one or more stator-electrode strips. Any of the electrode sequencing methods discussed above (for example the five phase embodiment or the switched rotor embodiment) can be used in combination with the present embodiment.

Figure 27B:
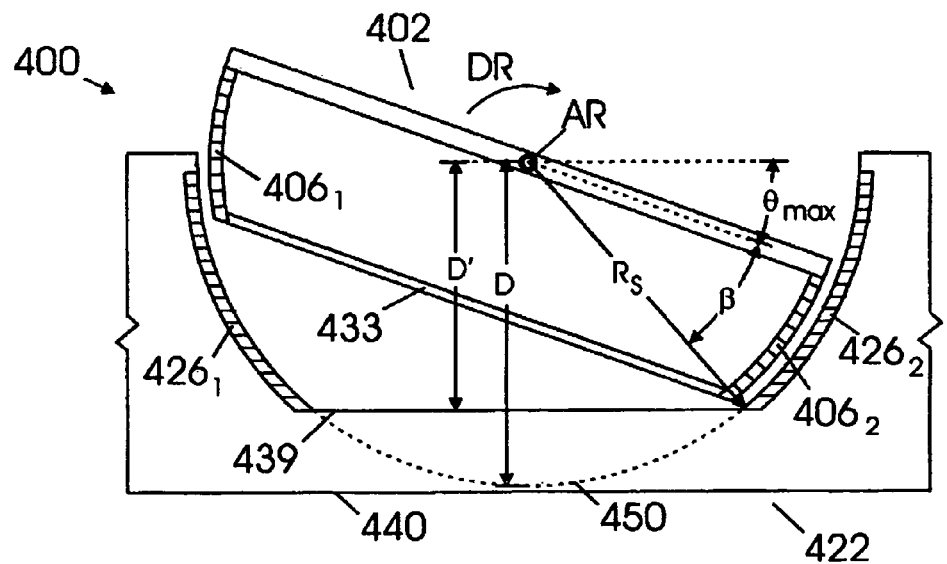
FIG. 27B shows the embodiment of FIG. 27A latched at a maximum tilt angle.

FIG. 27B shows the thin profile embodiment latched at a tilt angle $\theta_{max}$. The actuator depth D' is given by $$D' = R_s \sin(\beta_S) \quad (13)$$

where $\beta_S = \theta_{max} + \beta_R$. Equation 13 shows that the smaller the stator arc angle $\beta_S$, the smaller the actuator depth D'. Actuator depth D' can be considerably smaller than that of the half or quarter cylinder embodiments.

Figure 28A:
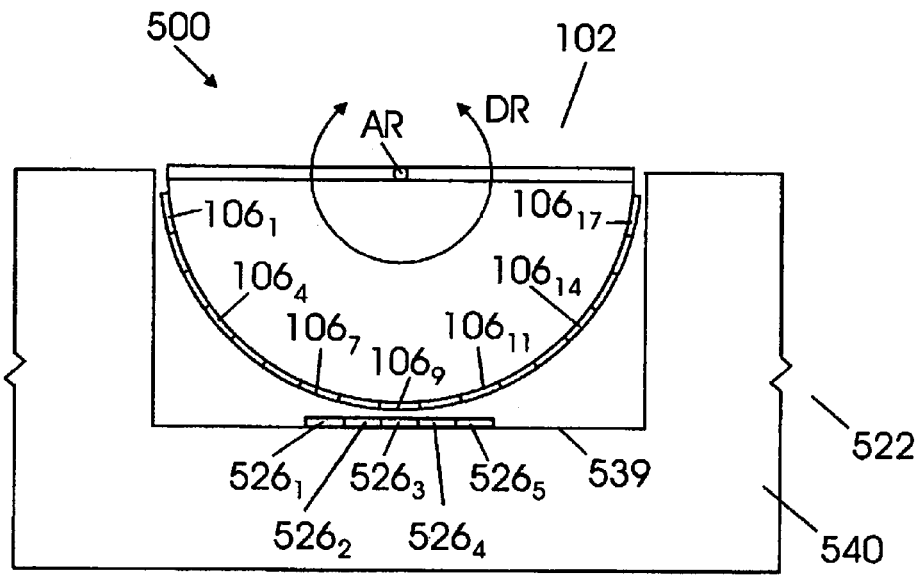
FIG. 28A shows a side view of a planar stator array configuration.

FIG. 28A shows a side view of an embodiment with a planar stator-electrode array. Planar stator actuator 500 includes movable rotor assembly 102 and stationary stator structure 522. Rotor assembly 102 can be analogous to that of FIG. 5, for example with rotor-electrode strips $106_1 \ldots 106_{17}$. Stator structure 522 includes planar stator-electrode strip array 526 with stator-electrode strips $526_1 \ldots 526_5$ embedded within substrate 540 and attached to planar substrate surface 539. In other aspects, planar stator-electrode strip array 526 is analogous to stator-electrode strip array 126 of FIG. 5.

Figure 28B:
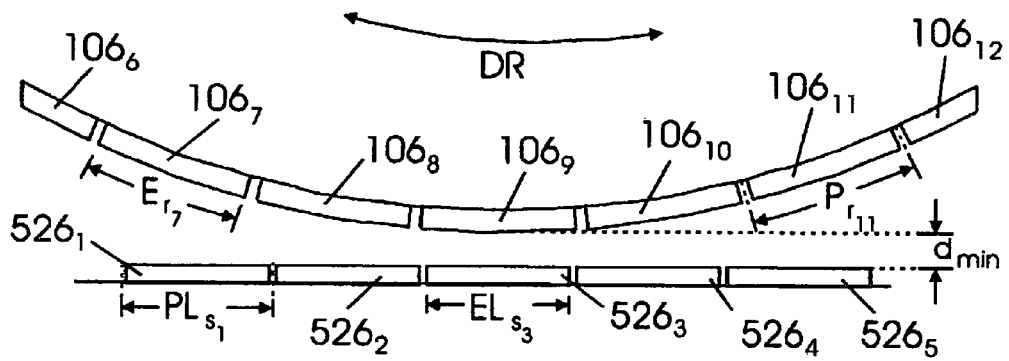
FIG. 28B shows an exploded view of the embodiment of FIG. 28A.

FIG. 28B shows an exploded view of FIG. 28A. There is a minimum gap spacing $d_{min}$ between the rotor-electrode strip array 106 and planar stator-electrode strip array 526 that is located between rotor-electrode strip $106_9$ and planar stator-electrode strip $526_3$. The electrostatic force is the strongest at this minimum gap. Electrostatic forces on either side of this minimum gap spacing $d_{min}$ will be smaller due to gap spacing being greater then $d_{min}$. Rotor-electrode strips $106_1 \ldots 106_{17}$ have corresponding rotor angular pitch $P_{r_1} \ldots P_{r_{17}}$ and rotor angular extent $E_{r_1} \ldots E_{r_{17}}$. This indicates that the rotor angular pitch and rotor angular extent are not necessarily constant. Likewise, stator-electrode strips $526_1 \ldots 526_5$ have corresponding stator linear pitch $PL_{s_1} \ldots PL_{s_5}$ and stator linear extent $EL_{s_1} \ldots EL_{s_5}$. This indicates that the stator linear pitch and stator linear extent are not necessarily constant. The pitch and extent of the individual electrode strips of the rotor and stator electrode strip array are in general designed for some optimal operating condition (i.e. maximum acceleration, maximum torque, etc.).

Figure 29A:
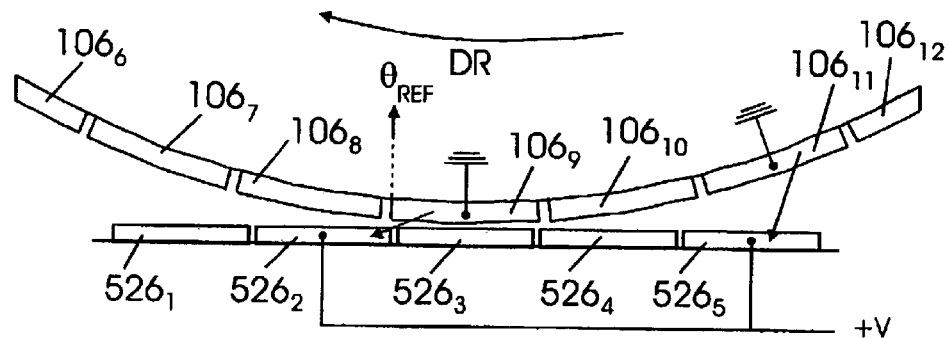
FIGS. 29A-C show an electrode activation sequence of the embodiment of FIG. 28B that rotates the rotor assembly in a clockwise direction.
Figure 29B:
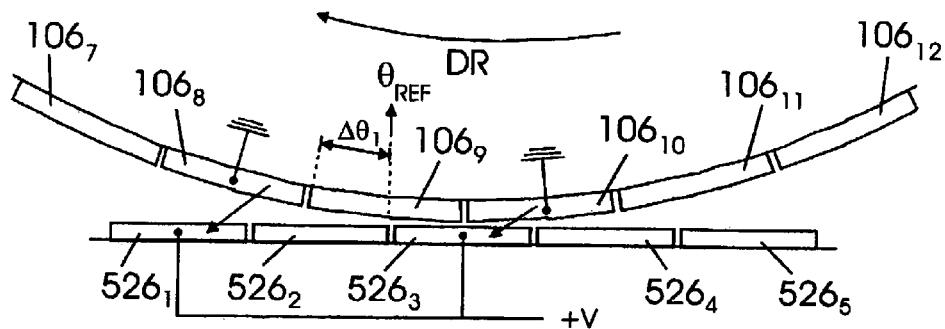
Figure 29C:
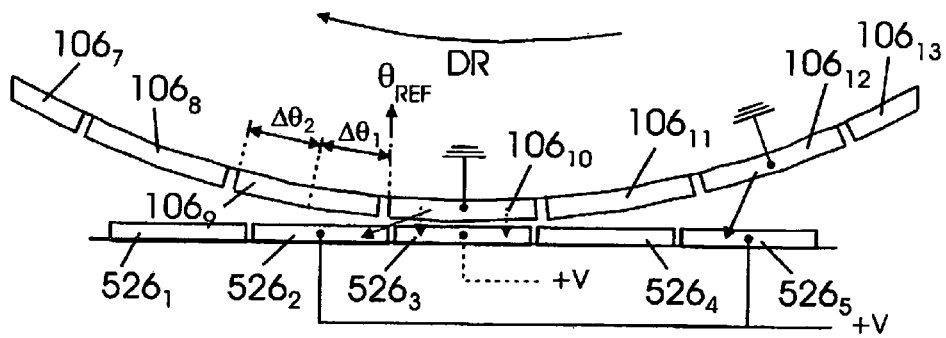

FIGS. 29A-C show an electrode activation sequence of FIG. 28B that rotates rotor assembly 102 in a clockwise direction. In general, a voltage is applied between selected rotor/stator electrode strip pairs to cause rotor assembly 102 to rotate. Rotor-electrode strips $106_i$ are connected to ground via electrically isolated rotatable connectors 153-1 and 153-2 (not shown) using a switched rotor-electrode configuration. Selected stator-electrode strips $526_i$ are connected to the +V voltage line. In FIG. 29A, the following rotor/stator electrode strip pairs are initially activated: $106_9/526_2$ and $106_{11}/526_5$ as indicated by the connecting arrows. This causes rotor assembly 102 to rotate in the direction of rotation DR. At some predetermined time, the activated rotor/stator electrode strip pairs are disconnected and the next set of rotor/stator electrode strip pairs are activated as shown in FIG. 29B. Here the following rotor/stator electrode strip pairs are activated: $106_8/526_1$ and $106_{10}/526_3$ as indicated by solid connecting arrows. At this time, rotor assembly 102 rotated over an interval designated by switching rotational interval $\Delta\theta_1$ referenced from reference point $\theta_{REF}$. $\Delta\theta_1$ equals some fraction of the stator angular pitch $P_{r_9}$ corresponding to rotor-electrode strip $106_9$. Rotor assembly 102 continues to rotate in the direction of rotation DR. At some predetermined time, the activated rotor/stator electrode strip pairs are disconnected and the next set of rotor/stator electrode strip pairs namely $106_{10}/526_2$ and $106_{12}/526_5$ are activated as shown in FIG. 29C and as indicated by solid connecting arrows. At this time, rotor assembly 102 rotates over an additional interval designated by switching rotational interval $\Delta\theta_2$. Again, rotor assembly 102 rotates in the direction of rotation DR. The different length of different switching rotational intervals $\Delta\theta_i$ indicate that this interval is not necessary constant.

FIG. 29C shows that rotor assembly 102 can be latched at its current rotation angle by activating rotor/stator electrode strip pair $106_{10}/526_3$ as indicated by the dashed double vertical arrows and the dashed +V voltage line.

This planar embodiment is a simple design and can be manufactured more easily. The timing sequence may involve non-constant time intervals for optimizing the translational acceleration.

Figure 30A:
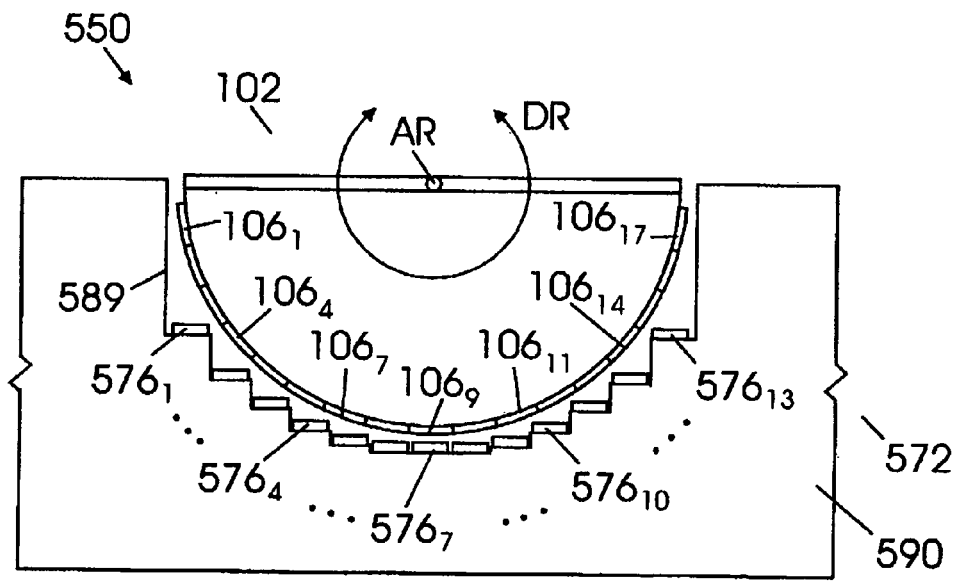
FIG. 30A shows a side view of a stair step stator electrode configuration.

FIG. 30A shows a side view of a stair step stator-electrode array embodiment. Stair-step stator actuator 550 includes movable rotor assembly 102 and stationary stator structure 572. Rotor assembly 102 can be analogous to that of FIG. 28A with rotor-electrode strips $106_1 \ldots 106_{17}$. Stator structure 572 includes stator-electrode strip array 576 with stator-electrode strips $576_1 \ldots 576_{13}$ embedded within substrate 590 and attached to stair step substrate surface 589. In other aspects, stair step stator-electrode strip array 576 is analogous to planar stator-electrode strip array 526.

Figure 30B:
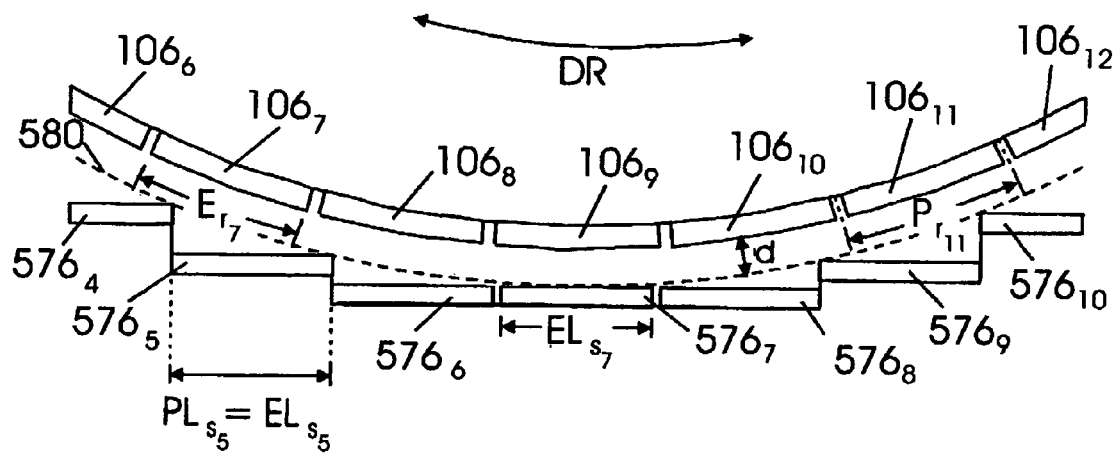
FIG. 30B shows an exploded view of the embodiment of FIG. 30A.

FIG. 30B shows an exploded view of FIG. 30A. Stator-electrode strip 576 is arranged in an approximate arc 580 with center point aligned with axis-of-rotation AR. Gap spacing d is defined by circle arc 580 and arc defined by rotor-electrode strip array 106. Rotor-electrode strips $106_1 \ldots 106_{17}$ have corresponding rotor angular pitch $P_{r_1} \ldots P_{r_{17}}$ and rotor angular extent $E_{r_1} \ldots E_{r_{17}}$. This indicates that the rotor angular pitch and rotor angular extent are not necessarily constant. Likewise, stator-electrode strips $576_1 \ldots 576_{13}$ have corresponding stator linear pitch $PL_{s_1} \ldots PL_{s_{13}}$ and stator linear extent $EL_{s_1} \ldots EL_{s_{13}}$. This indicates that the stator linear pitch and stator linear extent are not necessarily constant. For elevated stator electrodes (i.e. $576_5$, $576_9$, etc.) $PL_{si} = EL_{si}$. The pitch and extent of the individual electrode strips of the rotor and stator electrode strip array are in general designed for some optimal operating condition (e.g. to maximize acceleration or torque, etc.).

Figure 31A:
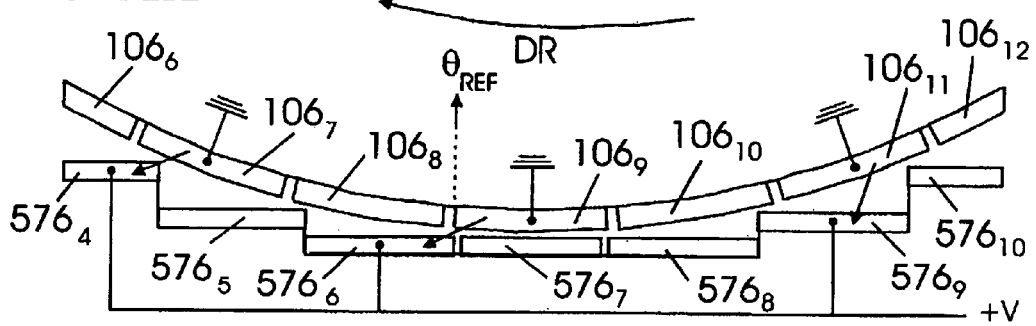
FIGS. 31A-C show an electrode activation sequence of the embodiment of FIG. 30B that rotates the rotor assembly in a clockwise direction.
Figure 31B:
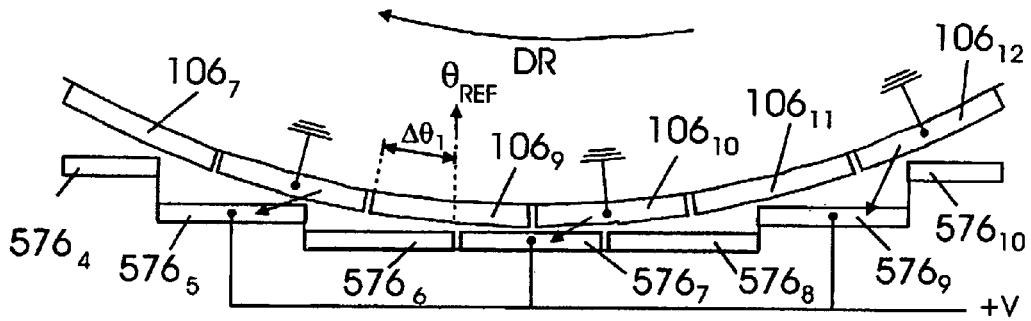
Figure 31C:
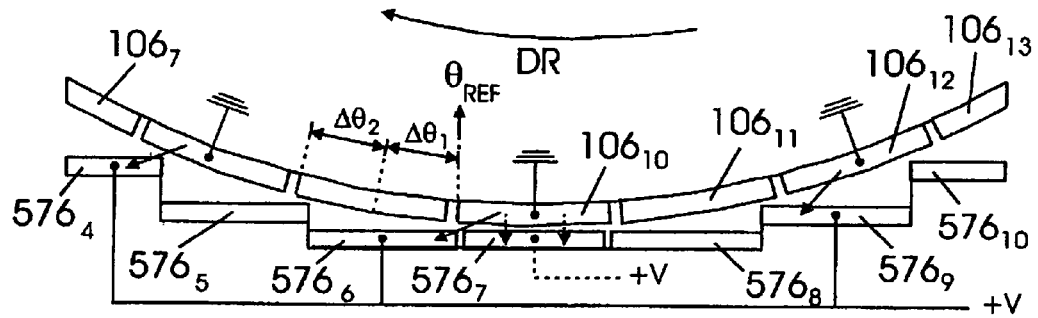

FIGS. 31A-C show an electrode activation sequence of FIG. 30B that rotates rotor assembly 102 in a clockwise direction. Rotor assembly 102 is identical to rotor assembly of FIG. 29A. In FIG. 31A, the following rotor/stator electrode strip pairs are initially activated: $106_7/576_4$, $106_9/576_6$ and $106_{11}/576_9$ as indicated by the connecting arrows. This causes rotor assembly 102 to rotate in the direction of rotation DR. At some predetermined time, the activated rotor/stator electrode strip pairs are switched as shown in FIG. 31B. Here the following rotor/stator electrode strip pairs become activated: $106_8/576_5$, $106_{10}/576_7$ and $106_{12}/576_9$ as indicated by the connecting arrows. At this time, rotor assembly 102 rotated over an interval designated by switching rotational interval $\Delta\theta_1$ referenced from a reference point $\theta_{REF}$. Rotor assembly 102 continues to rotate in the direction of rotation DR. At some predetermined time, the activated rotor/stator electrode strip pairs are switched as shown in FIG. 31C. Here the following rotor/stator electrode strip pairs become activated: $106_8/576_4$, $106_{10}/576_6$ and $106_{12}/576_9$ as indicated by the connecting arrows. At this time, rotor assembly 102 rotated over an additional interval designated by switching rotational interval $\Delta\theta_2$. Again rotor assembly 102 continues to rotate in the direction of rotation DR. In general, switching rotational interval $\Delta\theta_1$ indicates that this interval is not necessary constant.

As shown in FIG. 31C, rotor assembly 102 can be latched at its current rotation angle by activating rotor/stator electrode strip pair $106_{10}/576_7$ as indicated by the dashed double vertical arrows and the dashed +V voltage line.

In comparison to the planar actuator, the stator-step actuator has the feature that it is electro-statically more efficient due to a smaller gap spacing $d_i$. It also has a larger number of activated rotor/stator electrode strip pairs. In comparison to the cylinder embodiment of FIG. 5, the stator-step actuator is easier to manufacture.

The present invention is not limited to the above-mentioned embodiments. For example, though the above-mentioned embodiments use an electrostatic actuator, which drives the movable rotor assembly 102 by the electrostatic force generated between rotor/stator electrode strip pairs, an electromagnetic actuator may also be used. For example, by replacing the stator-electrode strip array 126 with a micro-coil strip array and replacing the rotor-electrode strip array 106 with a strip array made of magnetic material, an electromagnetic field can be generated across the gap.

The versatility of the described embodiments is demonstrated by showing how various aspects described above are combined to achieve six design goals:

1. Low Activation Voltage;
2. Large Rotation Range;
3. High Torque;
4. Fast Actuation Time;
5. Compactness; and
6. Reliability.

1. Low Activation Voltage: Among others factors, the activation voltage is lowered by a suitable choice of the following characteristics: small gap spacing d; hollow light-weight rotor assembly 102; needle point hinge type rotatable connectors; high rotation resolution; and multiple simultaneously activated rotor/stator electrode strip pairs. Optimizing some of these characteristics reduces the activation/operating voltage to or below 5 volts. The listed characteristics can be improved essentially independent from each other.

2. Large Rotation Range: In embodiments, the rotation range and rotation resolution can be modified independent of each other and of the activation voltage V. The rotation range is limited by the overlap of rotor-electrode strip array 106 and stator-electrode strip array 126. The rotation resolution is limited by the manufacturing methods and tolerance, which in general has micron scale precision. The rotational control is stable over the rotational range regardless of the rotational range.

The rotation range is large in embodiments with needle point rotatable connectors and half rotor/stator cylinder configurations. In these embodiments the rotation range can be 180 degree or more. Also, the rotation resolution precision can be of the order of micro-radians. Accordingly, some embodiments can have a thousand discrete rotation angles divided over more than 180 degrees.

3. High Torque for Lifting a Large 3D Structure: High torques are generated by inducing large electrostatic forces. Primarily this is achieved by decreasing the gap spacing d and increasing the activation voltage V. Further improvements are achieved by using: multiple simultaneously activated rotor/stator electrode strip pairs; a cantilever type configuration; a switched rotor-electrode configuration; and non-planar electrodes.

4. Fast Actuation Time: A fast actuation time translates to a high rotational acceleration of rotor assembly 102. The actuation time can be improved by increasing the operating/activating voltage V and using an optimized timing sequence. Further improvements can be achieved by using: a small rotation angle configuration; needle point hinge type rotatable connectors; multiple simultaneous activation of rotor/stator electrode strip pairs; high rotation resolution; hollow light-weight rotor 102; embedded rotor-electrode strips within rotor cylindrical surface 104; operating actuator 100 in a vacuum, switched rotor-electrode configuration; and non-planar electrodes. By using some of the listed embodiments, actuation times of 0.1 to 10 micro second can be achieved.

5. Compactness: Compactness is useful for high density applications, where a large number of actuators are arranged in a dense array. The following aspects have an impact on the compactness of actuator 100. First, the combined footprint of rotor assembly 102 and stator structure 122 is only slightly larger than that of rigid platform 110, which is useful in array applications. Second, the quarter rotor/stator cylinder embodiment has a footprint half the size of a half rotor/stator cylinder design.

6. Reliability: There are a number of factors which contribute to high reliability. A stable optical element manipulating an optical beam during the operation of actuator 100 requires a stable platform. This is accomplished through a uniform distribution of the stress load via uniformly distributed activated rotor/stator electrode strip pairs coupled to rigid platform 169 in such a way that the attached optical element is isolated from this stress gradient. Further, the rotor/stator electrode strip pairs do not get into physical contact with each other at anytime, thus avoiding stiction problems. Needle point rotatable connectors exhibits no metal fatigue. Electrostatic latching of multiple activated rotor/stator electrode strip pairs locks rotor assembly 102 at the predetermined rotation angles with high precision. Electrostatic latching of multiple activated rotor/stator electrode strip pairs provide high repeatability. Rotor assembly 102 remains latched as long as rotor/stator electrode strip pairs remain activated. Actuator 100 is resilient to external mechanical influences, such as vibrations and knocks. This is due to the strong and continuous electrostatic force, overriding the rotor assembly's natural mechanical characteristics such as its resonant frequency and quality factor Q. Low operating voltages imply low power consumption and heat. Low heat mitigates problems associated with excessive heat such as beam quality degradations. This is relevant for high density applications where a large number of actuators are arranged in a dense array. Efficient heat dissipation can be achieved by filling the interior of rotor assembly 102 with a heat absorbing material. Generated heat can be high for scanning applications, where a laser beam is continuously focused on a reflective surface attached to rigid platform 110. The low activation voltage also lowers the levels of crosstalk between stator-electrode strips.

When some of the described embodiments are combined, the performance of actuator 100 can be suitable for being used in several demanding technologies, such as laser based micro-displays and optical switches.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A micro-mechanical actuator comprising:
   a partially cylindrical rotatable rotor assembly with an essentially fixed axis of rotation comprising a rotor cylindrical surface, a rotor-electrode strip array with each rotor-electrode strip disposed on the rotor cylindrical surface length-wise parallel to each other and to the fixed axis of rotation tilted in an angle relative to a local tangent of the rotor surface thereby forming a rotor-ratchet, a rigid platform and rotor side walls attached to the rotor cylindrical surface and the rigid platform;
   a stationary stator structure with an essentially fixed axis of rotation coinciding with the fixed axis of rotation of the rotor assembly comprising a concave stator cylindrical surface, a stator-electrode strip array with each stator-electrode strip disposed on the stator cylindrical surface length-wise parallel to each other and to the fixed axis of rotation tilted in an angle relative to a local tangent of the stator surface thereby forming a corresponding stator-ratchet, stator side walls attached to the stator cylindrical surface;
   rotatable connectors, connecting the rotor assembly and the stator structure; and
   a switch controller, controlling the actuator.

2. The micro-mechanical actuator of claim 1, wherein
   the rotor side walls are partially shaped as arc segments;
   the arc segments define a center; and
   the arc segment center essentially coincides with the fixed axis of rotation.

3. The micro-mechanical actuator of claim 1, a plurality of the rotor-electrode strips having
   an essentially constant angular pitch and an essentially constant angular extent.

4. The micro-mechanical actuator of claim 1, wherein a plurality of the rotor-electrode strips are electrically coupled to the switch controller through one of the rotatable connectors.

5. The micro-mechanical actuator of claim 4, wherein
   a first group of rotor-electrode strips are coupled to the switch controller through a first rotatable connector and a second group of rotor-electrode strips are coupled to the switch controller through a second rotatable connector.

6. The micro-mechanical actuator of claim 1, wherein
   the stator side walls are partially shaped as arc segments; and
   the arc segments define a center.

7. The micro-mechanical actuator of claim 6, wherein the stator-electrode strip array comprises
   stator-electrode strips, disposed on the stator cylindrical surface length-wise parallel to each other and to the axis-of-rotation.

8. The micro-mechanical actuator of claim 7, a pluraility of stator-electrode strips having an essentially constant angular pitch and an essentially constant angular extent.

9. The micro-mechanical actuator of claim 7, wherein the stator surface and the stator side walls define a stator cavity.

10. The micro-mechanical actuator of claim 9, wherein
    the rotor assembly is positioned within the stator cavity;
    the axis of rotation of the rotor cavity is essentially aligned with the axis of rotation of the stator cavity; and
    the stator-electrode strip array and the rotor-electrode strip array are separated by a gap spacing.

11. The micro-mechanical actuator of claim 10, wherein a spacing of the gap is sufficiently large such that the rotor-electrode strip array does not come in contact with the stator-electrode strip array throughout the operation of the micro-actuator.

12. The micro-mechanical actuator of claim 10, wherein the gap does not require a fluid filled enclosure or a dielectric layer.

13. The micro-mechanical actuator of claim 10, wherein a rotation range of the rotatable rotor is independent of the gap spacing.

14. The micro-mechanical actuator of claim 1, wherein
    the width of individual rotor-electrode strips in a plurality of rotor-electrode strips is larger than the width of individual stator-electrode strips in a plurality of the stator-electrode strips.

15. The micro-mechanical actuator of claim 1, wherein
    rotor-electrode strips of the rotor-ratchet are formed as convex cylinder segments; and
    stator-electrode strips of the stator-ratchet are formed as convex cylinder segments.

16. The micro-mechanical actuator of claim 1, wherein
    rotor-electrode strips of the rotor-ratchet comprise two sub-rotor-strips, making an angle with each other; and
    stator-electrode strips of the stator-ratchet comprise two sub-stator-strips, making an angle with each other.

17. The micro-mechanical actuator of claim 1, wherein
    rotor-electrode strips are formed as convex cylinder segments disposed on the rotor surface; and
    stator-electrode strips are formed as convex cylinder segments disposed on the stator-surface.

18. The micro-mechanical actuator of claim 1, wherein the rotatable connectors are aligned along the fixed axis of rotation.

19. The micro-mechanical actuator of claim 18, wherein the rotatable connectors are electrically conductive, capable of providing an electrical connection between the rotor-electrode strip array and the external switch controller over a range of rotation angles.

20. The micro-mechanical actuator of claim 19, wherein the rotatable connector is one of a needle-point hinge or a torsion hinge.

21. The micro-mechanical actuator of claim 20, wherein the needle-point hinge connector comprises:
    a male end section, having a protruding needle-point contact tip; and
    a female end section, having a corresponding concave receiving element.

22. The micro-mechanical actuator of claim 21, wherein
    the male and female end sections have a small contact area; and
    the contact area of the male and female end sections comprises low friction conductive materials,
    thereby reducing the friction between the male and female ends.

23. The micro-mechanical actuator of claim 21, wherein the needle-point hinge is characterized by at least one of:
    an essentially unrestricted rotational range;
    a capability of bi-directional rotation;
    an essential lack of restoring force; and
    an essential lack of material fatigue.

24. The micro-mechanical actuator of claim 1, wherein the rigid platform extends beyond a boundary of the rotor cylindrical surface.

25. The micro-mechanical actuator of claim 1, wherein the rotor cylinder surface is cut into two cylindrical segments by a flat rotor surface, essentially parallel to the rigid platform.

26. The micro-mechanical actuator of claim 1, wherein the rotor cylindrical surface is a truncated cylinder.

27. The micro-mechanical actuator of claim 26, wherein the stator is shaped to accommodate the truncated rotor cylinder.

28. The micro-mechanical actuator of claim 1, wherein the rigid platform is capable of supporting an optical element, wherein the optical element is one of a reflective surface, an optical lens, a diffraction grating, a sensor or a prism.

29. The micro-mechanical actuator of claim 1, wherein the stator comprises:
   a flat stator surface; and
   stator-electrode strips, disposed essentially parallel with each other on the flat stator surface.

30. The micro-mechanical actuator of claim 1, wherein the stator comprises:
   a staircase-shaped surface; and
   stator-electrode strips, disposed essentially parallel with each other on the staircase-shaped surface.

31. The micro-mechanical actuator of claim 1, wherein the rotor comprises a portion shaped essentially as a quarter cylinder.

32. The micro-mechanical actuator of claim 1, wherein an interior of the rotor assembly is partially filled with a heat absorbing material.

33. The micro-mechanical actuator of claim 1, encased to operate in a vacuum, the actuator further comprising:
   a light entrance optical window; and
   a light exit optical window.

34. The micro-mechanical actuator of claim 1, wherein the micro-mechanical actuator is part of an optical system, the optical system comprising:
   a light source, operable to emit light; and
   a light receiving element, wherein
   the micro-mechanical actuator is operable to assume an active position to reflect the light, emitted by the light source, towards the light receiving element; and a passive position to leave the emitted light unreflected.

35. A method of operating the micro-mechanical actuator of claim 1, the actuator comprising rotor-electrodes disposed on a partially cylindrical rotatable rotor, stator-electrodes disposed on a stationary stator, the rotor electrodes and the stator-electrodes having essentially constant corresponding pitches and widths, rotatable connectors, connecting the rotor and the stator, and a switch controller, controlling the actuator, the method comprising the steps of:
   activating a plurality of the stator-electrodes and the rotor-electrodes of the micro-mechanical actuator in a timing sequence; and
   exerting a force on the activated rotor-electrodes by the activated stator-electrodes, thereby
   rotating the activated rotor-electrodes and the rotor in rotation-intervals corresponding to the timing sequence.

36. The method of claim 35, wherein activating the stator-electrodes and the rotor electrodes comprises
   applying a voltage between a plurality of the stator-electrodes and the rotor electrodes in stator-rotor electrode pairs.

37. The method of claim 36, wherein the rotating the rotor in rotation-intervals comprises:
   accelerating the rotor in accelerating phases; and
   decelerating the rotor in decelerating phases within the rotation-intervals.

38. The method of claim 37, comprising:
   activating the plurality of the stator-electrodes in the accelerating phase, thereby rotating the rotor-electrodes of the stator-rotor electrode pair in an accelerating manner toward the stator-electrodes of the stator-rotor electrode pairs until the rotor-electrodes fractionally overlap with the stator-electrodes; and
   de-activating the stator-electrodes in the decelerating phase, thereby reducing the deceleration of the rotor-electrodes of the stator-rotor electrode pair as they rotate away from the stator-electrode of the stator-rotor electrode pair.

39. The method of claim 38, wherein different pluralities of stator-electrodes are activated in subsequent timing intervals.

40. The method of claim 39, the stator-electrodes divided in groups of three adjacent stator-electrodes, the timing sequence comprising:
   activating first stator-electrodes in a plurality of stator-electrode groups, when the rotor-electrodes overlap with the second, adjacent stator-electrodes of the stator-electrode groups, thereby
   rotating the rotor-electrodes from overlapping with the second stator-electrodes to overlap with the first stator-electrodes of the stator-electrode groups; and
   maintaining the activation of the first stator-electrodes until the rotor-electrodes partially overlap with the first stator-electrodes, wherein
      third stator-electrodes are utilized within the stator-electrode groups to reduce an interaction between adjacent stator-rotor electrode pairs.

41. The method of claim 40, further comprising:
   maintaining the activation of the first stator-electrodes after the rotor-electrodes overlap with the first stator-electrode, thereby
   causing the rotor assembly to accelerate, decelerate, and latch in the rotation-intervals in a step-wise fashion.

42. The method of claim 38, wherein the stator-electrodes forming five electrode groups hardwired in an interleaved manner, the method comprising:
   activating one of the groups of the stator-electrodes until the rotor acceleration is maximum; and
   deactivating the activated group of the stator-electrodes at approximately the time of maximum rotor acceleration.

43. The method of claim 37, comprising
   increasing the acceleration of the rotor in the accelerating phase by utilizing rotor-electrodes, whose width is larger than the width of corresponding stator electrodes.

44. The method of claim 37, comprising
   increasing the acceleration of the rotor by utilizing shaped rotor-electrodes and corresponding stator-electrodes, the rotor-electrodes selected from rotor-strips, rotor-ratchets, rotor-cylinder segments, rotor-cylinder-segment-ratchets, and angled rotor-ratchets.

45. The method of claim 37, comprising
   de-activating the rotor-electrodes and the stator-electrodes before the rotor-electrodes completely overlap with the corresponding stator-electrodes.

46. The method of claim 37, wherein the exerting of force comprises:
exerting the force in a plurality of sequential intervals, thereby
distributing a stress load of the rotor over the rotor cylindrical surface.

47. The method of claim 37, further comprising
latching the rotor in a latching phase after the deceleration phase, thereby causing the rotor-electrode strips to lock in a predetermined locking position relative to the stator-electrode strips.

48. The method of claim 47, wherein the activating of rotor-electrodes and the stator-electrodes comprises:
activating only a subset of the stator-rotor electrode pairs; and
maintaining sufficient latching force to hold the rotor at its current angle during the latching phase.

49. The method of claim 48, wherein the latching the rotor comprises
latching of the rotor-electrodes in a predetermined locking position relative to the stator-electrodes without physical contact between the rotor electrode and the stator-electrode.

50. The method of claim 47, wherein the latching phase of an interval lasts essentially as long as the stator-rotor electrode pairs remain activated within the interval.

51. The method of claim 35, further comprising
operating the micro-mechanical actuator in vacuum, thereby reducing air drag.

52. The method of claim 35, wherein the rotating rotor comprises
rotating the rotor to discrete tilt angles, corresponding to angles where the rotor-electrodes overlap with stator-electrodes.

53. The method of claim 52, wherein the rotating rotor comprises
rotating the rotor with a resolution, an angle, and in a range, all independent of a voltage of the activation.

54. The method of claim 35, wherein the rotating rotor comprises
changing the direction of the rotation by reversing a timing sequence of the sequential activation of the stator-electrode strips.

55. The method of claim 35, wherein the rotor is rotatable in a range of about +−90 degrees for a rotation range of about 180 degrees.

56. The method of claim 35, wherein the micro-mechanical actuator is optimized for switching between two positions, separated by a small angle.

57. The method of claim 56, wherein the micro-mechanical actuator comprises separated stator-electrodes pairs and corresponding rotor-electrodes positioned half-way between the stator-electrodes, the method comprising:
activating a first stator-electrode of the stator-electrode pair to rotate and latch the rotor to a first position; and
switching by activating a second stator-electrode of the stator-electrode pair to rotate and latch the rotor to a second position.

58. The method of claim 57, wherein the rotatable connectors comprise one of needle-point contacts or torsion hinges.

59. The method of claim 58, comprising
utilizing the restoring force of the torsion hinges to determine the latching position of the rotor.

60. The micro-mechanical actuator claim 1, comprising:
the movable rotor assembly, supporting an optical platform;
the stationary stator structure; and
twistable connectors, connecting the rotor assembly and the stator structure.

61. The micro-mechanical actuator of claim 60, wherein the micro-mechanical actuator is part of an optical system, the optical system comprising:
a substrate, comprising a substrate surface;
the actuator embedded below the substrate surface,
the actuator operable to manipulate a light beam propagating above and essentially parallel to the substrate surface by turning the movable rotor assembly out of the substrate surface.

62. The micro-mechanical actuator of claim 60, wherein the actuator is part of a micro-mechanical actuator array.

63. The micro-mechanical actuator of claim 62, wherein the actuator array comprises actuators arranged in one of a one dimensional array and a two-dimensional array.

* * * * *